United States Patent
Babbs et al.

(10) Patent No.: US 12,142,505 B2
(45) Date of Patent: *Nov. 12, 2024

(54) TRANSPORT APPARATUS WITH LINEAR BEARING

(71) Applicant: Brooks Automation US, LLC, Chelmsford, MA (US)

(72) Inventors: Daniel Babbs, Austin, TX (US); Robert Chris May, Austin, TX (US); Robert T. Caveney, Windham, NH (US)

(73) Assignee: Brooks Automation US, LLC, Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/145,164

(22) Filed: Dec. 22, 2022

(65) Prior Publication Data
US 2023/0129289 A1    Apr. 27, 2023

Related U.S. Application Data

(63) Continuation of application No. 16/668,290, filed on Oct. 30, 2019, now Pat. No. 11,545,380.
(Continued)

(51) Int. Cl.
*H01L 21/677*     (2006.01)
*B25J 9/00*       (2006.01)

(52) U.S. Cl.
CPC ...... *H01L 21/67706* (2013.01); *B25J 9/0009* (2013.01); *B25J 9/0012* (2013.01);
(Continued)

(58) Field of Classification Search
CPC ................................................ H01L 21/67706
See application file for complete search history.

(56) References Cited

U.S. PATENT DOCUMENTS

| 4,939,946 A |   | 7/1990 | Teramachi |
| 5,615,955 A | * | 4/1997 | Namimatsu ......... F16C 29/0642 |
|             |   |        | 384/13 |

(Continued)

FOREIGN PATENT DOCUMENTS

| CN | 102052395 | 5/2011 |
| EP | 1347337 | 9/2003 |

(Continued)

OTHER PUBLICATIONS

Bearing Works Inc., "Full Ceramic Ball Bearings", https://Awww.bearingworks.com/products/full-ceramic-ball-bearing.php, accessed: Jan. 12, 2021 (Year: 2020).*

*Primary Examiner* — Gerald McClain
(74) *Attorney, Agent, or Firm* — Perman & Green, LLP

(57) ABSTRACT

A vacuum substrate transport apparatus including a frame, a drive section having a drive axis, at least one arm, having an end effector for holding a substrate, having at least one degree of freedom axis effecting extension and retraction, and a bearing defining a guideway that defines the axis, the bearing including at least one rolling load bearing element disposed in a bearing case, interfacing between a bearing raceway and bearing rail to support arm loads, and effecting sliding of the case along the rail, and at least one rolling, substantially non-load bearing, spacer element disposed in the case, intervening between each of the load bearing elements, wherein the spacer element is a sacrificial buffer material compatible with sustained substantially unrestricted service commensurate with a predetermined service duty of the apparatus in a vacuum environment at temperatures over 260° C. for a specified predetermined service period.

32 Claims, 34 Drawing Sheets

Related U.S. Application Data

(60) Provisional application No. 62/754,465, filed on Nov. 1, 2018.

(52) U.S. Cl.
CPC .... *H01L 21/6773* (2013.01); *H01L 21/67766* (2013.01); *H01L 21/67781* (2013.01)

(56) References Cited

U.S. PATENT DOCUMENTS

| | | | | |
|---|---|---|---|---|
| 5,904,426 | A * | 5/1999 | Tsuru | F16C 19/20 |
| | | | | 384/909 |
| 6,352,366 | B1 * | 3/2002 | Schneeberger | F16C 33/6696 |
| | | | | 384/13 |
| 6,937,911 | B2 | 8/2005 | Watson | |
| 9,656,386 | B2 | 5/2017 | Caveney et al. | |
| 11,273,558 | B2 | 3/2022 | Caveney | |
| 11,545,380 | B2 * | 1/2023 | Babbs | H01L 21/6773 |
| 2007/0029158 | A1 * | 2/2007 | Iguchi | F16C 29/046 |
| | | | | 193/35 MD |
| 2008/0031557 | A1 * | 2/2008 | Yamanaka | C23C 14/35 |
| | | | | 384/463 |
| 2011/0120339 | A1 * | 5/2011 | Volluz | F16C 33/66 |
| | | | | 104/120 |
| 2014/0321776 | A1 | 10/2014 | Hosoya et al. | |
| 2016/0325440 | A1 * | 11/2016 | Caveney | B25J 18/04 |
| 2020/0144087 | A1 | 5/2020 | Babbs et al. | |

FOREIGN PATENT DOCUMENTS

| | | |
|---|---|---|
| JP | 2006023021 | 1/2006 |
| JP | 2013540361 | 10/2013 |
| JP | 2017504492 | 2/2017 |
| TW | 200901356 | 1/2009 |
| TW | 586500 | 6/2017 |
| WO | 2006035947 | 4/2006 |

* cited by examiner

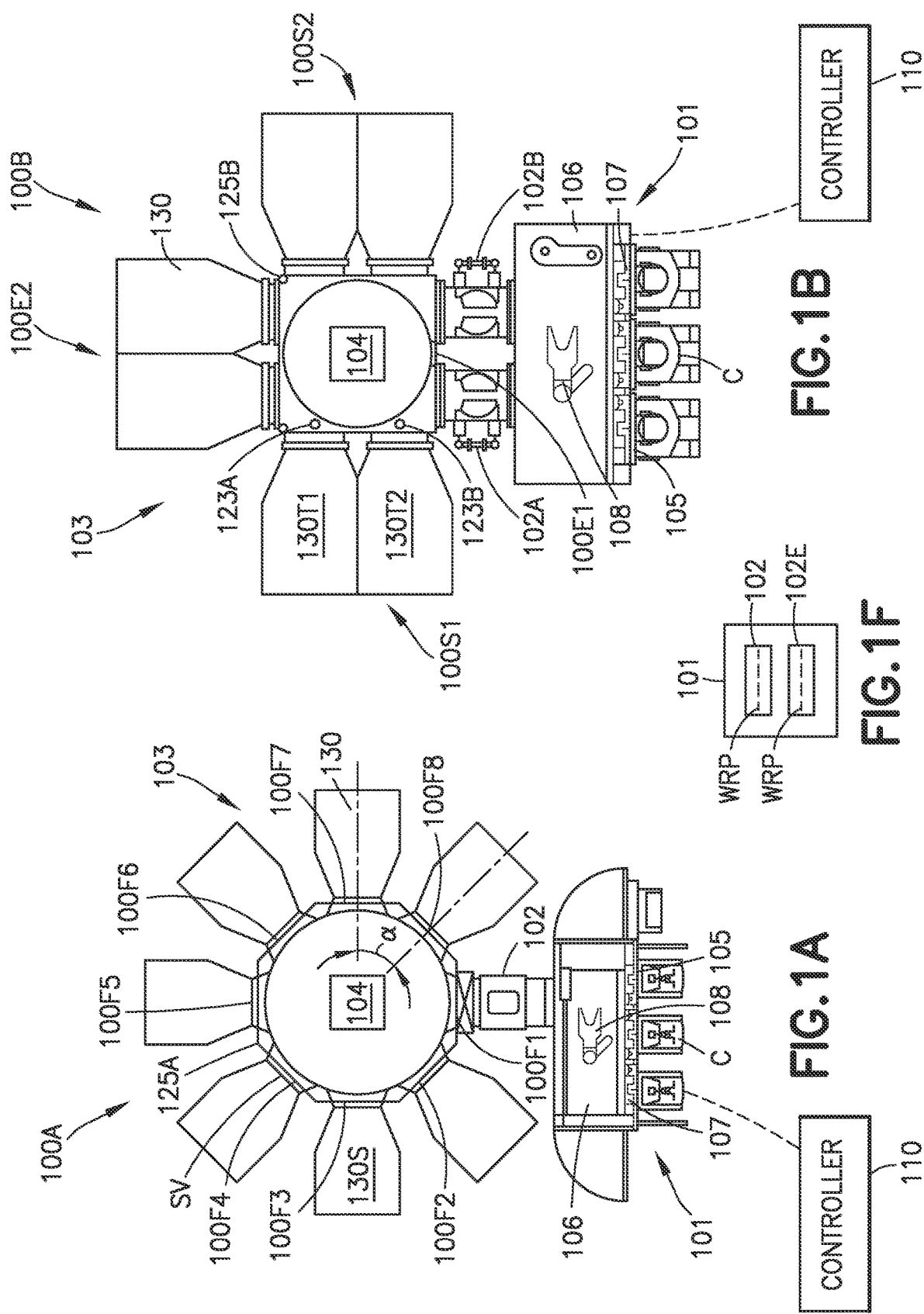

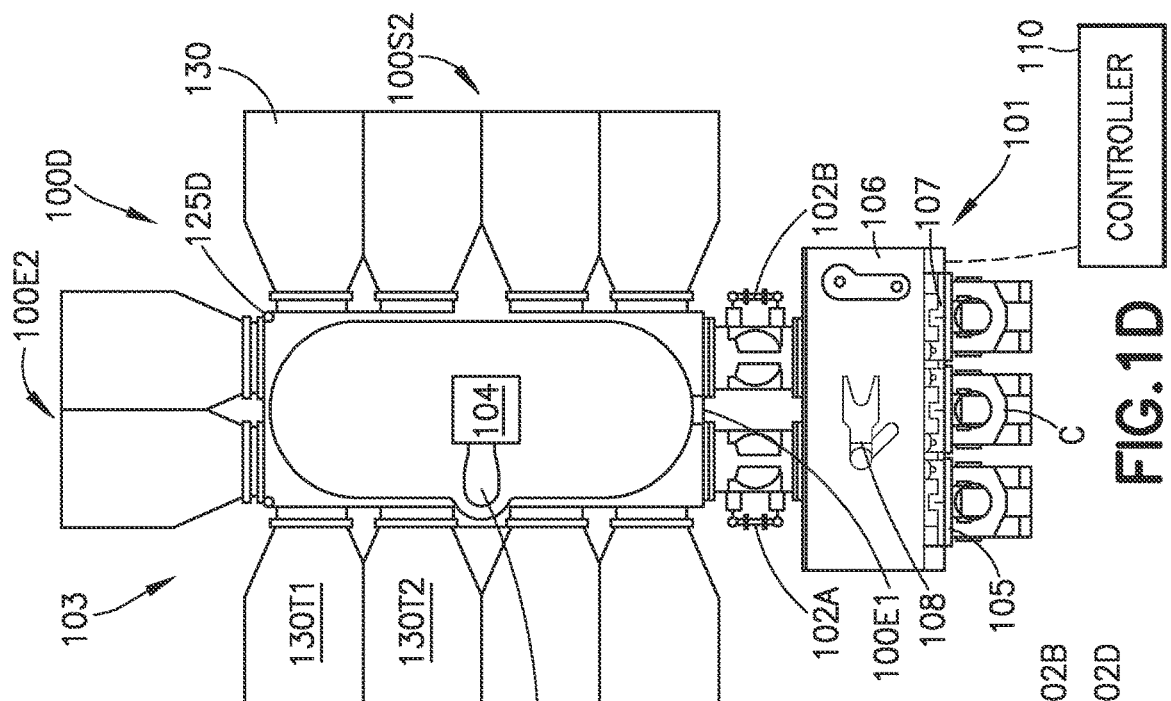
FIG. 1D
FIG. 1E
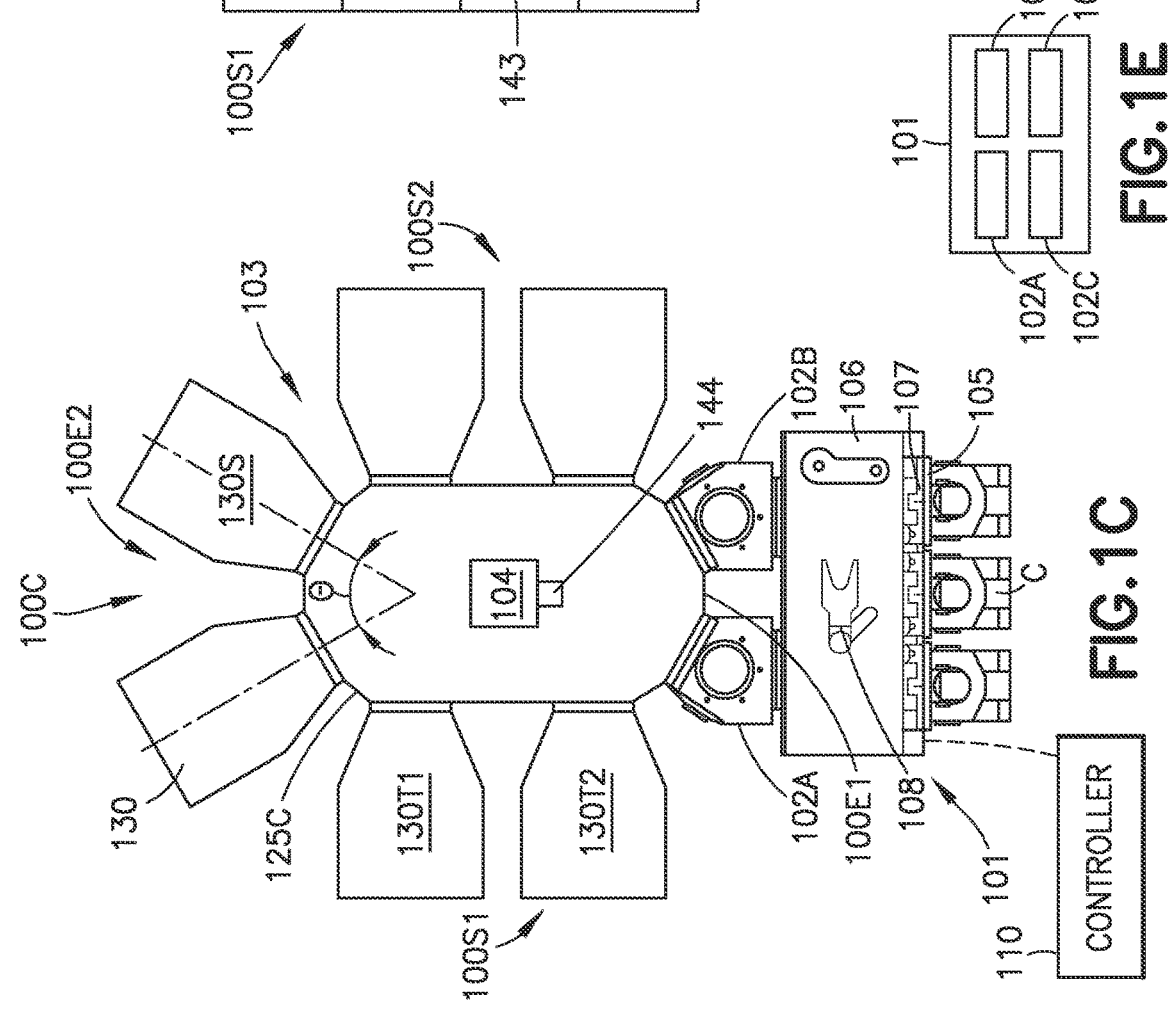
FIG. 1C

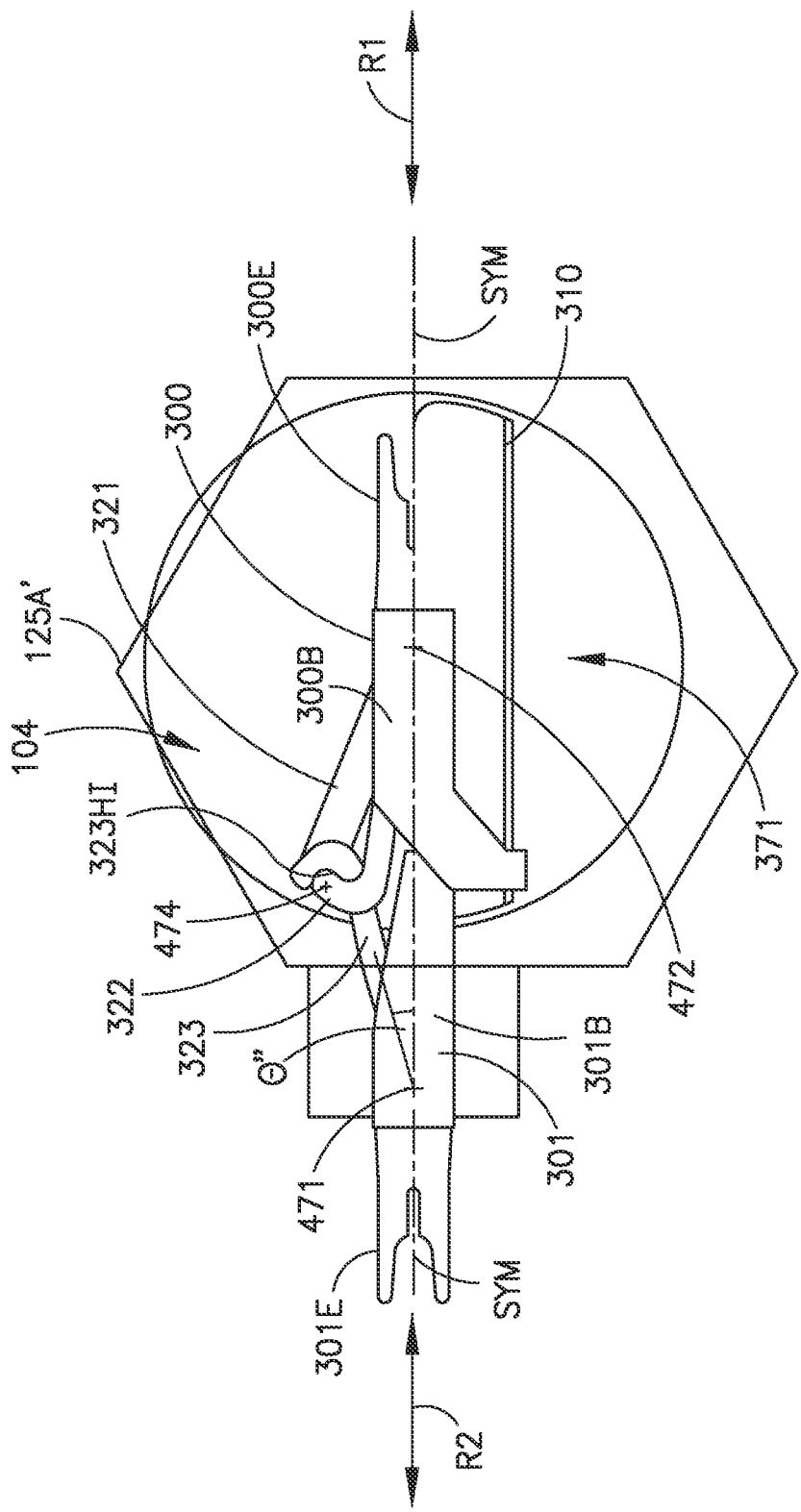

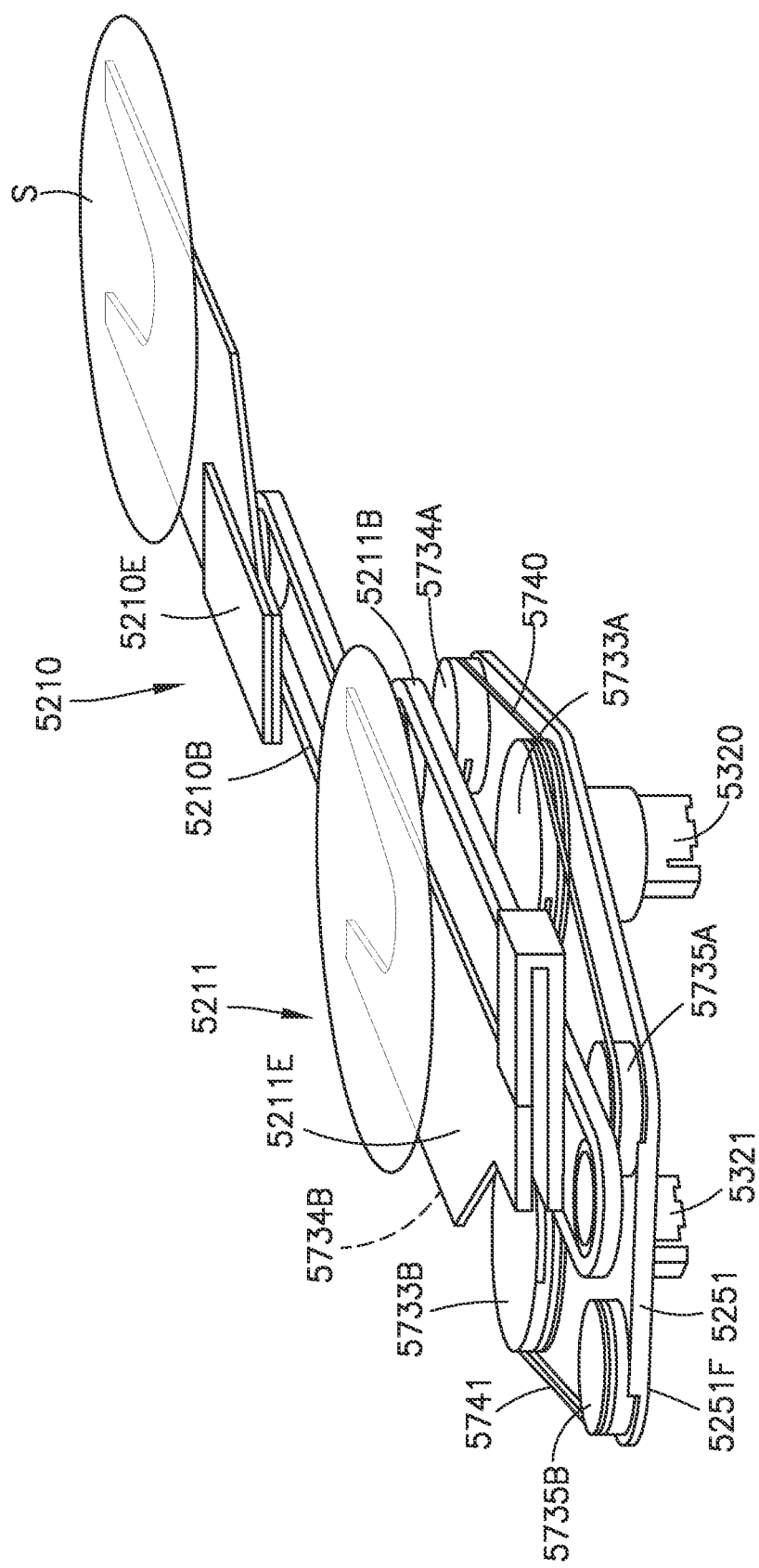

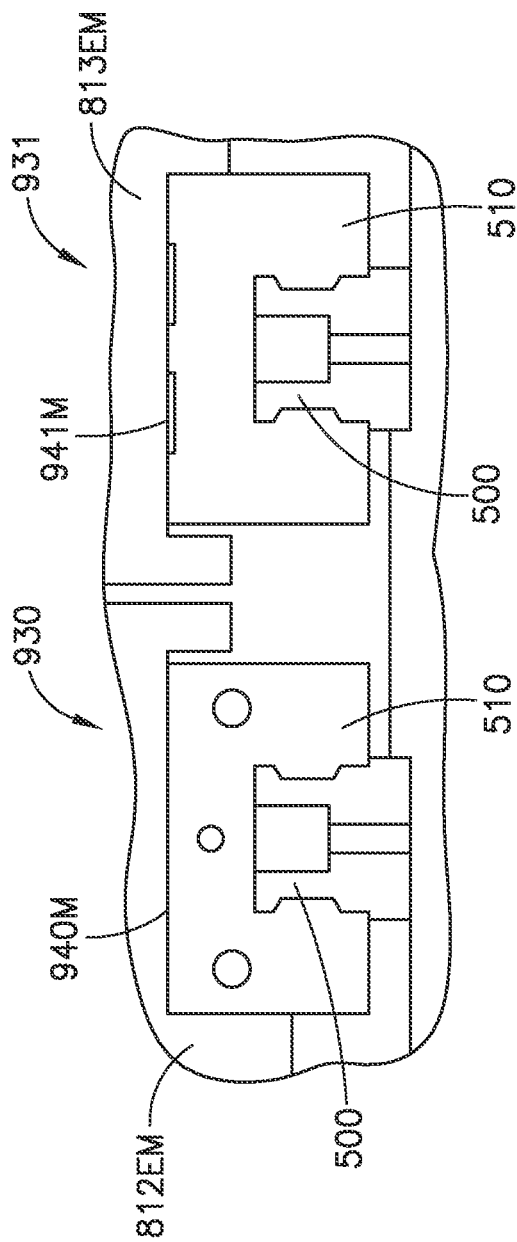

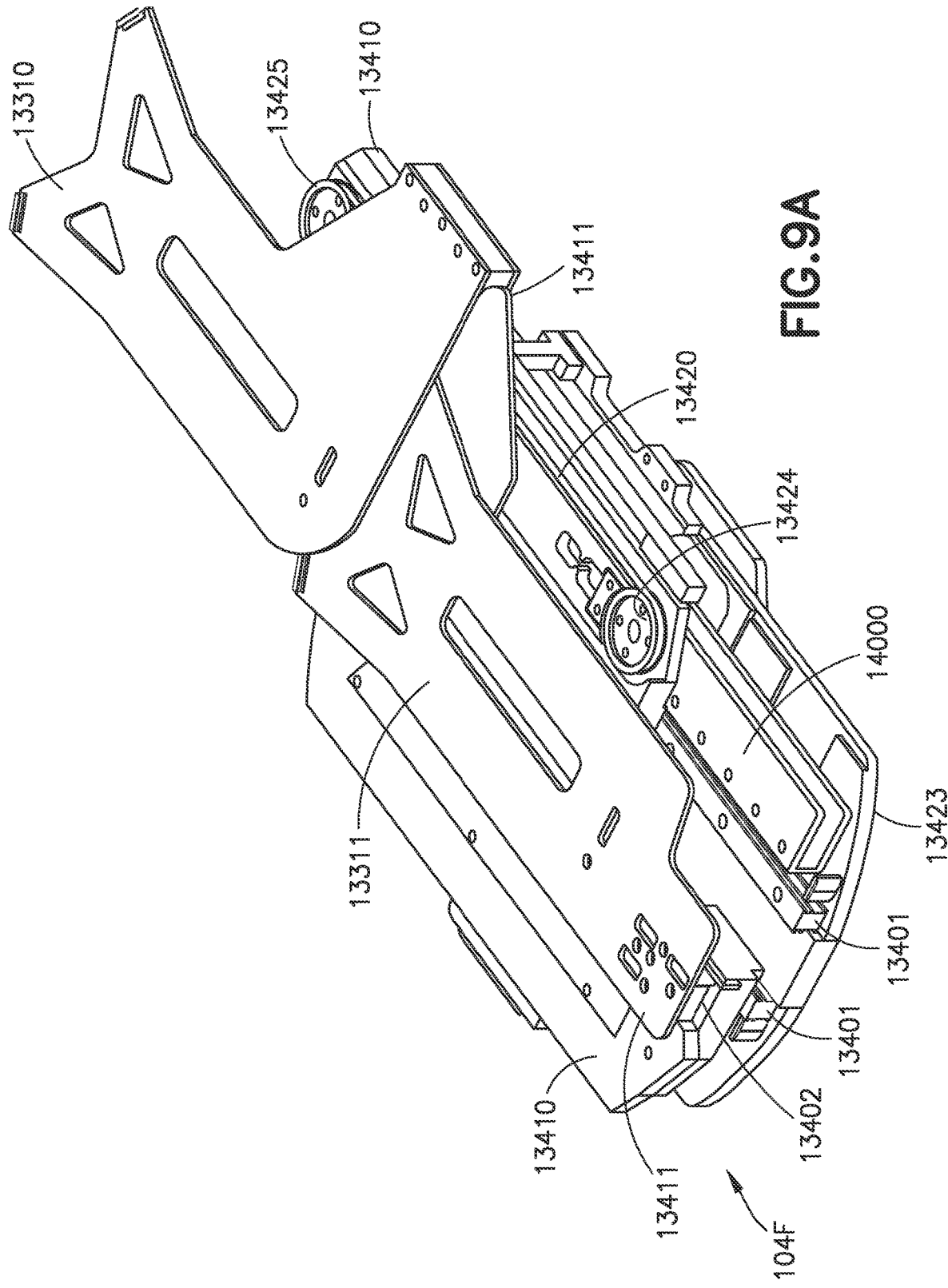

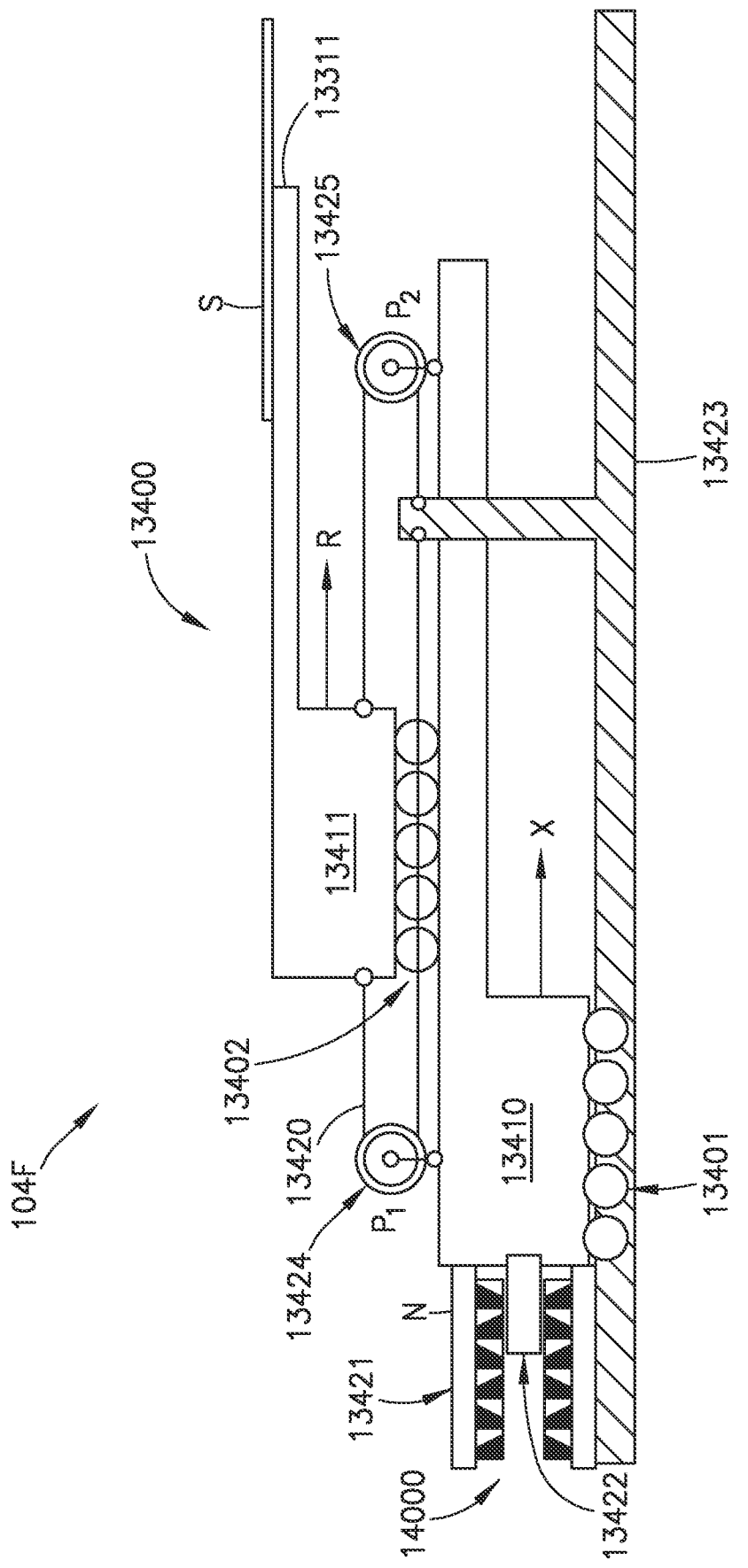

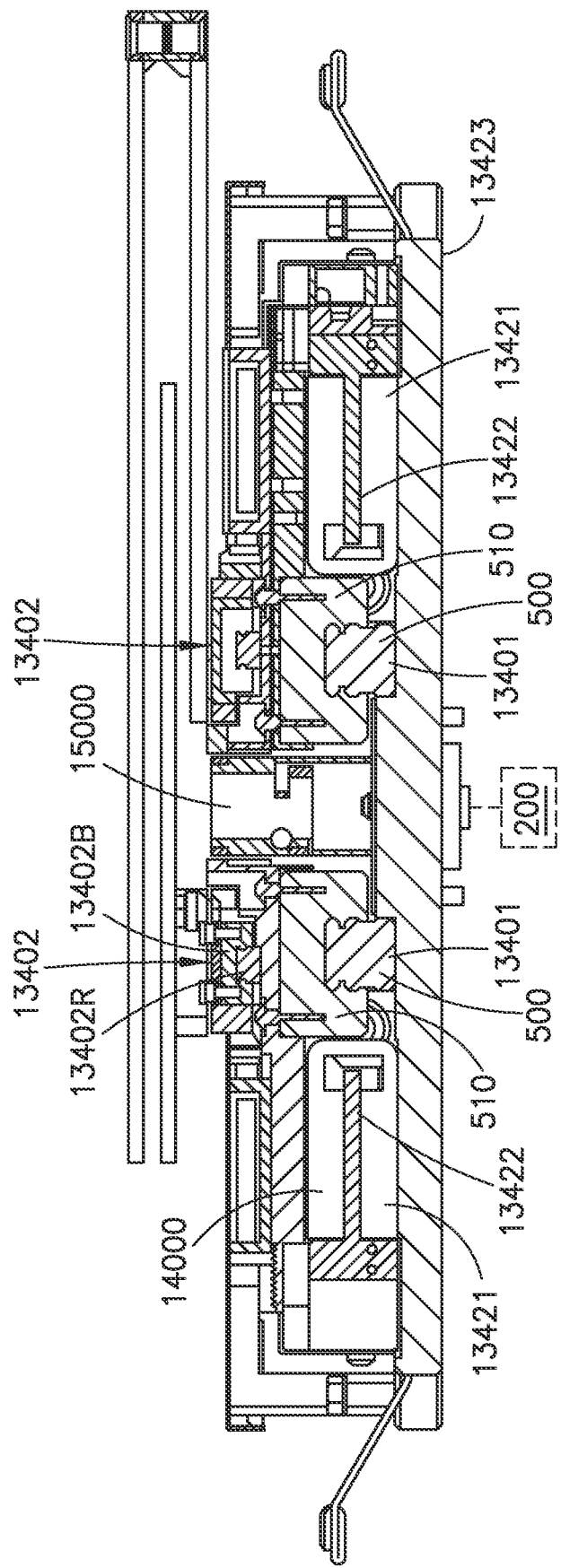

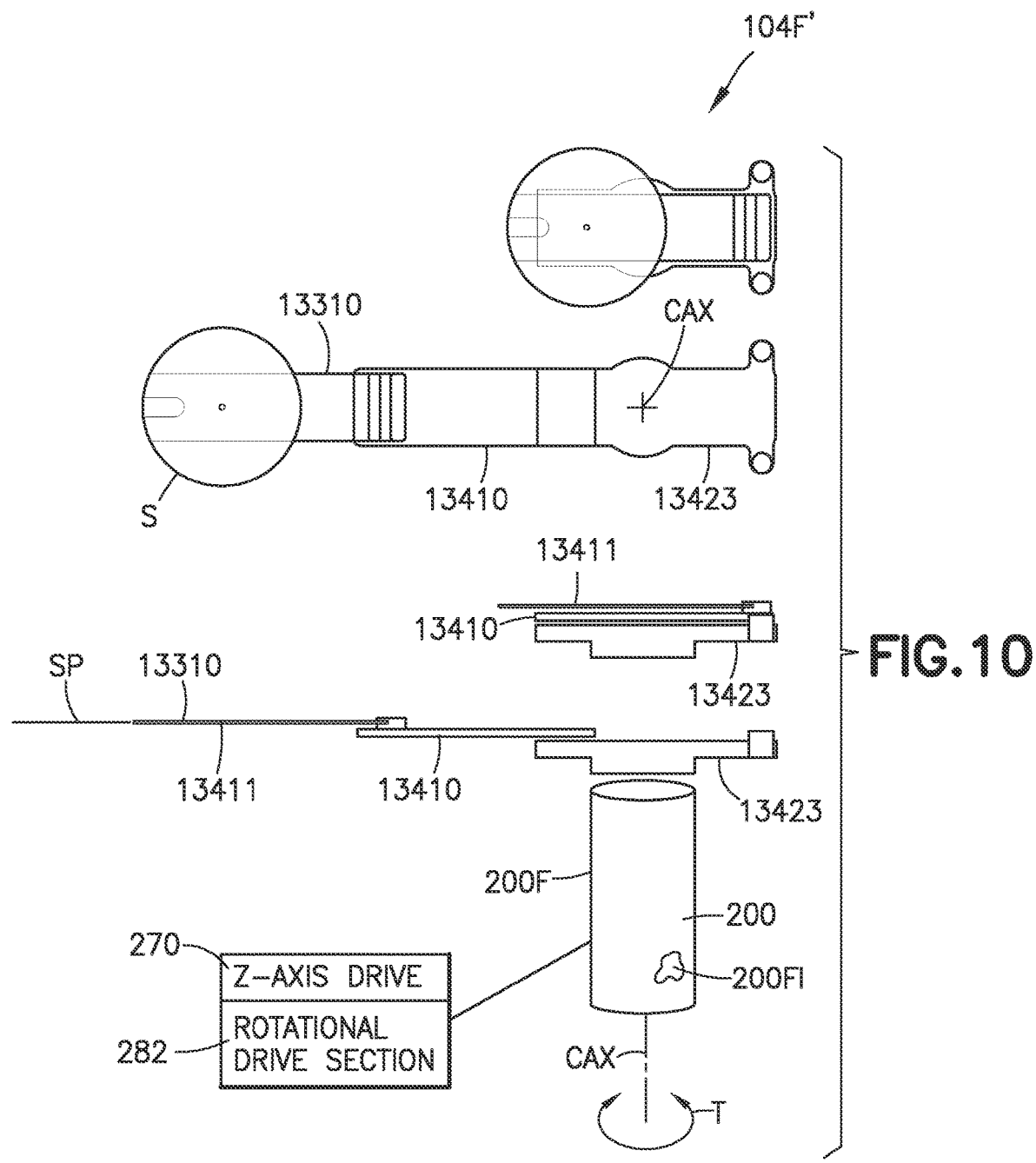

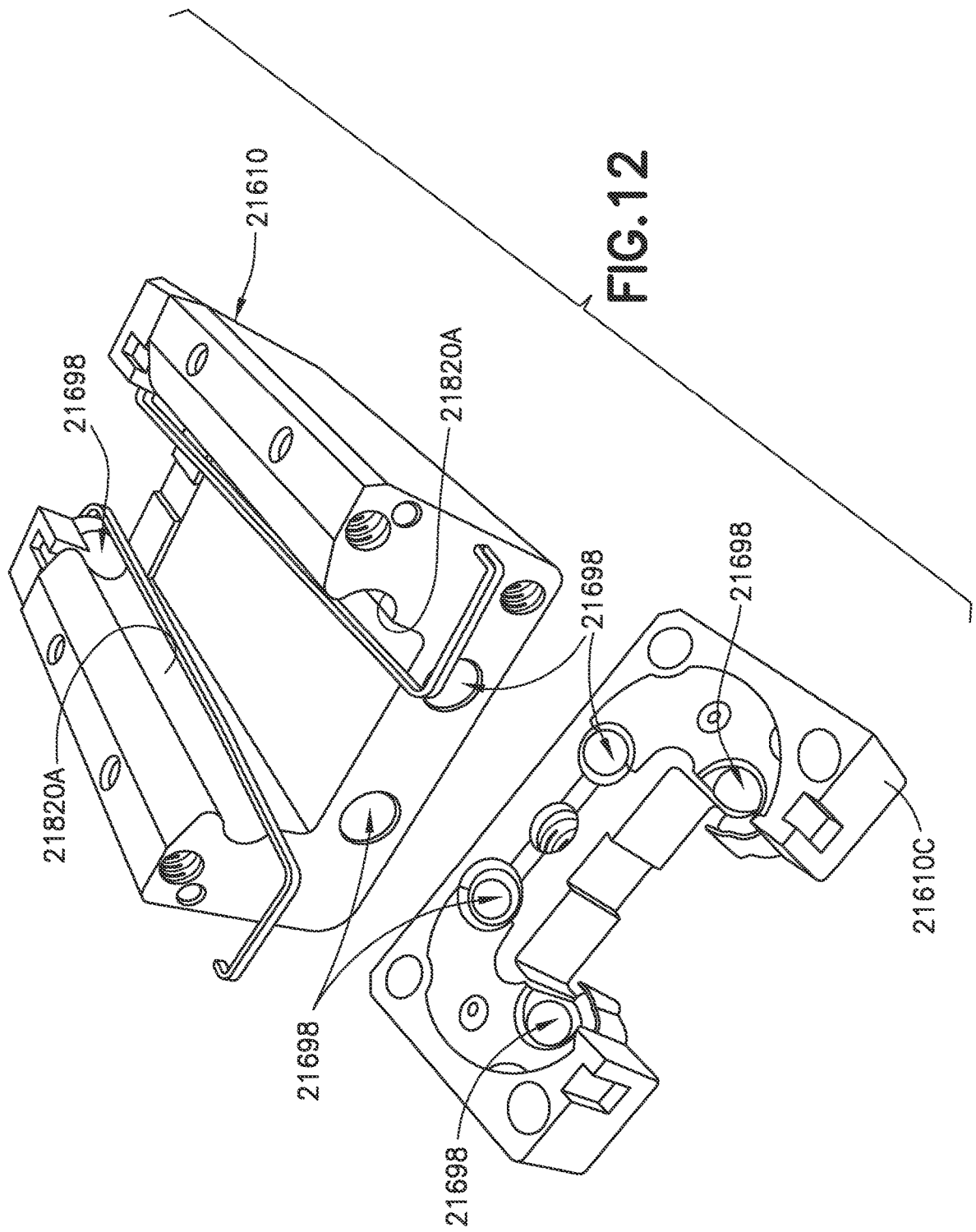

TRANSPORT APPARATUS WITH LINEAR BEARING

CROSS REFERENCE TO RELATED APPLICATIONS

This application is a continuation of U.S. patent application Ser. No. 16/668,290 filed on Oct. 30, 2019 (now U.S. Pat. No. 11,545,380 issued on Jan. 3, 2023) which is a non-provisional of, and claims the benefit of, U.S. Provisional Patent Application No. 62/754,465 filed on Nov. 1, 2018, the disclosures of which are incorporated herein by reference in their entireties.

BACKGROUND

1. Field

The exemplary embodiments generally relate to transport apparatus, and more particularly, to transport apparatus employed in a thermally elevated vacuum environment.

2. Brief Description of Related Developments

Processes developed for, e.g., the semiconductor industry have generally been performed in a vacuum environment because it provides cleanliness and molecular purity. Historically a limited number of vacuum processes operated at temperatures above about 50° C. (about 120° F.); however, a large percentage of processes performed, at the time of writing this application, are performed at temperatures from about 150° C. (about 300° F.) to about 700° C. (about 1290° F.). The combination of the vacuum environment and elevated temperatures presents a challenging environment for rolling elements, even when employing lubricants to achieve reliable operation over the service life of, for example, the semiconductor processing equipment. At temperatures above about 150° C. (about 300° F.) most vacuum greases begin to accelerate the evaporative process which reduces the available lubricant. This in turn shortens the working life of the rolling element and generally decreases the service interval for re-lubricating the rolling element. During these service intervals, for example, the semiconductor processing equipment is stopped, exposed to atmospheric conditions, and then the process is requalified (purged/cleaned, brought to vacuum, etc.) after servicing the rolling element(s). The servicing of the rolling elements and requalification of the process may result in about a three to five day loss of production, which results in a significant monetary loss to semiconductor device makers. Alternatively, the service intervals can be stretched in length which may introduce an increased number of random failure modes such as increased particulate or servo position errors. Neither of these options can meet a desired service life.

In addition, specific semiconductor processes are becoming more sensitive to mechanical contact on the semiconductor substrates (e.g., wafers). For example, a thin film of material applied to a wafer may be fractured or broken off during transport of the wafer. The pieces of material resulting from the fracture or breaking of the thin film can settle on the wafer surface producing defects on the wafer that reduce the semiconductor device yield of the wafer. Harsh mechanical contact to the wafer, such as due to degraded rolling elements and/or rolling elements with poor mechanical resonance is undesirable.

BRIEF DESCRIPTION OF THE DRAWINGS

The foregoing aspects and other features of the present disclosure are explained in the following description, taken in connection with the accompanying drawings, wherein:

FIGS. 1A-1D are schematic illustrations of substrate processing apparatus in accordance with aspects of the present disclosure;

FIGS. 1E and 1F are schematic illustrations of portions of the substrate processing apparatus of FIGS. 1A-1D in accordance with aspects of the present disclosure;

FIGS. 3A-3B are schematic illustrations of a transport apparatus in accordance with aspects of the disclosed embodiment;

FIG. 6A-6E are schematic illustrations of portions a substrate transport apparatus in accordance with aspects of the disclosed embodiment;

FIGS. 7A-7B are schematic illustrations of a portions of substrate transport apparatus in accordance with aspects of the disclosed embodiment;

FIGS. 9A-9C are schematic illustrations of portions of a substrate transport apparatus in accordance with aspects of the disclosed embodiment;

FIG. 10 is a schematic illustration of portions of a substrate transport apparatus in accordance with aspects of the disclosed embodiment;

FIG. 12 is a schematic illustration of the bearing of FIG. 11 in accordance with aspects of the present disclosure;

DETAILED DESCRIPTION

Figure 2A:
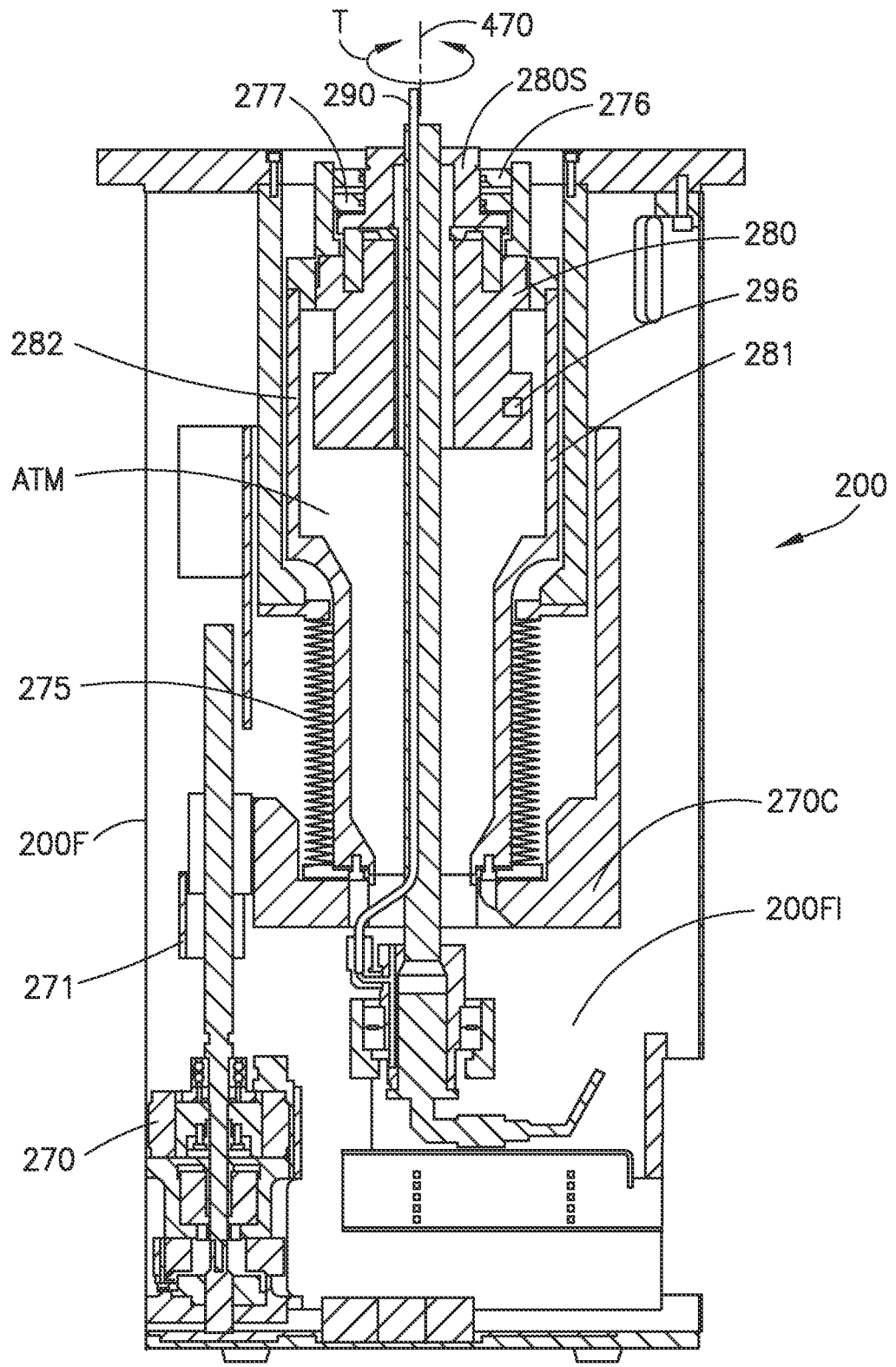
FIG. 2A is a schematic illustration of a transport apparatus drive section in accordance with aspects of the disclosed embodiment.

FIGS. 1A-1D illustrate semiconductor processing systems 100A, 100B, 100C, 100D including a transport apparatus 104 in accordance with aspects of the present disclosure. Although the aspects of the present disclosure will be described with reference to the drawings, it should be understood that the aspects of the present disclosure can be embodied in many forms. In addition, any suitable size, shape or type of elements or materials could be used.

The aspects of the present disclosure provide for a substrate transport apparatus 104 (also referred to herein simply as transport apparatus 104) that may operate, substantially without periodic service intervals, in a vacuum environment at temperatures between about 150° C. (about 300° F.) (or below) and about 500° C. (about 930° F.), between about 260° C. (about 500° F.) (or below) and about 500° C. (about 930° F.), and more particularly between about 260° C. (about 500° F.) (or below) and about 700° C. (about 1290° F.). As an example, the service interval of the transport apparatus 104 is substantially equal to the desired service life or period of the transport apparatus 104 (i.e., the transport apparatus 104 is substantially maintenance free over the desired service period of the transport apparatus 104), such as for example a minimum five year service period/life with substantially zero maintenance. The transport apparatus 104 is described herein as a linear vacuum substrate transport apparatus, though in other aspects the transport apparatus may have any suitable configuration that includes at least one bearing having rolling elements (either linear rolling elements such as in linear bearing applications or rotary rolling elements such as in rotary bearing applications—it is noted that the aspects of the present disclosure are described with respect to linear bearings but it should be understood that the aspects of the present disclosure apply equally to rotary bearings without departing from the scope of the present disclosure). The rolling elements, in accordance with aspects of the present disclosure, provide smooth mechanical contact between an end effector of the transport apparatus 104 and the wafer with controlled end effector vibration from rolling element/bearing performance as will be described herein.

The aspects of the present disclosure also provide the transport apparatus 104 with reduced vibrational effects on wafers carried by the transport apparatus 104 so as to not affect, e.g., processed films on the wafers carried by the transport apparatus 104. For example, the transport apparatus 104 includes a bearing 21600 (see FIG. 11) that minimizes frictional resistance and vibration inducing impacts between rolling load bearing elements 21611 (see FIG. 11) of the bearing 21600. As will be described in greater detail below, the aspects of the present disclosure provide at least one rolling, substantially non-load bearing, spacer element 21620 (see FIG. 11) between and spacing each of the rolling load bearing elements 21611 from another of the rolling load bearing elements 21611. The rolling, substantially non-load bearing, spacer element 21620 may be undersized, compared to the rolling load bearing elements 21611 so as to form a free running clearance 21801 between the rolling, substantially non-load bearing, spacer element 21620 and a bearing raceway 21820A, 21820B (see FIGS. 11 and 13A) of the bearing 21600, and another free running clearance 21800 between the rolling, substantially non-load bearing, spacer element 21620 and adjacent rolling load bearing elements 21611 as described herein. The counter-rotating frictional forces 1850 (see FIG. 13A) at the contact interfaces 21851 (see FIG. 13A) between the rolling, substantially non-load bearing, spacer element 21611 and both the bearing raceway 21820A, 21820B and the rolling load bearing elements 21611 are reduced by a significant degree, e.g., compared to counter-rotating frictional forces 21870 (FIG. 13B) at the contact interfaces 21871 of two rolling load bearing elements 21611, at least by the construction and material properties of the rolling, substantially non-load bearing, spacer element 21620 as will be described further below.

Still referring to FIGS. 1A-1D, the processing apparatus 100A, 100B, 100C, 100D, such as for example a semiconductor tool station, is shown in accordance with an aspect of the present disclosure. Although a semiconductor tool station is shown in the drawings, the aspects of the present disclosure described herein can be applied to any tool station or application employing robotic manipulators. In one aspect the processing apparatus 100A, 100B, 100C, 100D are shown as having cluster tool arrangements (e.g. having substrate holding stations connected to a central chamber) while in other aspects the processing apparatus may be a linearly arranged tool, however the aspects of the present disclosure may be applied to any suitable tool station. The apparatus 100A, 100B, 100C, 100D generally include an atmospheric front end 101, at least one vacuum load lock 102, 102A, 102B and a vacuum back end 103. The at least one vacuum load lock 102, 102A, 102B may be coupled to any suitable port(s) or opening(s) of the front end 101 and/or back end 103 in any suitable arrangement. For example, in one aspect the one or more load locks 102, 102A, 102B may be arranged in a common horizontal plane in a side by side arrangement as can be seen in FIGS. 1B-1C. In other aspects the one or more load locks may be arranged in a grid format such that at least two load locks 102A, 102B, 102C, 102D are arranged in rows (e.g. having spaced apart horizontal planes) and columns (e.g. having spaced apart vertical planes) as shown in FIG. 1E. In still other aspects the one or more load lock may be a single in-line load lock 102 as shown in FIGS. 1A. In yet another aspect the at least one load lock 102, 102E may be arranged in a stacked in-line arrangement as shown in FIG. 1F. It should be understood that while the load locks are illustrated on end 100E1 or facet 100F1 of a transport chamber 125A, 125B, 125C, 125D in other aspects the one or more load lock may be arranged on any number of sides 100S1, 100S2, ends 100E1, 100E2 or facets 100F1-100F8 of the transport chamber 125A, 125B, 125C, 125D. Each of the at least one load lock may also include one or more wafer/substrate resting planes WRP (FIG. 1F) in which substrates are held on suitable supports within the respective load lock. In other aspects, the tool station may have any suitable configuration. The components of each of the front end 101, the at least one load lock 102, 102A, 102B and back end 103 may be connected to a controller 110 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIGS. 1A-1D, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the present disclosure described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The at least one vacuum load lock 102, 102A, 102B may be located between and connected to the mini-environment 106 and the back end 103. In other aspects the load ports 105 may be coupled substantially directly to the at least one load lock 102, 102A, 102B or the transport chamber 125A, 125B, 125C, 125D where the substrate carrier/cassette C is pumped down to a vacuum of the transport chamber 125A, 125B, 125C, 125D and substrates are transferred directly between the substrate carrier C and the load lock or transfer chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transport apparatus may be provided within the load lock or otherwise have access to the carrier C for transferring substrates to and from the substrate carrier C. It is noted that the term vacuum or vacuum environment as used herein may denote a high vacuum compatible with high vacuum substrate fabrication operations where the high vacuum such as $10^{-3}$ Torr or below in which the substrates are processed. The at least one load lock 102, 102A, 102B generally includes atmospheric and vacuum slot valves. The slot valves of the load locks 102, 102A, 102B (as well as for the processing stations 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100A, 100B, 100C, 100D may be located in the same plane, different vertically stacked planes or a combination of slot valves located in the same plane and slot valves located in different vertically stacked planes (as described above with respect to the load ports) to accommodate transfer of substrates to and from at least the processing stations 130 and load locks 102, 102A, 102B coupled to the transport chamber 125A, 125B, 125C, 125D. The at least one load lock 102, 102A, 102B (and/or the front end 101) may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125A, 125B, 125C, 125D, one or more processing station(s) 130 and any suitable number of transport apparatuses 104 that includes one or more transfer robots which may include one or more aspects of the present disclosures described herein. The transport chamber 125A, 125B, 125C, 125D may have any suitable shape and size that, for example, complies with SEMI standard E72 guidelines. The transport apparatus(es) 104 and the one or more transfer robot will be described below and may be located at least partly within the transport chamber 125A, 125B, 125C, 125D to transport substrates between the load lock 102, 102A, 102B (or between a cassette C located at a load port) and the various processing stations 130. In one aspect the transport apparatus 104 may be removable from the transport chamber 125A, 125B, 125C, 125D as modular unit such that the transport apparatus 104 complies with SEMI standard E72 guidelines.

The processing stations 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processes performed within/by the processing stations 130 may be performed in a vacuum atmosphere at temperatures ranging between about 150° C. (about 300° F.) (or below) and about 700° C. (about 1290° F.), between about 260° C. (about 500° F.) (or below) and about 500° C. (about 930° F.), and more particularly between about 260° C. (about 500° F.) and about 700° C. (about 1290° F.). The processing stations 130 are communicably connected to the transport chamber 125A, 125B, 125C, 125D in any suitable manner, such as through slot valves SV, to allow substrates to be passed from the transport chamber 125 to the processing stations 130 and vice versa. The slot valves SV of the transport chamber 125 may be arranged to allow for the connection of twin (e.g. more than one substrate processing chamber located within a common housing) or side-by-side process stations 130T1, 130T2, single process stations 130S and/or stacked process modules/load locks (FIGS. 1E and 1F).

It is noted that the transfer of substrates to and from the processing station 130, load locks 102, 102A, 102B (or cassette C) coupled to the transfer chamber 125A, 125B, 125C, 125D may occur when one or more arms of the transport apparatus 104 are aligned with a predetermined processing station 130. In accordance with aspects of the present disclosure one or more substrates may be transferred to a respective predetermined processing station 130 individually or substantially simultaneously (e.g. such as when substrates are picked/placed from side-by-side or tandem processing stations as shown in FIGS. 1B, 1C and 1D. In one aspect the transport apparatus 104 may be mounted on a boom arm 143 (see e.g. FIG. 1D) or linear carriage 144 such as that described in U.S. patent application Ser. No. 15/103,268 entitled "Processing Apparatus" and having a Patent Cooperation Treaty filing date of Oct. 16, 2014, and U.S. patent application Ser. No. 14/377,987 entitled "Substrate Processing Apparatus" and having a Patent Cooperation Treaty filing date of Feb. 11, 2013, the disclosures of which are incorporated herein by reference in their entireties. The transport apparatus 104 includes a transport arm that includes a linear radial motion configuration, at least in part as will be further described herein. Accordingly, service duty of transfer motions corresponds thereto.

Figure 2B:
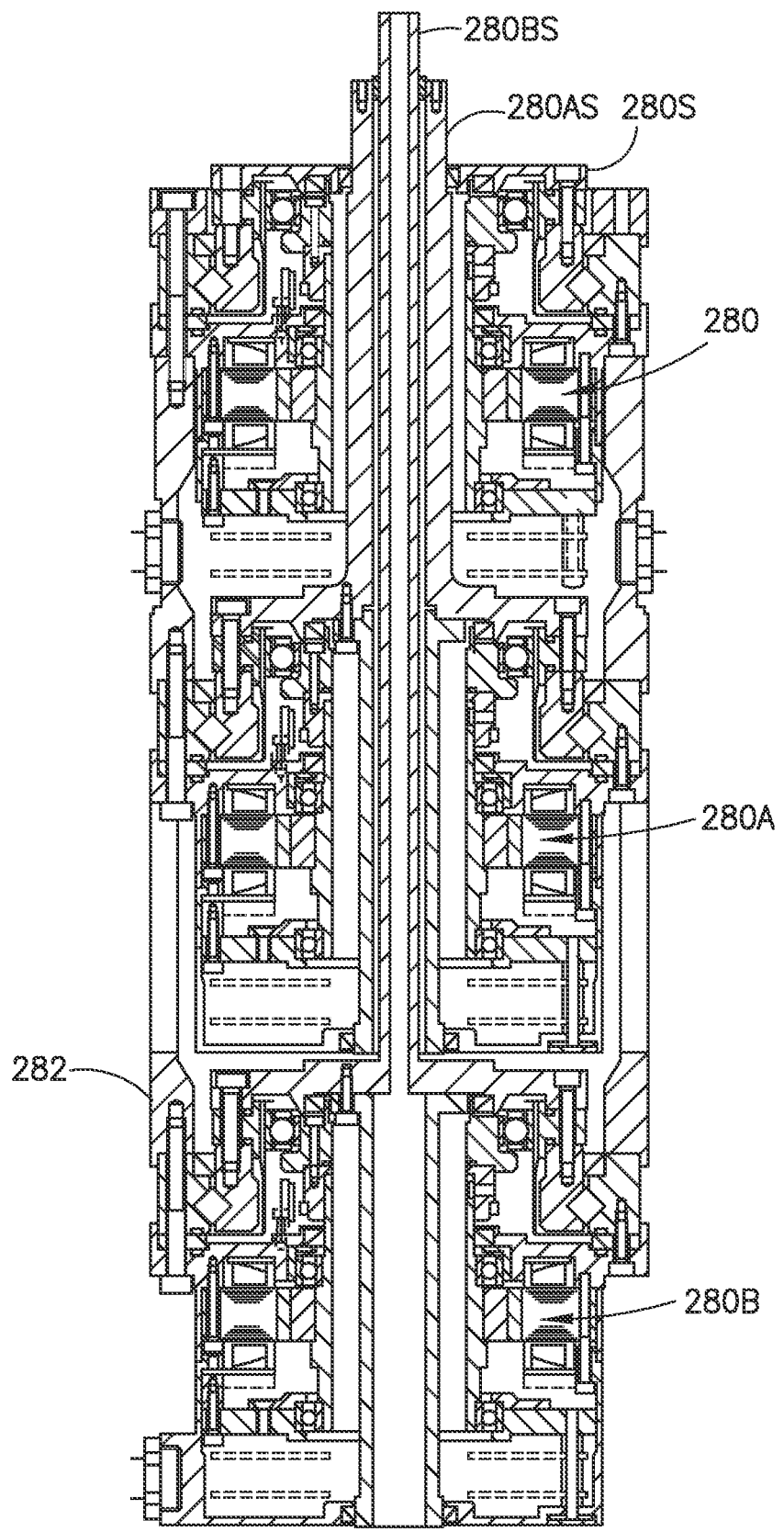
FIG. 2B is a schematic illustration of a portion of the transport apparatus drive section of FIG. 2A in accordance with aspects of the disclosed embodiment.

Referring now to FIGS. 2A, 2B, 3A, 3B and 5B in one aspect the transport apparatus 104 includes at least one drive section 200, 200A, 200B (FIGS. 6A-7B) and at least one transfer arm portion 371 having at least one transfer arm 300, 301. The at least one drive section may include a common drive section 200 that includes a frame 200F that houses one or more of a Z axis drive 270 and a rotational drive section 282. An interior 200FI of the frame 200F may be sealed in any suitable manner as will be described below. In one aspect the Z axis drive may be any suitable drive configured to move the at least one transfer arm 300, 301 along the Z axis. The Z axis drive is illustrated in FIG. 2A as a screw type drive but in other aspects the drive may be any suitable linear drive such as a linear actuator, piezo motor, etc. The rotational drive section 282 may be configured as any suitable drive section such as, for example, a harmonic drive section. For example, the rotational drive section 282 may include any suitable number of coaxially arranged harmonic drive motors 280, such as can be seen in FIG. 2B where the drive section 282 includes three coaxially arranged harmonic drive motors 280, 280A, 280B. In other aspects the drives of drive section 282 may be located side-by-side and/or in a coaxial arrangement. In one aspect the rotational drive section 282 shown in FIG. 2A includes one harmonic drive motor 280 for driving shaft 280S however, in other aspects the drive section may include any suitable number of harmonic drive motors 280, 280A, 280B (FIG. 2B) corresponding to, for example, any suitable number of drive shafts 280S, 280AS, 280BS (FIG. 2B) in the coaxial drive system. The harmonic drive motor 280 may have high capacity output bearings such that the component pieces of a ferrofluidic seal 276, 277, are centered and supported at least in part by the harmonic drive motor 280 with sufficient stability and clearance during desired rotation T and extension R1, R2 movements of the transport apparatus 104. It is noted that the ferrofluidic seal 276, 277 may include several parts that form a substantially concentric coaxial seal as will be described below. In this example the rotational drive section 282 includes a housing 281 that houses one or more drive motor 280 which may be substantially similar to that described above and/or in U.S. Pat. Nos. 6,845,250; 5,899,658; 5,813,823; and 5,720,590, the disclosures of which are incorporated by reference herein in their entireties. The ferrofluidic seal 276, 277 can be toleranced to seal each drive shaft 280S, 280AS, 280BS in the drive shaft assembly. In one aspect a ferrofluidic seal may not be provided. For example, the drive section 282 may include drives having stators that are substantially sealed from the environment in which the transport arms operate while the rotors and drive shafts share the environment in which the arms operate. Suitable examples, of drive sections that do not have ferrofluidic seals and may be employed in the aspects of the disclosed embodiment include the MagnaTran® 7 and MagnaTran® 8 robot drive sections from Brooks Automation, Inc. which may have a sealed can arrangement as will be described below. It is noted that drive shaft(s) 280S, 280AS, 280BS may also have a hollow construction (e.g. has a hole running longitudinally along a center of the drive shaft) to allow for the passage of wires 290 or any other suitable items through the drive assembly for connection to, for example, another drive section (e.g., such as will be described below with respect to, e.g. FIGS. 6E, 7A-9C), any suitable position encoders, controllers, and/or the at least one transfer arm 300, 301, mounted to the drive 200. As may be realized, each of the drive motors of drive section 200, 200A, 200B may include any suitable encoders configured to detect a position of the respective motor for determining a position of the end effector 300E, 301E of each transport arm 300, 301.

In one aspect the housing 281 may be mounted to a carriage 270C which is coupled to the Z axis drive 270 such that the Z axis drive 270 moves the carriage (and the housing 281 located thereon) along the Z axis. As may be realized, to seal the controlled atmosphere in which the at least one transfer arm 300, 301 operates from an interior of the drive 200 (which may operate in an atmospheric pressure ATM environment) may include one or more of the ferrofluidic seal 276, 277 described above and a bellows seal 275. The bellows seal 275 may have one end coupled to the carriage 270C and another end coupled to any suitable portion of the frame 200FI so that the interior 200FI of the frame 200F is isolated from the controlled atmosphere in which the at least one transfer arm 300, 301 operates.

Figure 2C:
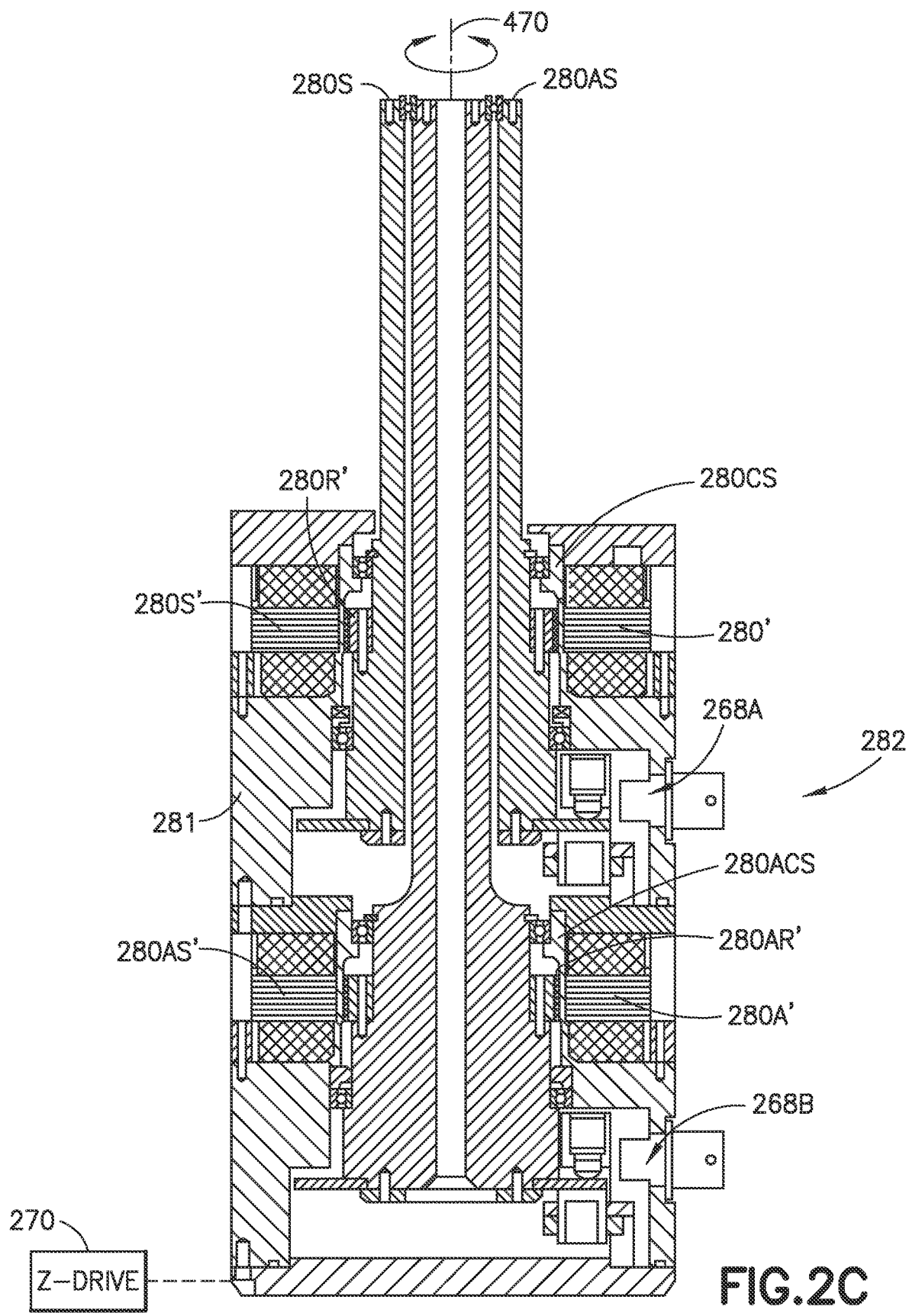
FIG. 2C is a schematic illustration of a portion of the transport apparatus drive section of FIG. 2A in accordance with aspects of the disclosed embodiment.
Figure 2D:
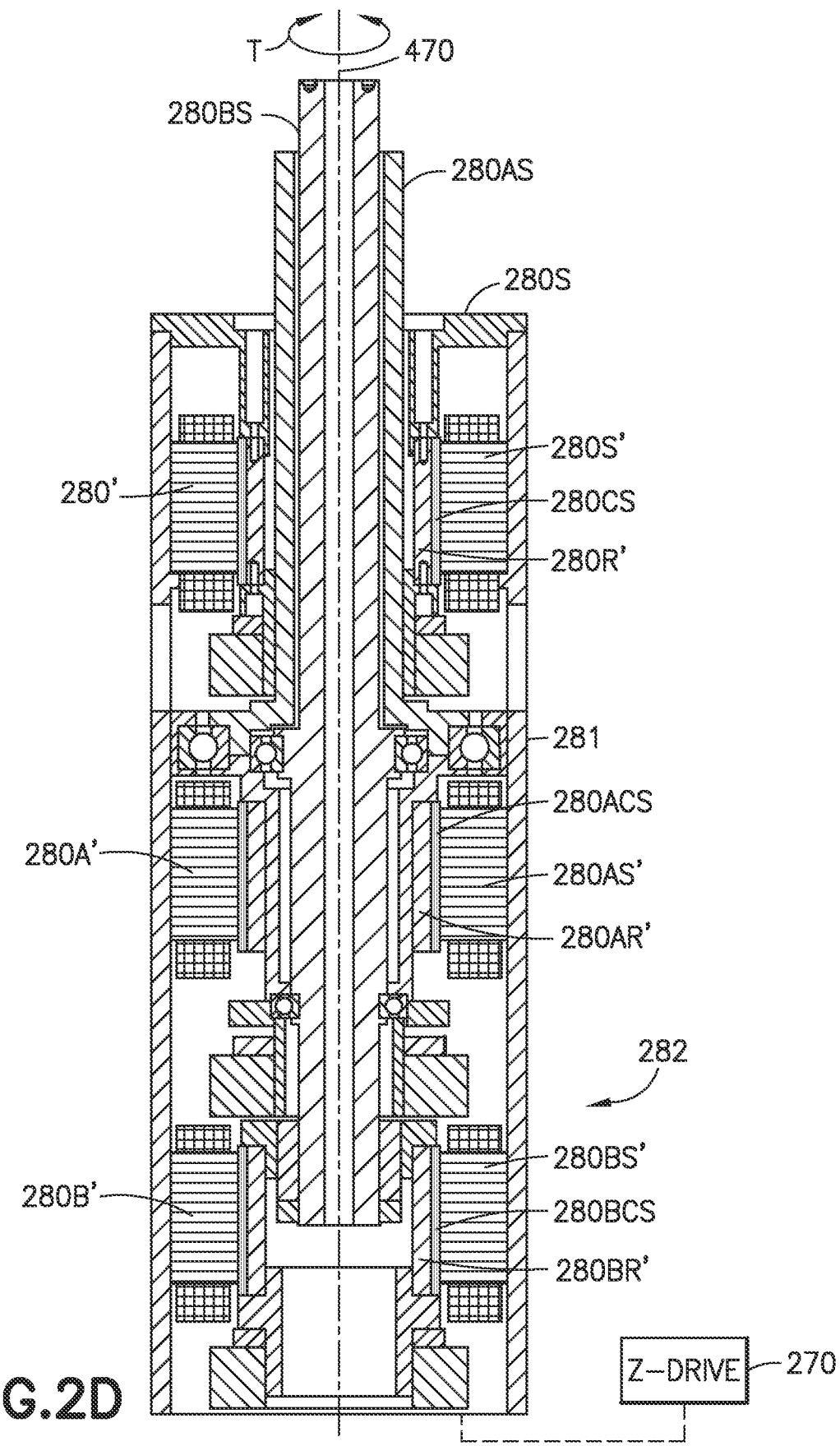
FIG. 2D is a schematic illustration of a portion of the transport apparatus drive section of FIG. 2A in accordance with aspects of the disclosed embodiment.
Figure 3C:
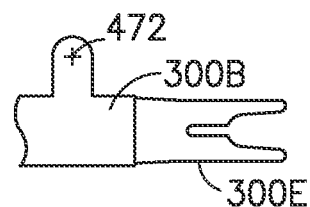
FIG. 3C is a schematic illustration of a portion of the transport apparatus of FIGS. 3A-3B in accordance with aspects of the disclosed embodiment.
Figure 3B:
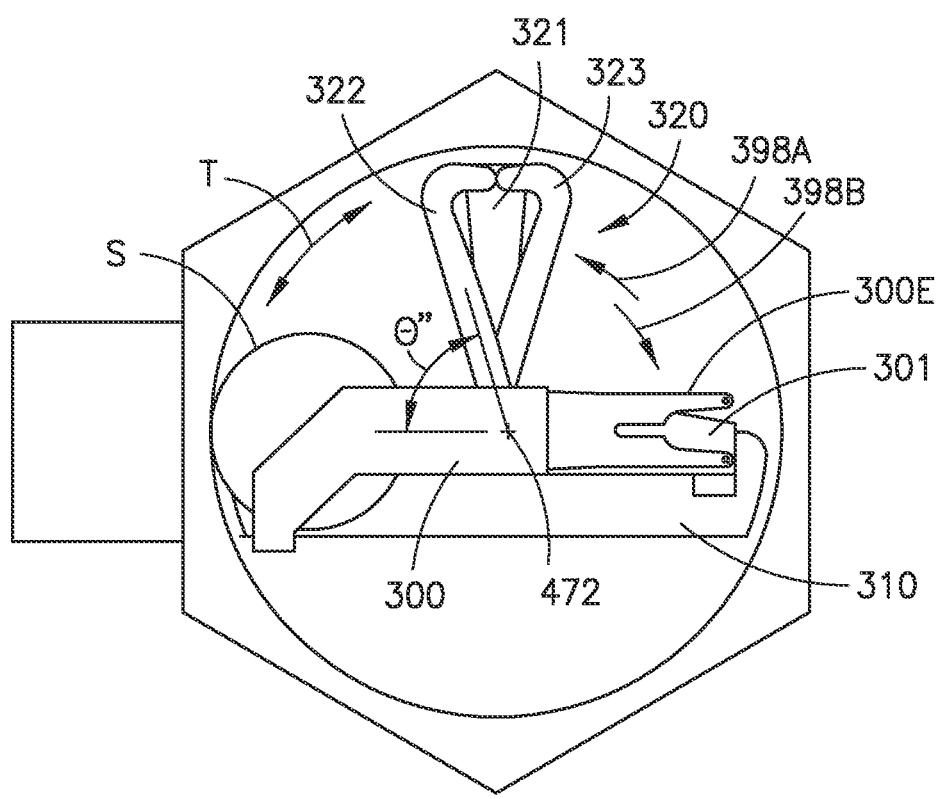

In other aspects, as noted above, a drive having stators that are sealed from the atmosphere in which the transport arms operate without a ferrofluidic seal, such as the MagnaTran® 7 and MagnaTran® 8 robot drive sections from Brooks Automation, Inc., may be provided on the carriage 270C. For example, referring also to FIGS. 2C and 2D the rotational drive section 282 is configured so that the motor stators are sealed from the environment in which the robot arms operate while the motor rotors share the environment in which the robot arms operate. FIG. 2C illustrates a coaxial drive having a first drive motor 280' and a second drive motor 280A'. The first drive motor 280' has a stator 280S' and rotor 280R' where the rotor 280R' is coupled to drive shaft 280S. A can seal 280CS may be positioned between the stator 280S' and rotor 280R' and be connected to the housing 281 in any suitable manner so as to seal the stator 280S' from the environment in which the robot arms operate. Similarly the motor 280A' includes a stator 280AS' and rotor 280AR' where the rotor 280AR' is coupled to drive shaft 280AS. A can seal 280ACS may be disposed between the stator 280AS' and rotor 280AR'. The can seal 280ACS may be connected to the housing 281 in any suitable manner so as to seal the stator 280AS' from the environment in which the robot arms operate. As may be realized any suitable encoder/ sensors 268A, 268B may be provided for determining a position of the drive shaft (and the arm(s) which the drive shaft(s) operates). Referring to FIG. 2D a tri-axial rotational drive section 282 is illustrated. The tri-axial rotational drive section may be substantially similar to the coaxial drive section described above with respect to FIG. 2C however, in this aspect there are three motors 280', 280A', 280B', each having a rotor 280R', 280AR', 280BR' coupled to a respective drive shaft 280A, 280AS, 280BS. Each motor also includes a respective stator 280S', 280AS', 280BS' sealed from the atmosphere in which the robot arm(s) operate by a respective can seal 280SC, 280ACS, 280BCS. As may be realized any suitable encoders/sensors may be provided as described above with respect to FIG. 2C for determining a position of the drive shaft (and the arm(s) which the drive shaft(s) operates). As may be realized, in one aspect the drive shafts of the motors illustrated in FIGS. 2C and 2D may not allow for wire 290 feed-through while in other aspects any suitable seals may be provided so that wires may be passed through, for example, hollow drive shafts of the motors illustrated in FIGS. 2C and 2D.

Referring also to FIGS. 3A-3C and 4A-4E in this aspect the drive shaft 280S may be coupled to a base member or frame 310F of the transfer arm portion 371 for rotating the transfer arm portion 371 as a unit in the direction of arrow T about a common axis 470 (also referred to herein as common axis CAX) that may be common to each of the at least one transfer arm 300, 301. For example, the base member 310F may be rotated about axis 470 so that the arms 300, 301 are rotated as a unit about the axis 470. The base member 310F may include a mounting portion 450 to which, for example, drive shaft 280S is coupled so that as drive shaft 280S moves the base member 310F moves with it. The mounting portion 450 may include an aperture 450A through which one or more drive shafts, such as drive shafts 280AS, 280BS are coupled to one or more linear arm radial motion transmission members, illustrated for example here as crank members 321 (other transmission configurations may be used). In other aspects the one or more drive shafts 280AS, 280S may be coupled to a respective crank member 321 in any suitable manner, such as through any suitable transmission. In this aspect the drive, 200 may include two drive shafts where one drive shaft 280S is coupled substantially directly to the base member 310F and another drive shaft 280AS is coupled substantially directly to crank member 321.

One or more guide rails, tracks or bearings 400, 401 that define a degree of freedom axis and effect extension/retraction of a respective arm 300, 301 may be mounted to the base member 310F in any suitable manner. The bearings 400, 401 may be any suitable bearings such as linear bearings. A first carriage (also referred to herein as a bearing case) 420 may be moveably mounted or coupled to bearing (e.g., bearing rail) 400 in any suitable manner. For example the carriage 420 may include a bearing interface portion 420B configured to engage and support the carriage on the bearing 400. The carriage 420 may include an arm mounting portion 420P to which the transport arm 300 is coupled. For example, the transport arm may include a base 300B and an end effector 300E coupled to the base 300B (the end effector may be coupled to the base so that the base is connected to a top or bottom side of the end effector, e.g. the base is located above or below the end effector in a different plane than the end effector, or the base may be connected to the end effector so that the base and end effector are located in a common plane). The base 300B of the transport arm may be coupled to the mounting portion 420P in any suitable manner. In other aspects at least the base 300B of the transport arm 300 and carriage 420 may be integrally formed as a unitary one piece member.

A second carriage (also referred to herein as a bearing case) 421 may be movably mounted or coupled to bearing (e.g., bearing rail) 401 in any suitable manner. For example the carriage 421 may include a bearing interface portion 421B configured to engage and support the carriage on the bearing 401. The carriage 421 may include an arm mounting portion 421P to which the transport arm 301 is coupled. For example, the transport arm 301 may include a base 301B and an end effector 301E coupled to the base 301B (the end effector may be fixedly coupled to the base so that the base is connected to a top or bottom side of the end effector, e.g. the base is located above or below the end effector in a different plane than the end effector, or the base may be connected to the end effector so that the base and end effector are located in a common plane). The base 301B of the transport arm may be coupled to the mounting portion 421P in any suitable manner. In other aspects at least the base 301B of the transport arm 301 and carriage 421 may be integrally formed as a unitary one piece member.

Any suitable cover 310C may be provided over the bearing rails 400, 401 and at least a portion of the first and second carriages 420, 421 to substantially contain any particles generated by the first and second carriage 420, 421. In this aspect the arms 300, 301 are illustrated as being located one above the other in a stacked arrangement but in other aspects the arms may be located side-by-side or have any other suitable arrangement. In one aspect one or more suitable sensors or encoders 123C, 123D may be placed on the frame 310F and be configured to interact with one or more of the carriages 420, 421 or the transfer arms 300, 301 for determining a position of the end effector. In other aspects sensors one or more sensors 123A, 13B may be place in the transfer chamber (FIG. 1B) for detecting the end effector and/or substrate located thereon for determining a position of the end effector and/or substrate thereon.

Each transport arm 300, 301 may be coupled to the crank member 321 and driven as described in, U.S. patent application Ser. No. 15/110,130 entitled "Substrate Transport Apparatus" and having a Patent Cooperation Treaty filing date of Jan. 16, 2015, the disclosure of which is incorporated by reference herein in its entirety. The crank member 321 and one or more of the drive links 322, 323 may define a transmission link or linkage 320. In one aspect one or more of the transmission linkage 320 and respective carriage 420, 421/guide member 400, 401 may be configured to support the respective arms 300, 301. In other aspects the transmission linkage 320 may independently support one or more of the arms 300, 301. In still other aspects the respective carriage 420, 421/guide member 400, 401 may be configured to independently support a respective arm 300, 301. The transmission linkage 320 may be a bi-axially rigid link where the term bi-axially rigid link means that it is configured to transmit driving force along an axis in two directions as described in U.S. patent application Ser. No. 15/110,130 (incorporated by reference herein as noted above). In other aspects, any suitable linkage may couple the drive 200 to the arms 300, 301. For example, suitable linkages are described in U.S. Pat. No. 7,946,800 entitled "Substrate Transport Apparatus with Multiple Independently Movable Articulated Arms" issued on May 24, 2011 and U.S. patent application Ser. No. 12/117,415 entitled "Substrate Transport Apparatus with Multiple Movable Arms Utilizing a Mechanical Switch Mechanism" filed on May 8, 2008 and Ser. No. 13/113,476 entitled "Substrate Transport Apparatus with Multiple Independently Movable Articulated Arms" filed on May 23, 2011 the disclosures of which are incorporated herein by reference in their entireties. The transmission linkage 320 may have a stiffness that defines sub-25 micron definition of end effector 300E, 301E movement.

While the transport apparatus 104 is described above as having two transfer arms 300, 301 on a single base member 310 in other aspects a single transfer arm may be located on a single base member 310. In still other aspects, one or more base members 310 may be stacked one above the other such that each base member 310 includes at least one transfer arm 300, 301. The stacked base members 310 and the respective transfer arms may be driven by a common drive section or the drive motors for driving the at least one transfer arm 300, 301 of a respective base member 310 may be distributed within the transport apparatus. While the arms 300, 301 of transport apparatus 104 are illustrated in FIGS. 3A-4C as opposing arms (e.g. the arms extend in opposing directions) in other aspects the arms and the transmission linkage my have any suitable arrangement/configuration relative to one another. For example, FIG. 5A illustrates a transport apparatus 104A in accordance with aspects of the disclosed embodiment. The transport apparatus 104A may be substantially similar to the transport apparatuses described herein. In this aspect the base member 310FA is coupled to one drive shaft 280S of the drive 200 (FIGS. 2A and 2B) while a common crank member 321A is coupled to another drive shaft 280AS of the drive 200. Here the crank member extends on opposite sides of the common axis 470 so as to have a proximate central portion (which may be coupled to the drive 200 in any suitable manner) and opposing distal ends. Drive link 322 may be pivotally coupled to a distal end at pivot axis 474A for coupling the arm 300 to the crank member 321A in a manner substantially similar to that described above. Drive link 323 may be pivotally coupled to the opposing distal end at pivot axis 473A to couple the crank member 321A to the arm 301 in a manner substantially similar to that described above. In this aspect an independent degree of freedom along the axis of extension/retraction R for each arm and rotation of the arms as a unit in the direction of arrow T about common axis 470 is achieved with a two drive axis drive section. The transport apparatus 104A may operate in a manner substantially similar to that described above such that as crank member 321A rotates in the direction of arrow 398A drive link 322 pushes arm 300 to extend along axis R1 while arm 301 remains substantially stationary and/or is retracted from an extended position. As crank member 321A rotates in the direction of arrow 398B drive link 323 pushes arm 301 to extend along axis R1 while arm 301 remains substantially stationary and/or is retracted from an extended position. Here the extension and retraction of arms 300, 301 is coupled but in other aspects the extension and retraction of the arms 300, 301 may be uncoupled by providing separate and distinct independently driven crank member for each arm 300, 301 as described herein.

Figure 5A:
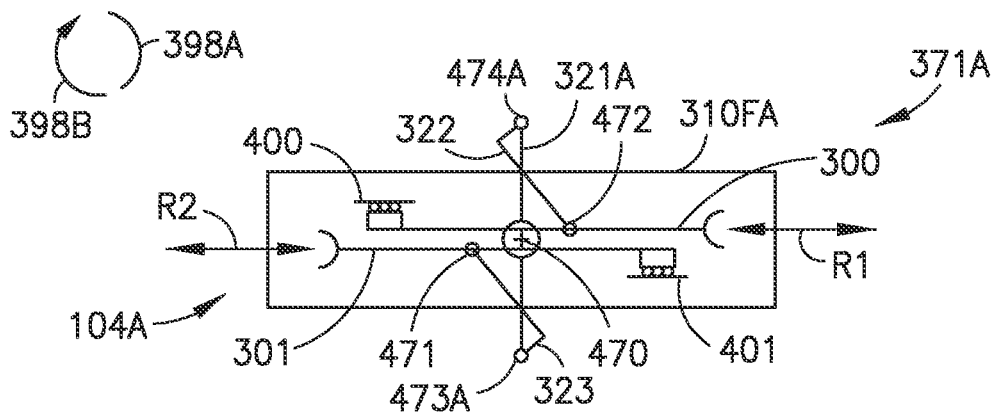
FIGS. 5A-5F are schematic illustrations of transport apparatuses in accordance with aspects of the disclosed embodiment.
Figure 5B:
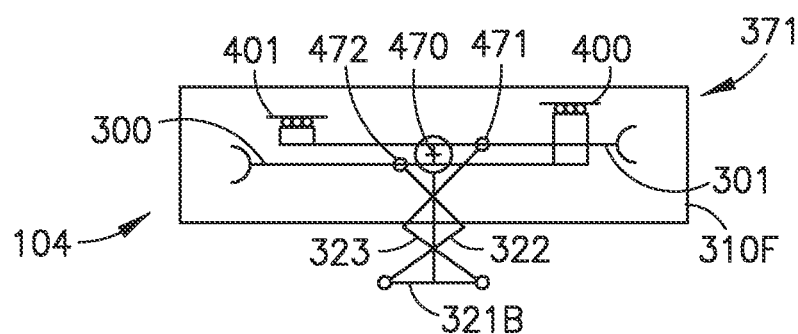
Figure 5C:
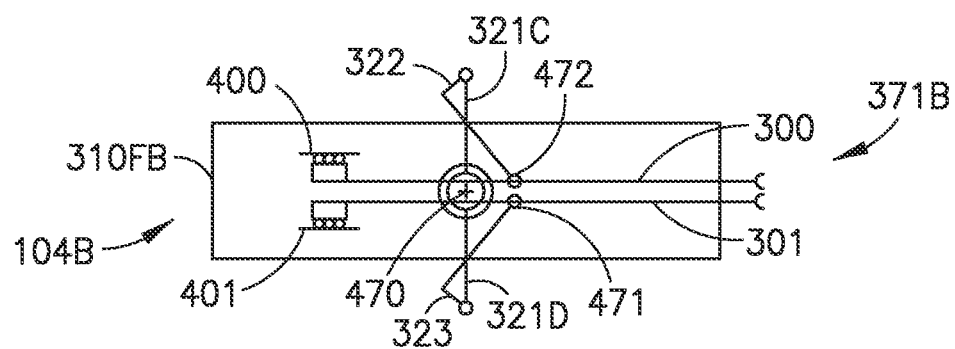

FIG. 5C illustrates a transport apparatus 104B in accordance with an aspect of the disclosed embodiment. The transport apparatus 104B may be substantially similar to those described herein. In this aspect the base member 310FB is coupled to a drive shaft 280S of the drive 200 in a manner substantially similar to that described above. A first crank member 321C may be coupled to a second drive shaft 280AS of the drive 200 while a second crank member 321D is coupled to a third drive shaft 280BS of the drive 200. Here the crank members may extend from the axis 470 towards opposite lateral (e.g. substantially transverse to the axis of extension/retraction) sides of the base member 301FB when the arms 300, 301 are in a fully retracted position. In this aspect the extension/retraction of arm 300 is uncoupled from the extension/retraction of arm 301 so that each arm independently extends in the same direction (compared to the opposing extension directions illustrated with respect to transport apparatuses 104, 104A). As may be realized, extension of the arms 300, 301 in the same direction may allow for a fast swapping of substrate from a substrate holding station, such as processing stations 130. In other aspects the arms 300, 301 may extend in opposing directions. In this example, each arm 300, 301 is independently operable so that both arms may extend at the same time or at different times. For example, drive link 322 may couple crank member 321C to arm 300 so that as the second drive shaft 280AS rotates, arm 300 is driven to extend or retract by the crank member 321C and drive link 322 in a manner substantially similar to that described above. Similarly, drive link 323 may couple crank member 321D to arm 301 so that as the third drive shaft 280BS rotates, arm 301 is driven to extend or retract by the crank member 321D and drive link 323 in a manner substantially similar to that described above. In other aspects a common crank member may drive the drive links 322, 323 in a manner similar to that described herein. In this aspect an independent degree of freedom for each arm along the axis of extension/retraction R and rotation of the arms as a unit in the direction of arrow T about common axis 470 is achieved with a three drive axis drive section.

Figure 5D:
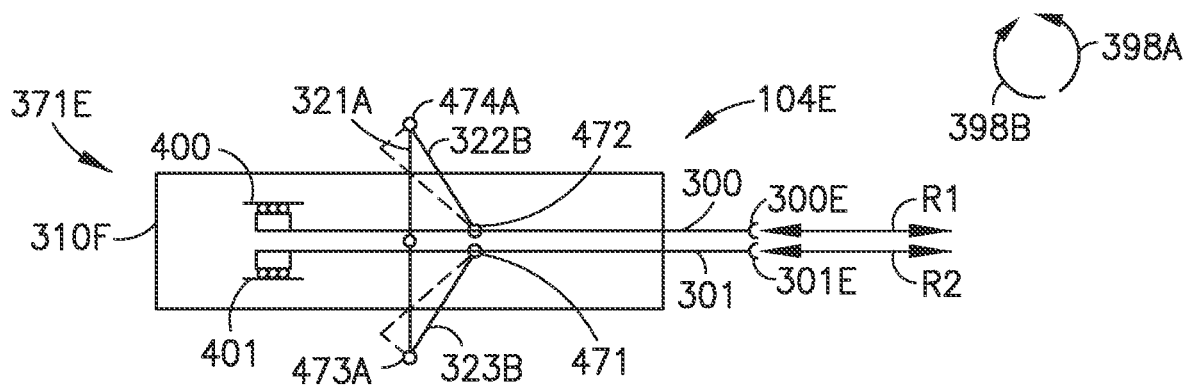

FIG. 5D illustrates a transport apparatus 104E in accordance with an aspect of the disclosed embodiment. The transport apparatus 104E may be substantially similar to those described herein. In this aspect the arms 300, 301 are arranged to extend in the same direction as described with respect to FIG. 5C. In other aspects the arms 300, 301 may extend in opposing directions. In this aspect the extension and retraction of the arms 300, 301 is coupled in a manner substantially similar to that described above with respect to FIG. 5A so that an independent degree of freedom along the axis of extension/retraction R for each arm and rotation of the arms as a unit in the direction of arrow T about common axis 470 is achieved with a two drive axis drive section. For example, a drive link 322B may be pivotally coupled at pivot axis 474A to a distal end of the common crank member 321 for coupling the arm 300 to the crank member 321A in a manner substantially similar to that described above. A drive link 323B may be pivotally coupled to the opposite distal end of the common crank member 321A for coupling the arm 301 to the crank member 321A in a manner substantially similar to that described above. In other aspects each drive link may be coupled to an independently rotatable crank member for uncoupled operation of each arm 300, 301 in a manner substantially similar to that described herein so that an independent degree of freedom for each arm along the axis of extension/retraction R and rotation of the arms as a unit in the direction of arrow T about common axis 470 is achieved with a three drive axis drive section. In this aspect the drive links 322B, 323B may be substantially straight rigid links that extend from the crank member 321A to the respective arm 300, 301 in a direction that is generally towards the respective end effector 300E, 301E. The transport apparatus 104E may operate in a manner substantially similar to that described above such that as crank member 321A rotates in the direction of arrow 398A drive link 323B pushes arm 301 to extend along axis R2 while arm 300 remains substantially stationary and/or is retracted from an extended position. As crank member 321A rotates in the direction of arrow 398B drive link 322B pushes arm 300 to extend along axis R1 while arm 301 remains substantially stationary and/or is retracted from an extended position.

Figure 5E:
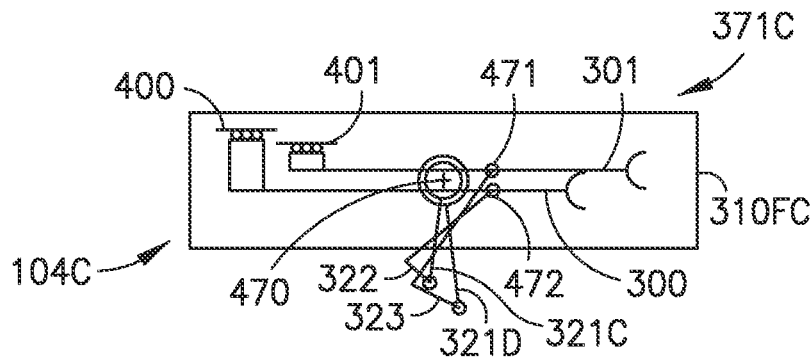

FIG. 5E illustrates a transport apparatus 104C in accordance with an aspect of the disclosed embodiment. The transport apparatus 104C may be substantially similar to those described herein. In this aspect the base member 310FC is coupled to a drive shaft 280S of the drive 200 in a manner substantially similar to that described above. A first crank member 321C may be coupled to a second drive shaft 280AS of the drive 200 while a second crank member 321D is coupled to a third drive shaft 280BS of the drive 200. Here the crank members may extend from the axis 470 towards a common lateral (e.g. substantially transverse to the axis of extension/retraction) side of the base member 301FC when the arms 300, 301 are in a fully retracted position. In this aspect the extension/retraction of arm 300 is uncoupled from the extension/retraction of arm 301 so that each arm independently extends in the same direction (compared to the opposing extension directions illustrated with respect to transport apparatuses 104, 104A). In other aspects the arms 300, 301 may extend in opposing directions. In this aspect an independent degree of freedom for each arm along the axis of extension/retraction R and rotation of the arms as a unit in the direction of arrow T about common axis 470 is achieved with a three drive axis drive section. In this example, each arm 300, 301 is independently operable so that both arms may extend at the same time or at different times. For example, drive link 322 may couple crank member 321C to arm 300 so that as the second drive shaft 280AS rotates, arm 300 is driven to extend or retract by the crank member 321C and drive link 322 in a manner substantially similar to that described above. Similarly, drive link 323 may couple crank member 321D to arm 301 so that as the third drive shaft 280BS rotates, arm 301 is driven to extend or retract by the crank member 321D and drive link 323 in a manner substantially similar to that described above.

Referring now to FIG. 5A (see also FIGS. 6A and 9), the transport apparatus includes at least one drive section 200 and at least one transfer arm 5210, 5211, 5212, 5213. Suitable examples of transport apparatus can be found in, for example, U.S. application Ser. No. 14/568,742 entitled "Substrate Transport Apparatus" and filed on Dec. 12, 2014; Ser. No. 15/103,268 entitled "Processing Apparatus" and having a Patent Cooperation Treaty filing date of Oct. 16, 2014; and Ser. No. 15/110,130 entitled "Substrate Transport Apparatus" and having a Patent Cooperation Treaty filing date of Jan. 16, 2015, the disclosures of which are incorporated by reference herein in their entireties. The at least one drive section 200 includes a frame 200F that houses one or more of a Z axis drive 270 and a rotational drive section 282. An interior 200FI of the frame 200F may be sealed in any suitable manner, such as described in U.S. patent application Ser. No. 14/568,742, previously incorporated by reference herein in its entirety. In one aspect the Z axis drive may be any suitable drive configured to move the at least one transfer arm 5210, 5211, 5212, 5213 along the Z axis (see FIG. 7A). The Z axis drive may be a screw type drive but in other aspects the drive may be any suitable linear drive such as a linear actuator, piezo motor, etc. The rotational drive section 282 may be configured as any suitable drive section such as, for example, a harmonic drive section, where a drive motor(s) of the drive section 282 is housed in a manner substantially similar to that described in U.S. Pat. Nos. 6,845,250; 5,899,658; 5,813,823; and 5,720,590, the disclosures of which are incorporated by reference herein in their entireties. As may be realized, the rotational drive section 282 may be mounted to the Z-axis drive 270 so that the Z-axis drive moves the rotational drive section 282 and the arms 210, 211, 212, 213 along the Z axis.

Figure 6A:
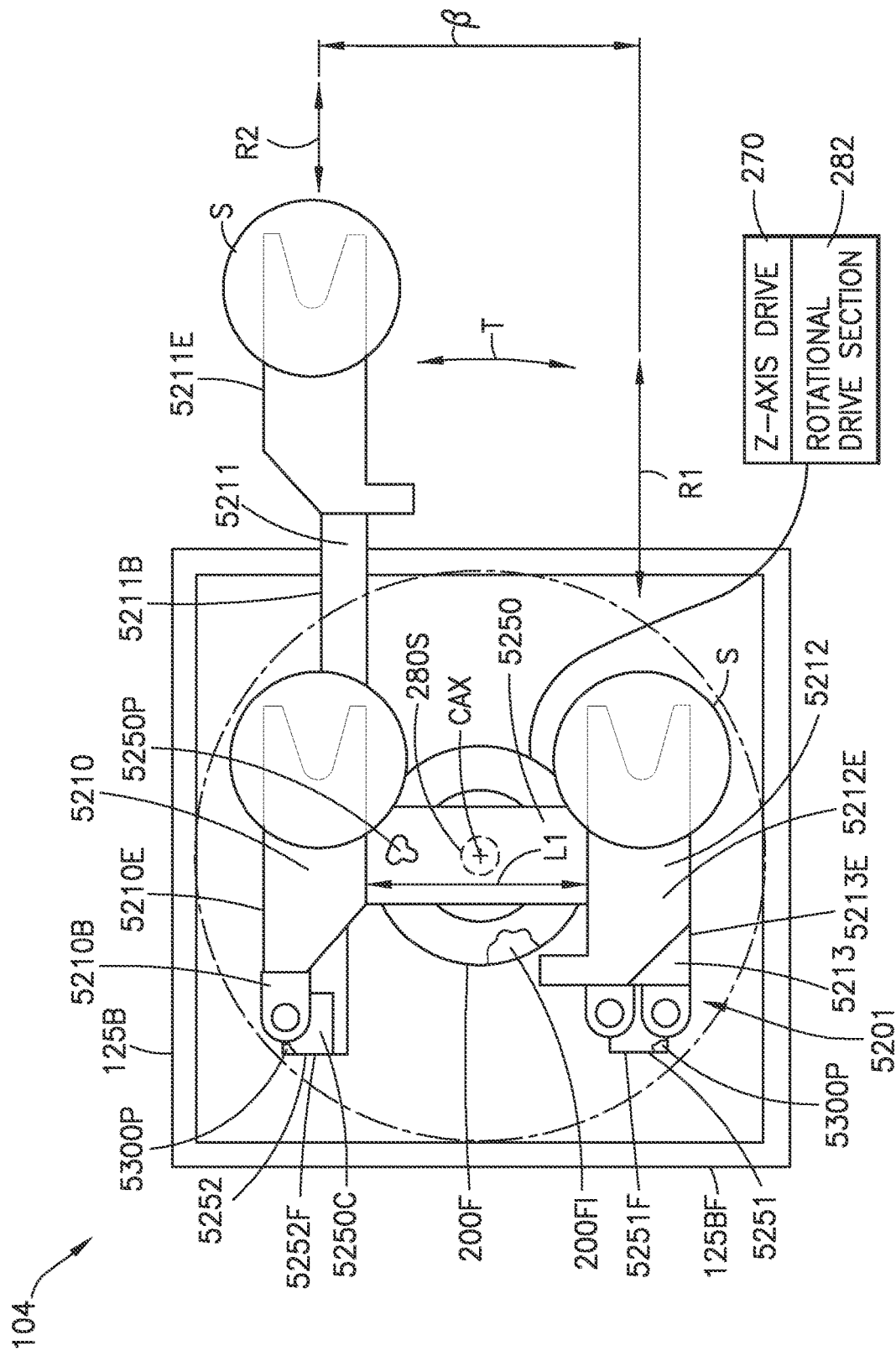
Figure 6B:
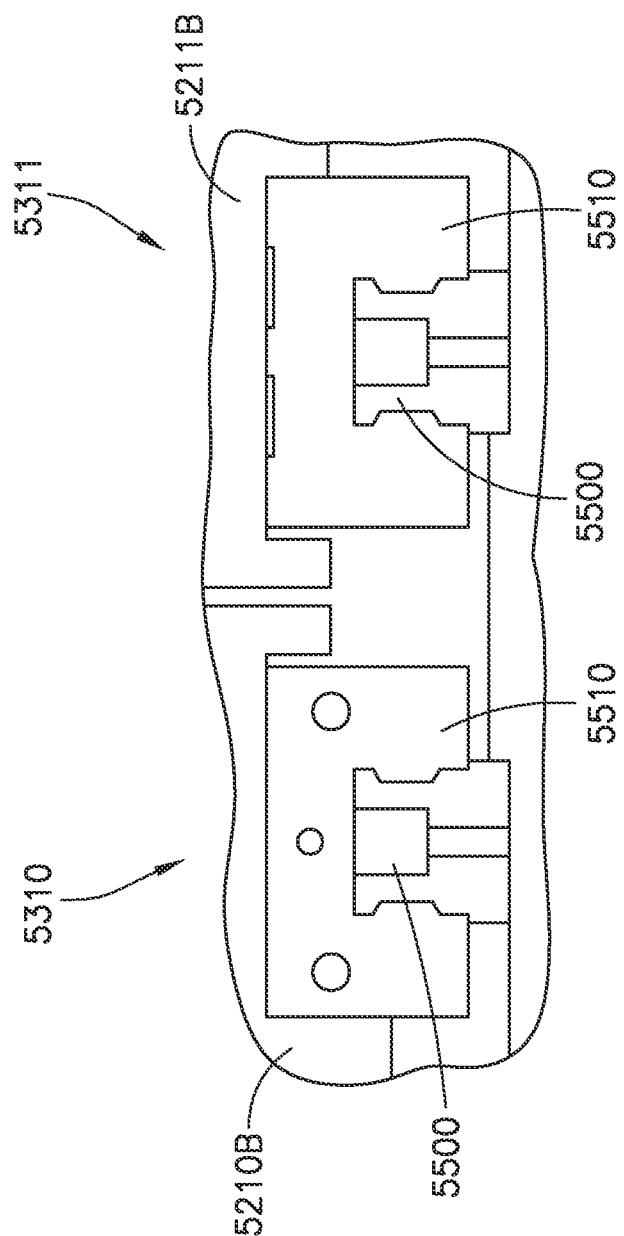

Referring to FIG. 6A, in one aspect a drive shaft 280S of the rotational drive section 282 may be coupled to another drive section 5201 for rotating the other drive section 5201 in the direction of arrow T about a common axis CAX that may be common to each of the at least one transfer arm 210, 5211, 5212, 5213. Here the drive section 5201 may include a base member 5250 and at least one drive portion 5251, 5252. In this aspect there are two drive portions 5251, 5252 but in other aspects any suitable number of drive portions may be provided. The base member 5250 includes a frame that forms an interior chamber 5250P. Each drive portion 5251, 5252 also includes a frame 5251F, 5252F that forms an interior chamber 5300P that is in sealed communication with the interior chamber 5250P of the base member 5250. As may be realized, each drive portion 5251, 5252 may include any suitable access opening that may be sealed by, for example, any suitable cover 5250C. As can be seen in FIG. 6A the base member 5250 may include a first and second ends such that a drive portion 5251, 5252 is sealingly coupled to a respective one of the ends. The drive portions may be arranged at any suitable angle β relative to one another so that an extension/retraction axis R1, R2 of the arm(s) mounted thereon are capable of extending through ports of the transfer chambers 125A, 125B, 125C, 125D in which the arm(s) are located. For example, in one aspect the angle β (which may correspond to an angle between the extension/retraction axes R1, R2 of the drive portions 5251, 5252) may be substantially the same as or equal to the angle α of the facets 100F1-100F8 of transfer chamber 125A (FIG. 1A). In other aspects the angle β may be about 0° so that the axes of extension/retraction R1, R2 of the drive portions (and the arm(s) mounted thereon) are substantially parallel to one another for extending through the side-by-side ports of, e.g., transfer chambers 125B (FIG. 1B), 125C (FIG. 1C) and 125D (FIG. 1D). In still other aspects the angle β may be adjustable (either manually or through automation, as described in, for example, U.S. patent application Ser. No. 14/568,742 previously incorporated by reference herein in its entirety) so that the axes of extension/retraction R1, R2 of the drive portion 5251, 5252 may have any suitable angle β relative to one another. For example, the angle β may be adjusted between an angle of 0° and θ for extending through ports of the transfer chamber 125C (FIG. 1C) and/or for automatic workpiece centering as described, in for example, U.S. patent application Ser. No. 14/568,742 previously incorporated by reference herein in its entirety. In yet other aspects the angle β and/or spacing between the drive portions may be fixed such that the arms of the transport apparatus 104 may extend through the ports of the transfer modules having angled facets through a rotation of the common drive axes CAX and independent extension or operation of each drive portion 5251, 5252. The base member 5250 may have any suitable length L1 so that the axes of extension and retraction R1, R2 of each drive portion 5251, 5252 are a fixed distance apart where the fixed distance may correspond or otherwise match requirements (e.g. the distance between ports of a module in which the transport apparatus 104 is located) imposed by the system tool configuration.

Still referring to FIG. 6A the transfer arms 5210-5213 will be described with respect to drive portion 5252 in accordance with aspects of the present disclosure. In this aspect the transfer arms 5210-5213 have a telescoping configuration but in other aspects the transfer arms 5210-5213 may have any suitable configuration. Also in this aspect each drive portion 5251, 5252 includes two telescoping arms 5210-5213 but in other aspects any suitable number of transfer arms may be provided on each drive portion 5251, 5252. In this aspect each transfer arm 5210-5213 includes a base member 5210B, 5211B and an end effector 5210E, 5211E (see also end effectors 5212E, 5213E of transfer arms 5212, 5213) movably coupled to a respective base member 5210B, 5211B. Each base member 5210B, 5211B may have an interior in which any suitable transmission may be disposed for driving the end effector along the axis of extension/retraction R1, R2. The interior of the base members may be exposed to the environment in which the transfer arms operate but may include any suitable seals, such as labyrinth seals, for preventing any particles from entering the environment or contacting the workpieces transported within the environment. It is noted that each end effector described herein includes an end effector seating plane SP (FIG. 4) in which a substrate is located when being held by the end effector. Base member 5210B may be movably coupled to the drive portion 5252 through one or more linear bearing(s) 310 of the drive portion 5252 so as to be movable relative to the drive portion 5252. Base member 5211B may be coupled to the drive portion 5252 through one or more linear bearing(s) 311 so as to be movable relative to the drive portion 5252. The linear bearings 5310, 5311 may each include a respective bearing rail 5500 and a bearing case 510 (e.g., to which bearing case the respective base member 5210B, 5211B is mounted) that rides along the bearing rail 5500 as will be described in greater detail below. Each arm 5210, 5211 has a degree of freedom defined by the respective linear bearing, as will be described below, such that the degrees of freedom for each of the transfer arms 5210 and 5211 defined by the linear bearings 5310, 5311 are parallel to one another (e.g. the transfer plane of the end effectors are located one above the other). As may be realized, transfer arms 5212, 5213 have similar parallel degrees of freedom. As may also be realized, the degree of freedom defined by the linear bearing(s) for arm 5211 may be coplanar with the degree of freedom defined by the linear bearing(s) for transfer arm 5212 (e.g. the end effectors of each transfer arm 5211, 5212 are located in the same plane) while the degree of freedom defined by the linear bearing(s) for arm 210 may be coplanar with the degree of freedom defined by the linear bearing(s) for transfer arm 5213 (e.g. the end effectors of each transfer arm 5210, 5213 are located in the same plane).

As noted above, the transfer arms 5210, 5211, 5212, 5213 described herein are illustrated as telescoping arms for exemplary purposes only. However, in other aspects the transfer arms of the transport apparatus 104 may be any suitable transfer arms such as, for example, a linearly sliding arm such as shown in FIGS. 3 and 4.

Figure 6C:
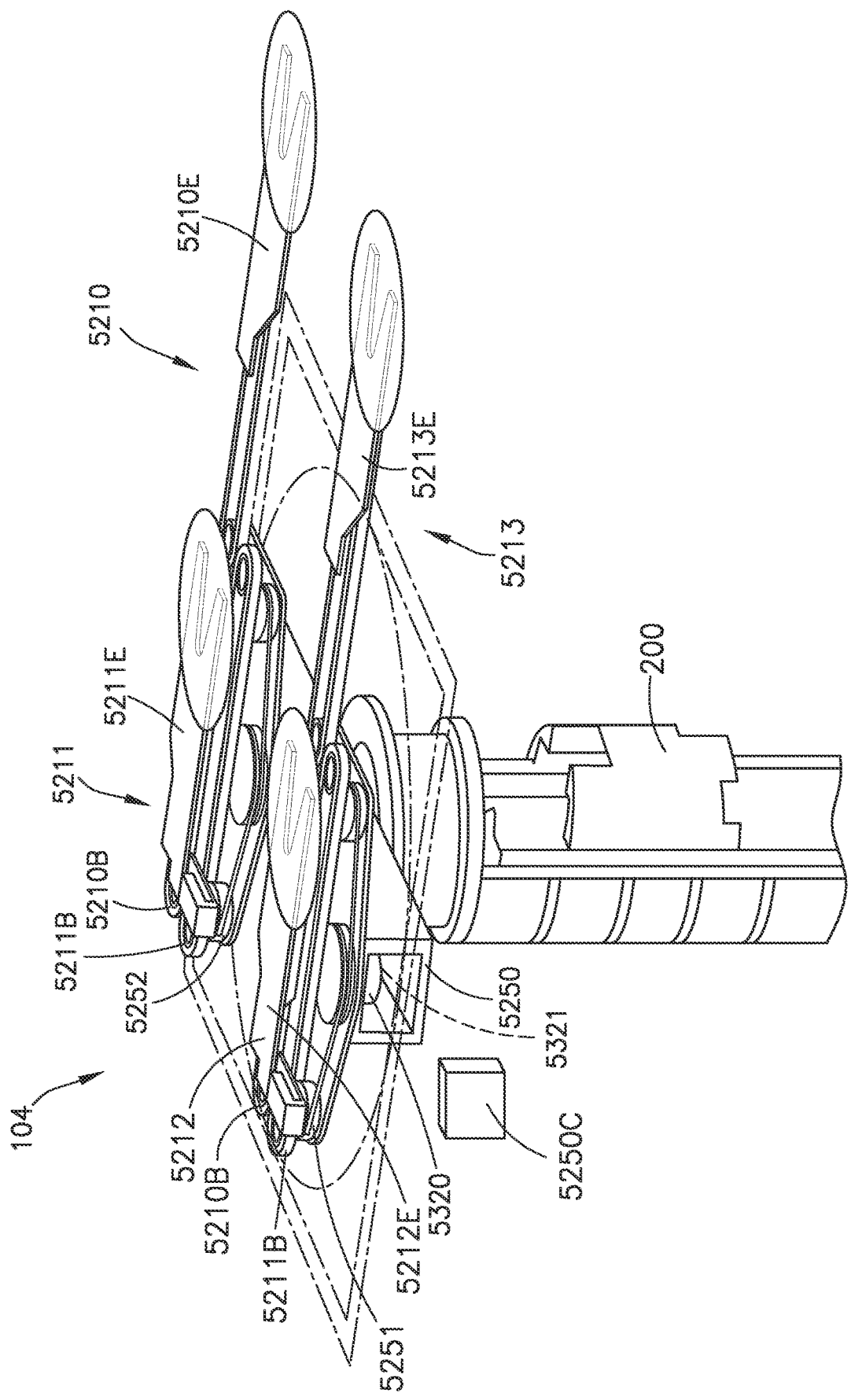
Figure 6E:
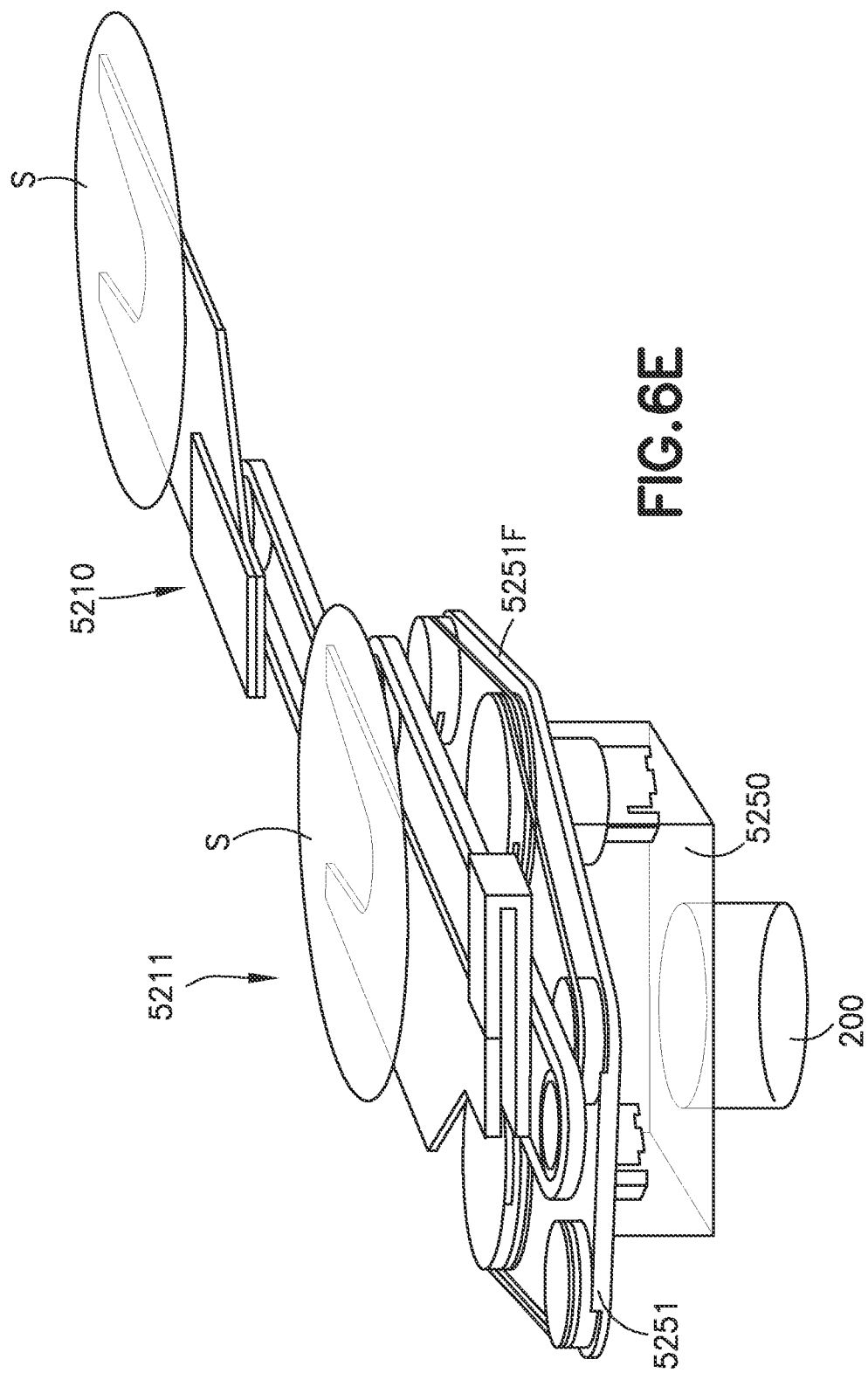

Referring now to FIGS. 6C-6E an arm drive transmission of the transport apparatus 104 is illustrated in accordance with aspects of the disclosed embodiment. In this aspect drive portions 5251, 5252 may include a drive system having pulleys that are substantially parallel with a seating plane SP (FIG. 10) of the end effector 5210E-5213E while the drive motor 5320, 5321 (only drive motors for arms 5212, 5213 are illustrated; however it is understood that arms 5210, 5211 have similar drive motors) for each arm 5210-5213 is located within the base member 5250 (illustrated with cover 5250C removed). Referring to FIG. 6C drive portion 5251 will be described however, it should be understood that drive portion 5252 is substantially similar to drive portion 5251. The drive portion 5251 includes the frame 5251F that may have any suitable size, shape and/or configuration. While the frame 5251F is illustrated as a flat plate for exemplary purposes, in other aspects the frame 5251F may include any suitable covers for housing the drive transmissions such that the covers are configured to substantially prevent any particles generated by the drive transmission from entering the environment in which the arms operate. The frame 5251F may include any suitable rail or guide members similar to those described herein on which the respective base member 5210B, 5211B is movably mounted. Each drive motor 5320, 5321 may include a drive shaft that is coupled to a respective drive pulley 5733A, 5733B (FIG. 6D) for driving a respective belt or band 5740, 5741. As may be realized, any suitable idler pulleys 5734A, 5734B, 5735A, 5735B may be provided and mounted to the frame 5251F for directing the belt or band 5740, 5741 adjacent a respective base member 5210B, 5211B so that the belt or band may be fixedly coupled or anchored to the base member for driving the respective arm 210, 5211 in the manner described above. As may also be realized, the base member 5250 may be suitably sealed, such as with the covers 5250C so that the motors 5320, 5321 are located in a common atmospheric environment with the drive section 200. While two drive portions are shown as being mounted to the base member 5250 in FIG. 6C in other aspects more or less than two drive portions may be mounted to the base member 5250. For example, FIG. 6E illustrates a single drive portion having two arms mounted to the base portion 5250. As may be realized, the single drive portion illustrated in FIG. 5E may be a three axis drive substantially similar to that described above. In one aspect one drive axis of the three axis drive may be coupled to the pulleys for driving extension/retraction of arm 5210, one axis of the three axis drive may be coupled to the frame 5251F for rotating the arms 5210, 5211 as a unit and one axis of the three axis drive may be coupled to pulleys for driving extension/retraction of arm 5211.

Figure 7A:
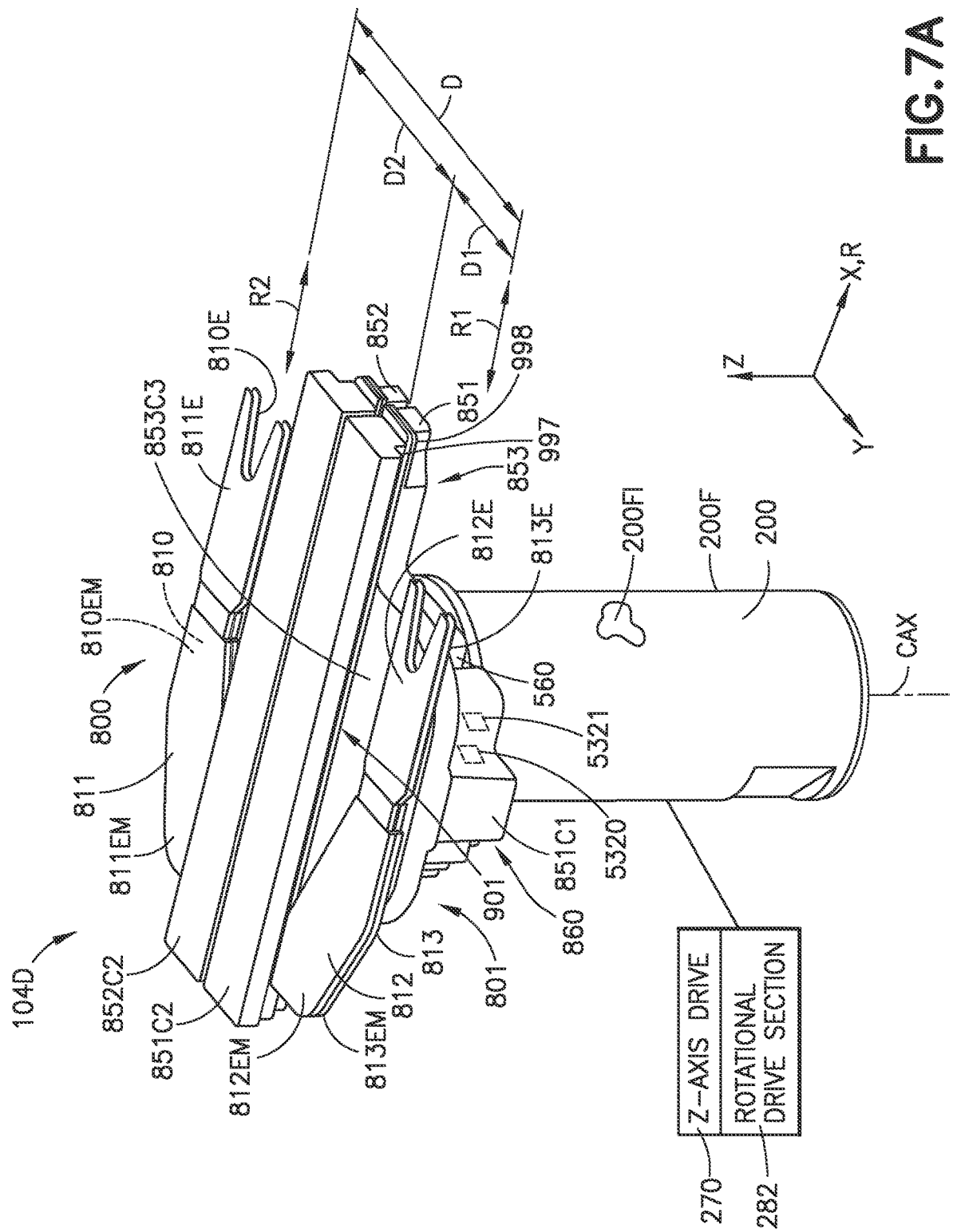

Referring now to FIG. 7A-8F a transport apparatus 104D is illustrated in accordance with aspects of the present disclosure. The transport apparatus 104D may be substantially similar to transport apparatus 104 described above. In this aspect the drive portions 800, 801 are configured with single stage linearly sliding arms 810-813. In this aspect each drive portion 800, 801 includes a frame 851, 852 having a sealed motor section 860 and a transmission section 853. The drive portions 800, 801 will be described with respect to drive portion 801 but is should be understood that drive portion 800 is substantially similar and may be opposite in hand as shown in FIG. 7A. The sealed motor section 860 may include housing or cover 851C1 that is fixedly mounted to the frame 851 and configured to house any suitable motor(s) 320, 321. The housing 851C1 may be sealed to the frame with any suitable seal member so that the motors 320, 321 are disposed within an atmospheric environment that is common to the atmospheric environment within drive section 200. In a manner substantially similar to that described above, the housing 851C1 may include an aperture or opening configured to mount the housing 851C1 to a sealed support member 560 (which may be substantially similar to base member 250 described above) in any suitable manner. As may be realized the housing 851C1 may be constructed of any suitable material and be configured to support (e.g. when coupled to the sealed support member 560) the frame 851, drive components, the arms 812, 813 and any workpieces carried by the arms 812, 813. The motors 5320, 5321 may be mounted to the frame 851 in any suitable manner so that, for example, the ferrofluidic seal of the respective motors 5320, 5321 seals the respective openings in the frame 851 through which respective drive shafts extend for maintaining the sealed atmosphere within the sealed motor section 860.

One or more linear bearings 898, 899 (see FIG. 7B) may be mounted to the frame 851 within the transmission section 853 in any suitable manner so as to define a degree of freedom for an independent drive axis of at least one arm 812, 813. In this aspect there are two linear bearings 930, 931 disposed along the X axis or axis of extension/retraction R of the arms 812, 813 (e.g., in a manner substantially similar to that described herein with respect to FIGS. 6A and 6B) however, in other aspects any suitable number of linear bearings may be provided for guiding any suitable number of arms. A carrier or arm support 940, 941 (e.g., bearing case 510—see FIG. 7B) may be mounted to a respective linear bearing 930, 931 so as to be supported by the bearing rail (e.g., bearing rail 5500—see FIG. 6B) and movable along the X axis (e.g. along axis of extension/retraction R). In this aspect carrier 940 is movably mounted to guide rail 930 and carrier 941 is movably mounted to guide rail 931, where linear bearing 930 may be substantially similar to linear bearing 5310 and linear bearing 931 may be substantially similar to linear bearing 5311. Each carrier 940, 941 (e.g., bearing case 510) may include an arm mounting portion 940M, 941M to which a respective arm 812, 813 is fixedly attached. The carriers 940, 941 may be configured in any suitable manner so that one carrier 940, 941 is allowed to pass by another one of the carriers 940, 941 along the axis of extension/retraction R (in this aspect the linear rails 930, 931 and their respective bearing cases are disposed side by side but in other aspects, the linear rails and their respective bearing cases may be disposed one above the other). Carrier 940 may be coupled to motor 320 and carrier 941 may be coupled to motor 321 (or vice versa) through any suitable respective drive transmissions, such as the belt/band and pulley transmissions described in United States patent application 14/568,742 previously incorporated by reference herein in its entirety (see also the belt and pulley transmission illustrated in FIG. 9B).

As seen best in FIGS. 8A-8D, in one aspect, drive pulley 921 may be coupled to shaft 5370 of motor 320 so that as shaft 5370 rotates the drive pulley 921 rotates with it. Idler pulleys 910A, 910B may be disposed substantially at opposite ends of the guide rails 930, 931 and be configured so that one or more belts or bands may be at least partially wrapped around the idler pulleys 910A, 910B. As can be seen in FIGS. 8E and 8F, one or more belts or bands 940B1, 940B2 may couple the drive pulleys 920, 921 to the respective carriers 940, 941. For example, referring to drive pulley 921 and carrier 940 a first band/belt 940B1 may be fixedly coupled to pulley 921 at one end BE1 of the band/belt 940B1. The band/belt 940B1 may at least partially wrap around idler pulley 910A and extend to the carrier 940 such that the other opposite end BE2 of the band/belt 940B1 is fixedly coupled to the carrier 940. A second band/belt 940B2 may be fixedly coupled to pulley 921 at one end BE3 of the band/belt 940B2. The band/belt 940B2 may at least partially wrap around idler pulley 910B and extend to the carrier 940 (e.g. from a direction opposite that of the first band/belt 940B1 so that one of the first and second band/belt 940B1, 940B2 pulls on the carrier while the other band/belt 940B1, 940B2 pushes on the carrier) such that the other opposite end BE4 of the band/belt 940B2 is fixedly coupled to the carrier 940. Similarly, with respect to carrier 941, a first band/belt 941B1 may be fixedly coupled to pulley 920 at one end of the band/belt 941B1. The band/belt 941B1 may at least partially wrap around idler pulley 910A and extend to the carrier 941 such that the other opposite end of the band/belt 941B1 is fixedly coupled to the carrier 941. A second band/belt 941B2 may be fixedly coupled to pulley 920 at one end of the band/belt 941B2. The band/belt 941B2 may at least partially wrap around idler pulley 910B and extend to the carrier 941 (e.g. from a direction opposite that of the first band/belt 941B1 so that one of the first and second band/belt 941B1, 941B2 pulls on the carrier while the other band/belt 941B1, 941B2 pushes on the carrier) such that the other opposite end of the band/belt 941B2 is fixedly coupled to the carrier 941. In one aspect the transmission section 853 may be exposed to an atmosphere in which the arms 812, 813 operate.

Figure 4A:
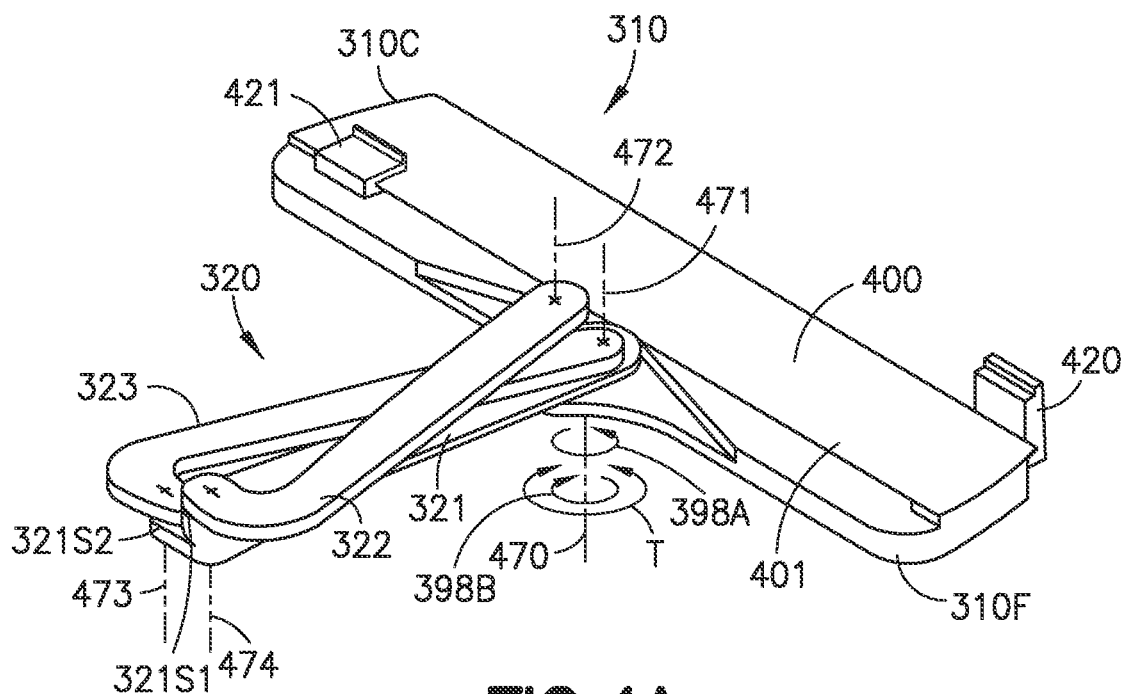
FIGS. 4A-4E are schematic illustrations of portions of the transport apparatus of FIGS. 3A-3B in accordance with aspects of the disclosed embodiment.
Figure 4B:
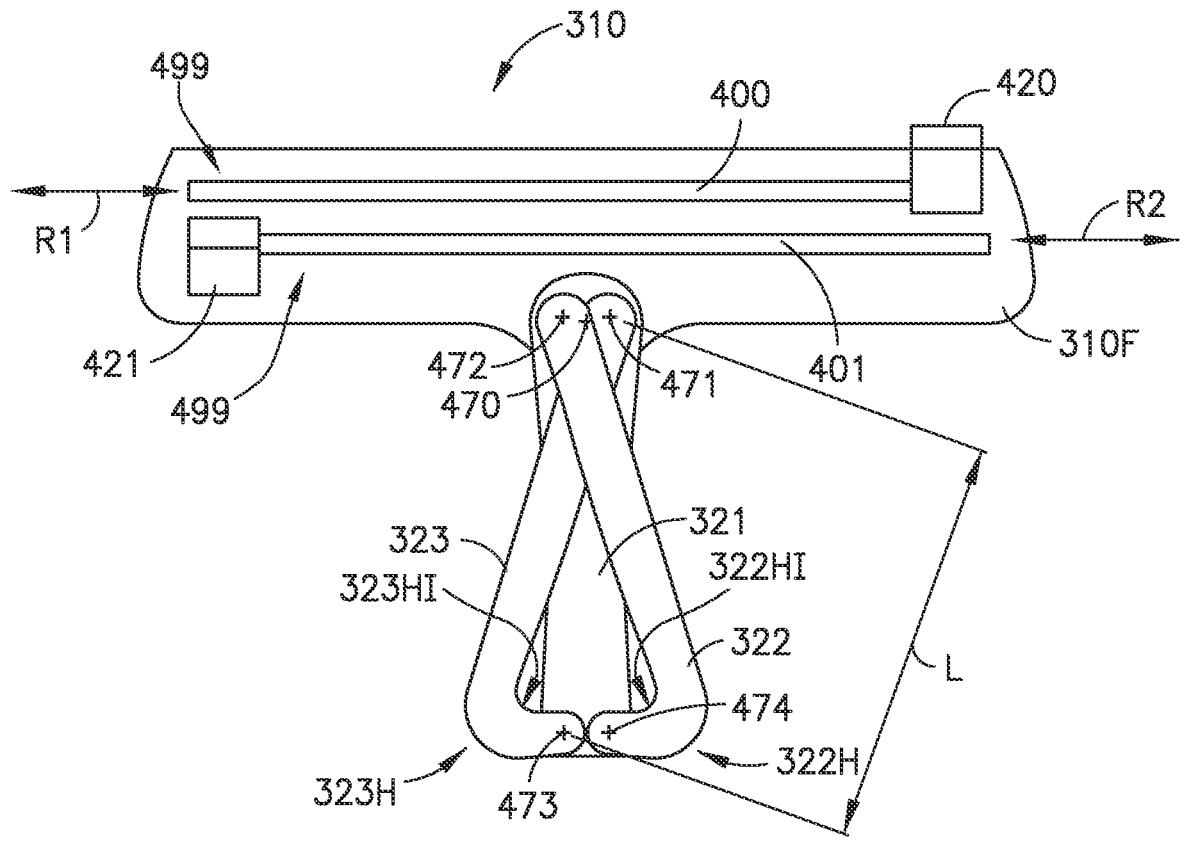
Figure 4C:
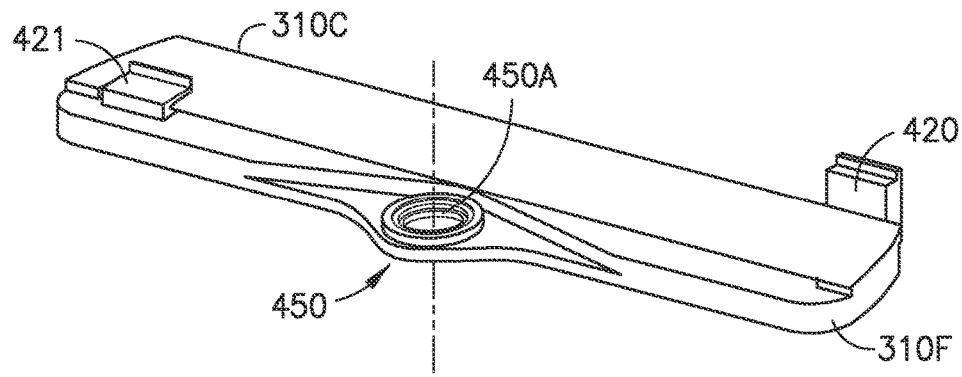
Figure 4D:
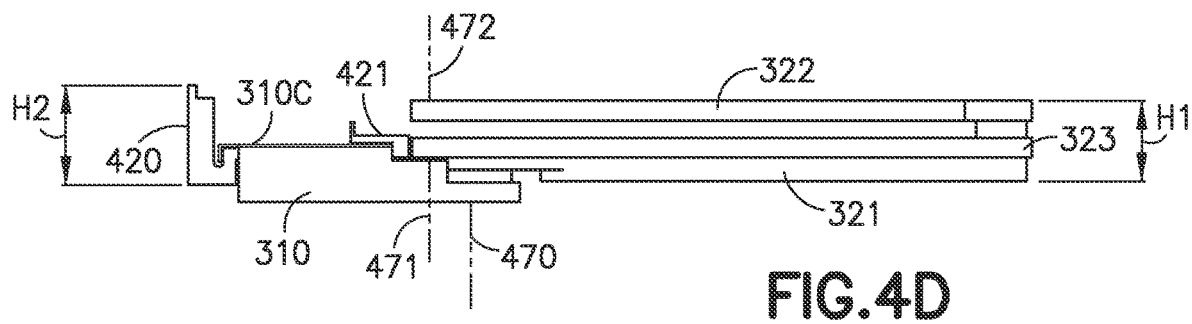
Figure 4E:
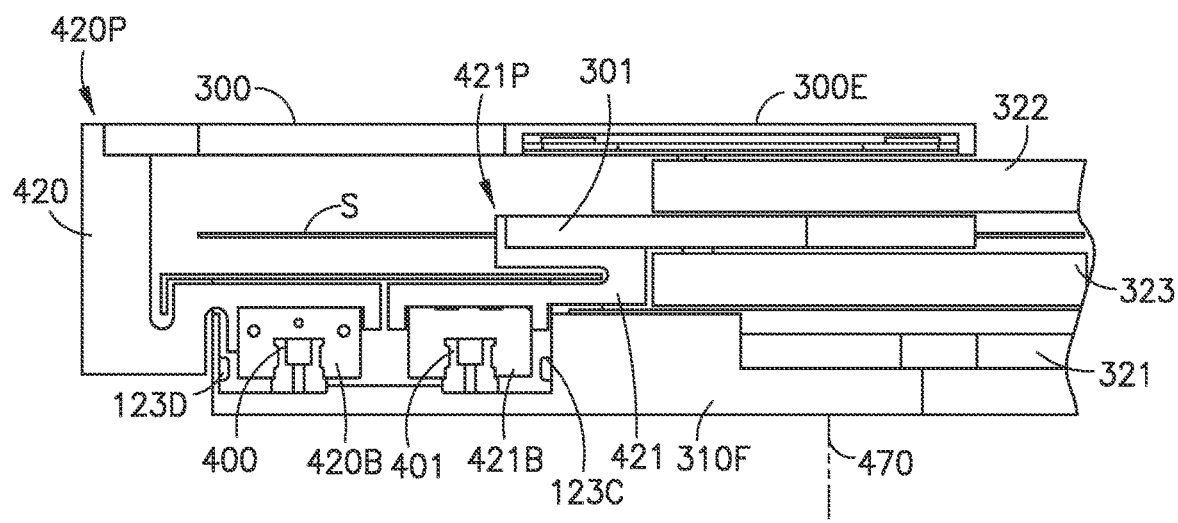
Figure 5F:
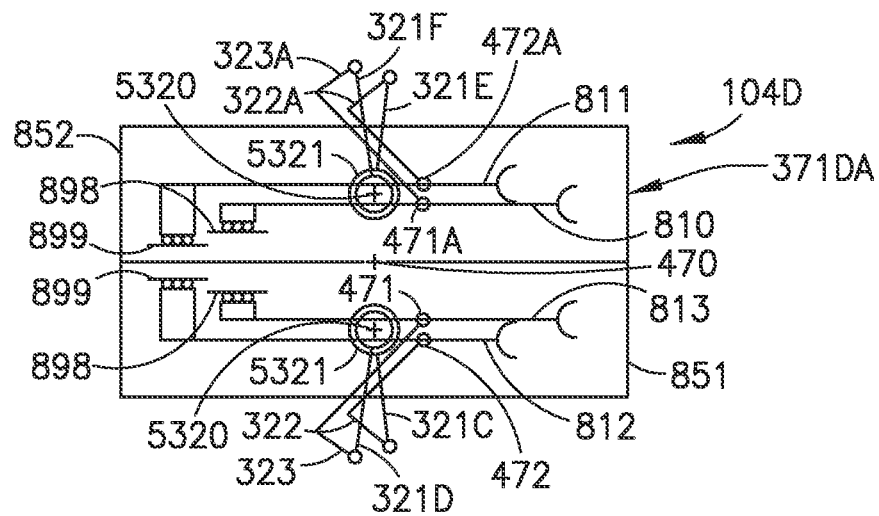

Referring now to FIGS. 5F, 7A and 7B the arms 810-813 of the transport apparatus 104D may be extended and retracted by rigid links substantially similar to those described above with respect to FIGS. 4A-6E. In this aspect at least a 5 axis drive system may be provided so that each arm 810-813 has an independent degree of freedom along a respective axis of extension/retraction R and for rotation of the arms as a unit about common axis 470/CAX. In other aspects additional drive axes may be provide such as to provide each base member 310F1, 310F2 with an independent Z-axis movement, providing each base member 851, 852 with a common Z-axis movement, pivoting of one or more base members 851, 852 and movement of one or more base members 851, 852 in the direction Y as described herein.

In other aspects the one or more of the carriers may be substantially directly driven, rather than be driven through belts/bands and/or pulleys or rigid links, by any suitable linear motor. For example, in one aspect the transmission section 853 may be sealed from the atmosphere in which the arms 812, 813 such that a common atmospheric environment is shared between the transmission section 853 and the drive section 200. The bearing rails 898, 899 may be disposed outside the transmission section 853 and include the bearing cases 5510 and covers 851C2 including seal portions 997, 998. Each bearing case 5510 may have a magnetic follower attached thereto that is magnetically driven by a magnetic driver through, e.g., a wall or cover of the transmission section 853 via a magnetic coupling between the magnetic follower and magnetic driver in a manner substantially similar to that described in, for example, U.S. Pat. Nos. 7,901,539; 8,293,066; 8,419,341 and U.S. patent application Ser. No. 13/286,186 all of which have been previously incorporated by reference herein in their entireties. In another aspect, each of the bearing cases 5510 may include a magnetic platen that is driven a linear array of motor windings disposed within the sealed atmospheric environment of the transmission section 853 in a manner substantially similar to that described in, for example, U.S. Pat. Nos. 7,575,406; 7,959,395; and 8,651,789 all of which are incorporated by reference herein in their entireties.

In one aspect, each arm 810-813 includes an end effector 810E-813E that is coupled to a respective bearing case 5510 by a substantially rigid arm section or end effector extension member 810EM-813EM. For example, the substantially rigid arm section 810EM-813EM may be fixedly coupled to a respective arm mounting portion 940M, 941M of a respective bearing case 5510 in any suitable manner such as by mechanical fasteners. The end effector 810E-813E may be fixedly coupled to a respective substantially rigid arm section 810EM-813EM in any suitable manner such as by mechanical fasteners. In other aspects, the substantially rigid arm section 810EM-813EM and the respective end effector 810E-813E may have a unitary one piece construction. In still other aspects the substantially rigid arm section 810EM-813EM, the respective end effector 810E-813E and the respective carrier 940, 941 may have a unitary one piece construction.

As can be seen from the above-description each end effector 810E-813E is independently extendable/retractable along a respective axis of extension/retraction R1, R2. In one aspect, one or more drive portion 800, 801 may be independently movable along the Y axis independent of another one of the drive portions 800, 801 so as to change a distance D between axes of extension/retraction R1, R2 relative to each other or to change a distance D1, D2 of one or more axis of extension/retraction relative to the common axis of rotation CAX for automatic workpiece centering and/or independent workpiece placement adjustment for workpiece holding station location variations between the facets of the, for example, the transfer modules 125A, 125B, 125C, 125D in a manner substantially similar to that described in U.S. patent application Ser. No. 14/568,742 previously incorporated herein by reference in its entirety.

Referring to FIG. 9A a transport apparatus is 104F is illustrated in accordance with aspects of the present disclosure. The transport apparatus 104F may be substantially similar to transport apparatus 104 described above. In this aspect dual wafer extensions or end effectors 13310, 13311 are located inside of linear drive chamber, such as the transport chambers 125A, 125B, 125C, 125D, 125E described herein, where the drive section 200 (which in one aspect includes a frame 200F that houses one or more of a Z axis drive 270 and a rotational drive section 282 as described above—see FIGS. 6A and 7A) is positioned outside of the transfer chamber 301.

Referring also to FIGS. 9B and 9C a schematic diagram of an exemplary single linear drive 13400, according to an aspect of the present disclosure is shown. In one aspect, the upper end effector 13310 and the lower end effector 13311 of arm 104F are each driven by a respective single linear drive 13400 to effect independent extension and retraction of each end effector 13310, 13311. In other aspects the end effectors 13310, 13311 are extended and retracted by any suitable drive, such as those described herein, in any suitable manner. As can be seen in FIG. 9B, each end effector is connected to an end effector stage 13411 that supports the end effector 13310, 13311 in any suitable manner. In one aspect the end effector stage 13411 forms a respective portion of end effector 13310, 13311 where the end effector stage is integrally formed with the end effector while in other aspects, the end effector stage is coupled to the end effector 13310, 13311 in any suitable manner. In one aspect, the single linear drive 13400 is an articulated mechanism (e.g. where a duplex linear extension of both the end effector stage and intermediate stage is effected by a single or one degree of freedom drive), whereby the motion of the end effector stage 13411 is amplified, by any suitable transmission, two times that of the intermediate stage 13410, where the intermediate stage 13410 connects the end effector stage 13411 (and hence the end effector 13310, 13311) to the table plate or arm base member 13423 as will be described below. As may be realized, in other aspects the motion of the end effector stage is amplified relative to the intermediate stage 13410 by any suitable amount (e.g. more than two times) or is extended on a 1:1 ratio. In one aspect, the amplification is achieved by moving the intermediate stage 13410 via the belt 13420 which is stretched between two pulleys 13424, 13425 mounted to, for example, opposite ends of the intermediate stage 13410 in any suitable manner. In other aspects, the pulleys 13424, 13425 are mounted at any suitable respective locations of the intermediate stage 13410. This articulation design effects a 1:2 extension/retraction ratio between the motions of the intermediate stage 13410 and the end-effector stage 13411, represented by X and R coordinates respectively. In one aspect, the intermediate stage 13410 is driven by any suitable linear motor 14000. For example, the linear motor 14000 includes a drive portion or stator 13421 and a driven portion 13422. At least the driven portion 13422 of the linear motor 14000 is mounted on the intermediate stage 13410, and hence moves with the intermediate stage 13410. The intermediate stage 13410 glides along the table plate 13423 on, for example, any suitable linear bearing such as, for example, intermediate linear bearing 13401 (having a bearing casing 510 and bearing rail 5500 substantially similar to linear bearings 5310, 5311, 898, 899) which is mounted to the table plate 13423. An end effector linear bearing 13402 (which may be substantially similar to linear bearings 5310, 5311, 898, 899), which is mounted to the intermediate stage 13410, imparts the articulated motion to the end effector stage 13411. The end effector bearing 13402 includes one or more bearing casings 13402B (similar to bearing casing 510) and a rail 13402R (similar to bearing rail 5500) where the one or more bearing casings 13402B ride along the rail 13402R. In one aspect, the end effector bearing 13402 includes two bearing casings 13402B while in other aspects the end effector bearing 13402 includes more than two bearing casings 13402B. As may be realized, the end effector bearing 13402 is substantially similar to the intermediate linear bearing 13401. Any suitable number of linear encoders 15000 is attached to one or more of the intermediate stage 13410 and the end effector stage 13411 to provide position feedback for the motion control of the end effector extension/retraction.

Referring now to FIG. 10 a transport apparatus 104F' is illustrated in extended and retracted configurations in accordance with aspects of the present disclosure. The transport apparatus 104F' is substantially similar to transport apparatus 104F described above and is employed in any one or more of the transport chambers 125A, 125B, 125C, 125D, 125E described herein in a manner substantially similar to that described with respect to transport apparatus 104. Here one end effector 13310 is illustrated for exemplary purposes only and it should be understood that, in other aspects, the transport apparatus 104F' includes any suitable number of end effectors, such as end effectors 13310, 13311. In one aspect, the end effector stage 13411 and end effector 13310 (referred to herein for explanation purposes as the end effector 13310) have a combined length that is greater than the length of the intermediate stage 13410 to form an extension arm having unequal length links or members. In another aspect, the end effector 13310 has a length that is substantially equal to the length of the intermediate stage 13410 to form an extension arm having equal length links or members. In this aspect the center of rotation of the transport apparatus 104F' is substantially coincident with axis CAX, which in one aspect is an axis of rotation of drive section 200, such that the axis CAX is located substantially at a midpoint of the table plate 13423.

Figure 11:
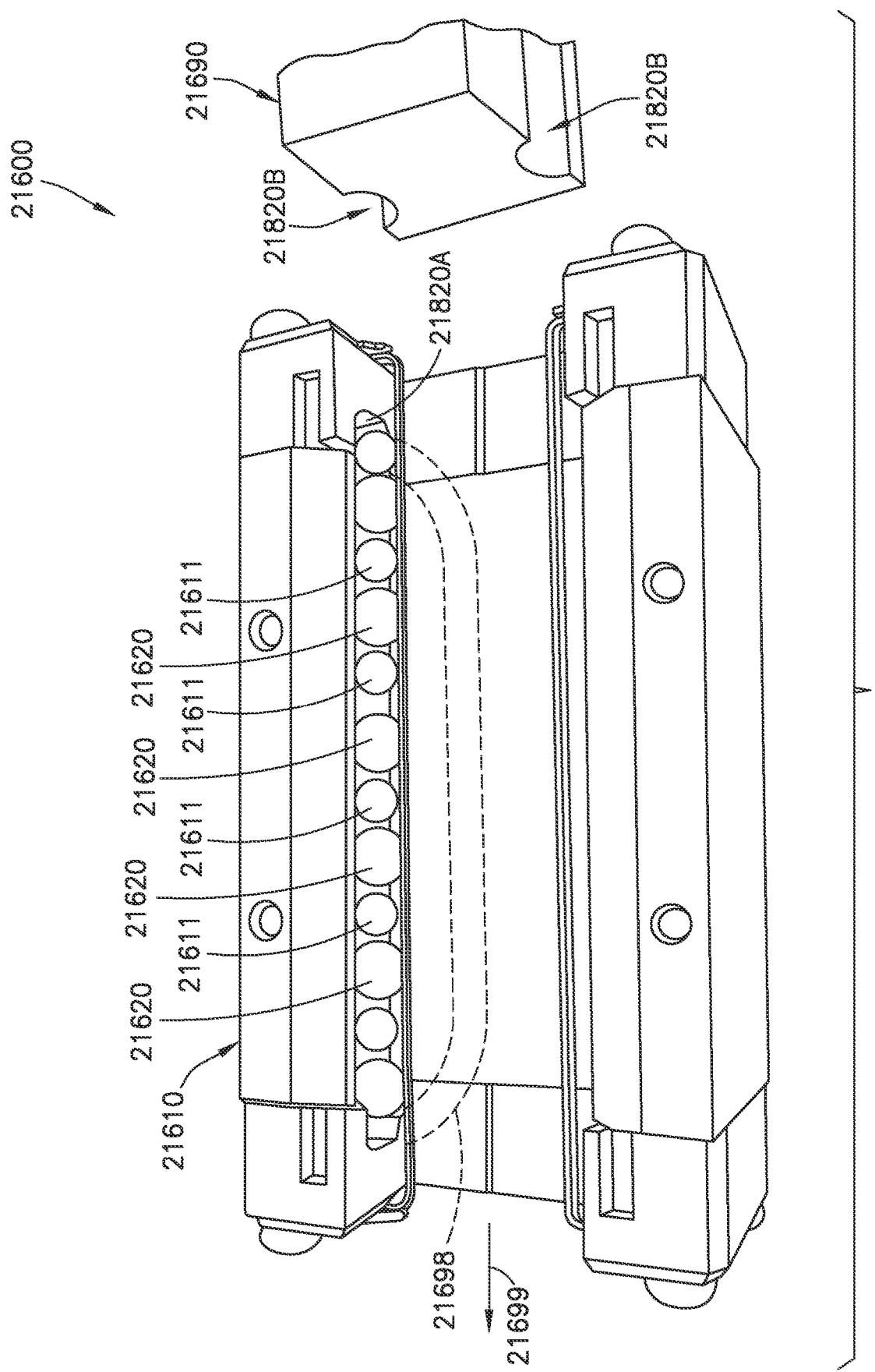
FIG. 11 is a schematic illustration of a bearing of a substrate transport apparatus in accordance with aspects of the present disclosure.
Figure 13A:
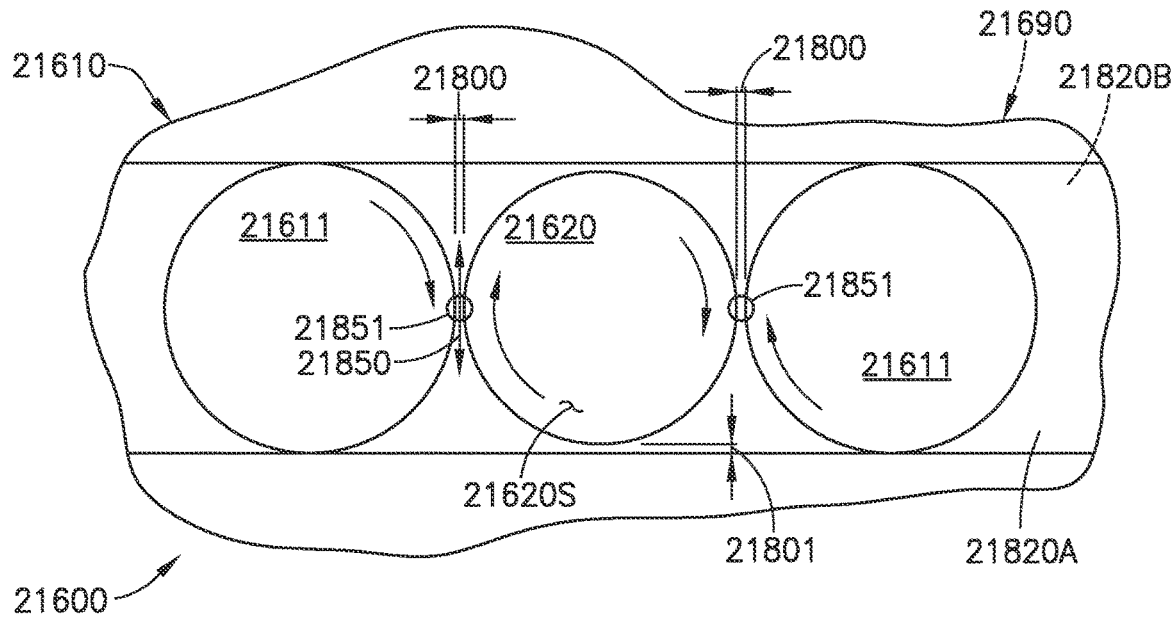
FIG. 13A is a schematic illustration of a portion of the bearing of FIG. 11 in accordance with aspects of the present disclosure.

Referring now to FIGS. 11, 12, and 13A a bearing 21600, that is substantially similar to the linear bearings described above will be described. The bearing 21600 includes a bearing case 21610 (substantially similar to bearing case/carriers described above, e.g., bearing case/carriers 420, 421, 510, 940, 941, 13402B) and a bearing rail 690 (substantially similar to the bearing rails described above, e.g., bearing rails 400, 401, 5500, 930, 931, 13402R). The bearing 21600 is a recirculating ball bearing (illustrated in FIGS. 11, 13A, and 13B) or recirculating roller bearing (see bearing case 21610' and bearing rail 21690' illustrated in FIGS. 13C and 13D). In other aspects, the bearing configuration has rolling elements (e.g. balls, rollers, or needles) intervening between opposing bearing raceways (e.g. bearing casement and base guideway) wherein the rolling elements traverse, due to the rolling motion of the rolling elements, relative to the raceways, or at least one of them, (i.e. the balls/rollers/needles circulate in part in the raceway slot in effecting motion of the raceways relative to each other). Suitable examples of recirculating ball and recirculating roller bearings are available from, for example, IKO International, Inc., Ltd., NSK Ltd., and Schneeberger, except as otherwise described herein. While the bearing 21600 will primarily be described with respect to rolling elements having a spherical/ball configuration for exemplary purposes, the frictional forces of a roller/cylindrical configuration of rolling elements may be reduced, along with effecting the other inventive improvements in bearing performance, in the same manner described herein.

As described above, the bearing 21600 defines a respective guideway (see for example, respective guideways 499 formed by bearing rails 400, 401 and carriers 420, 421 in FIG. 4B—noting that the other bearings described herein for substantially similar guideways) that defines the at least one degree of freedom axis of the respective transport arm. The bearing 21600 includes at least one rolling load bearing element 21611, 21611' disposed in a bearing case 21610, 21610' of the bearing 21600 so as to circulate through the bearing case 21610, 21610' along a bearing rail 21690, 21690', interfacing between a bearing raceway 21820A of the bearing case 21610, 21610' and a bearing raceway 21820B, 21820B' of the bearing rail 21690, 21690' so as to support transport arm loads, imparted by at least one transport arm onto the bearing 21600, 21600', and effecting sliding of the bearing case 21610, 21610' with the at least one transport arm along the bearing rail 21690, 21690'.

Figure 13B:
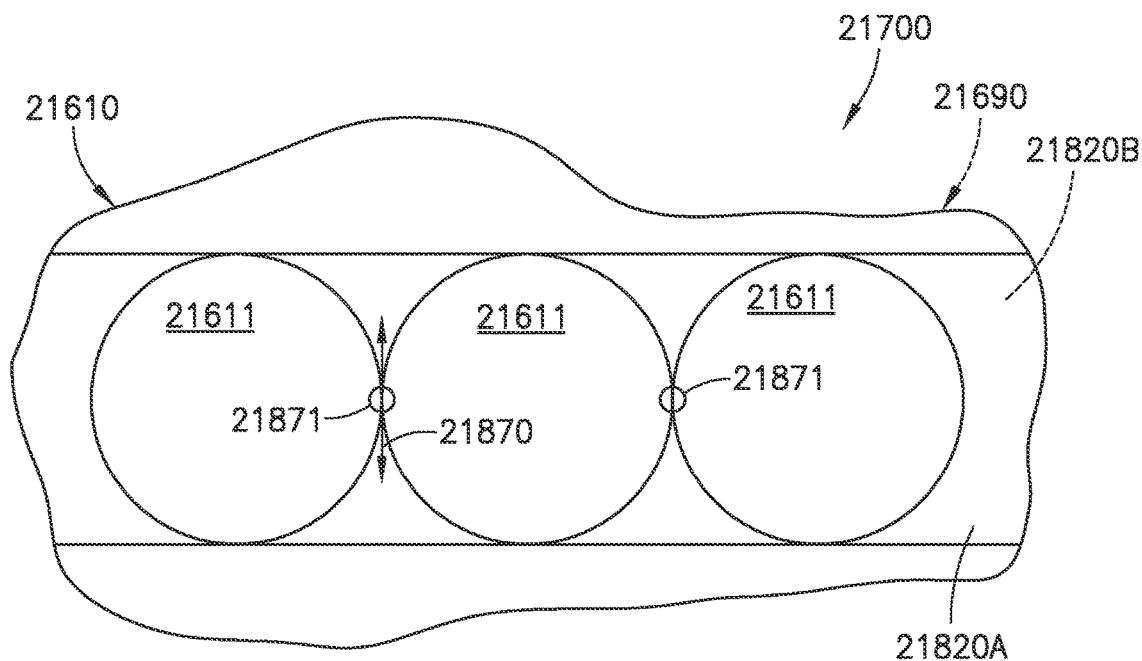
FIG. 13B is a schematic illustration of a conventional bearing.
Figure 13C:
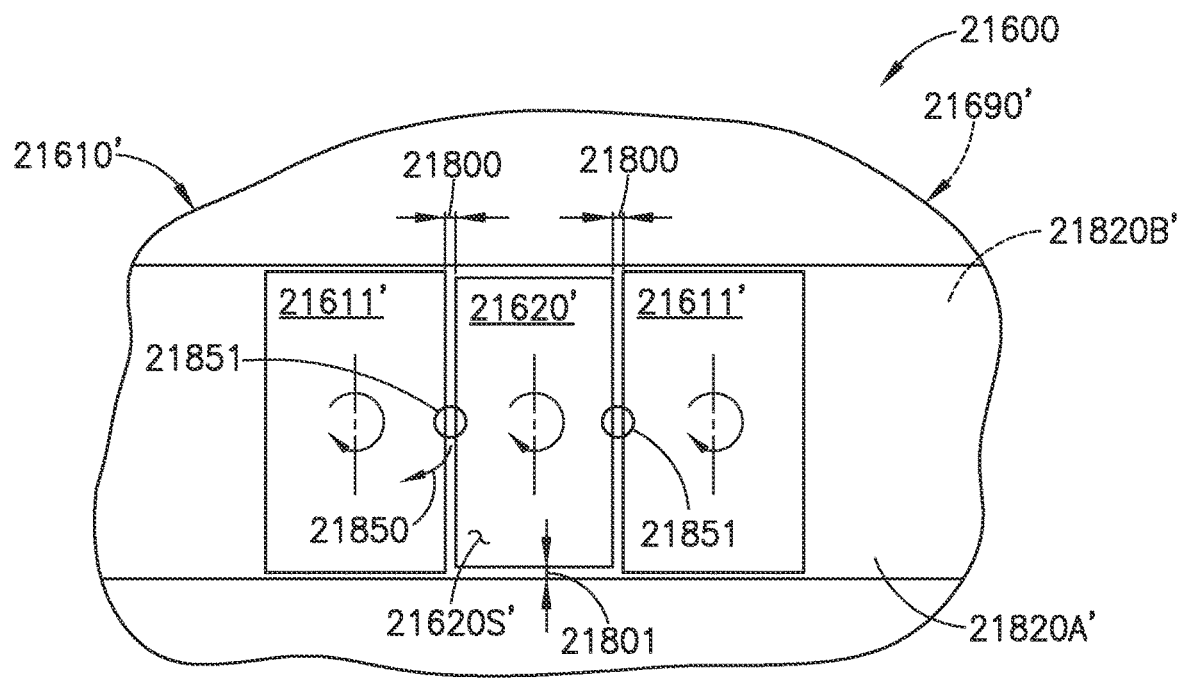
FIG. 13C is a schematic illustration of a portion of bearing in accordance with aspects of the present disclosure.
Figure 13D:
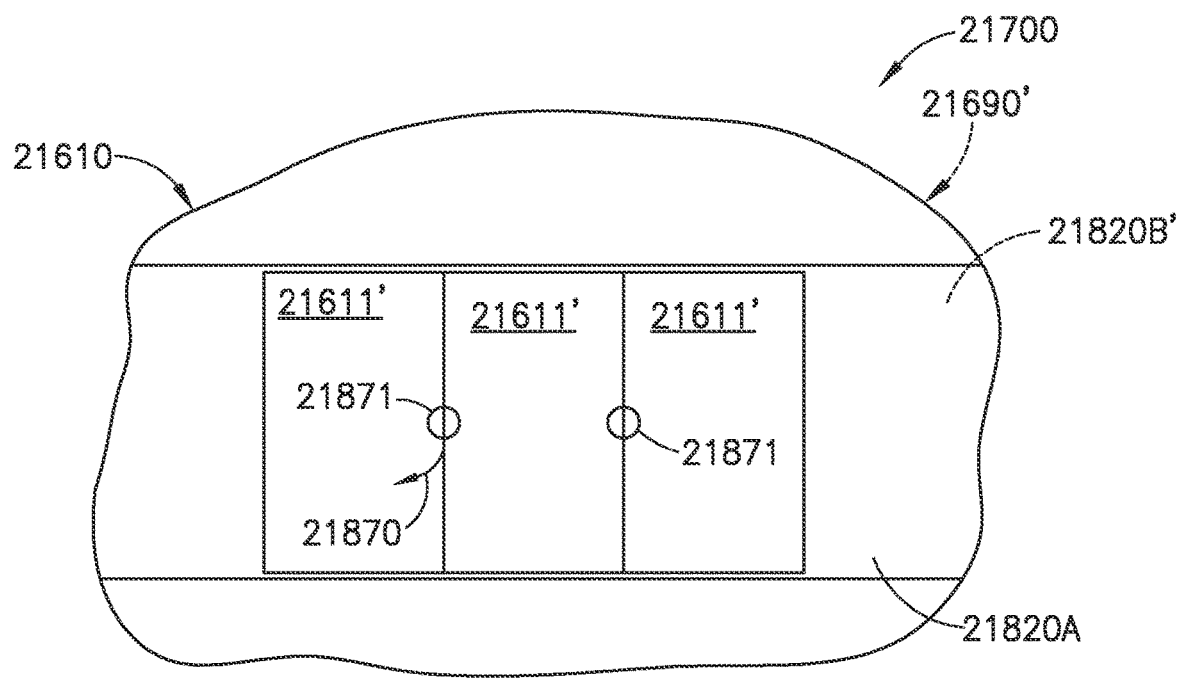
FIG. 13D is a schematic illustration of a conventional bearing.

The bearing 21600, 21600' also includes at least one rolling, substantially non-load bearing, spacer element 21620, 21620' disposed in the bearing case 21610, 21610' alongside, intervening between and spacing each of the rolling load bearing element 21611, 21611' from another of the rolling load bearing element 21611, 21611' as illustrated in FIGS. 11, 13A, 13D. The at least one rolling, substantially non-load bearing, spacer element 21620, 21620' interfaces between each rolling load bearing element 21611, 21611' and the other load bearing element 21611, 21611' so as to buffer relative motion between each rolling load bearing element 21611, 21611' and the other load bearing element 21611, 21611' with the bearing case 21610, 2161' sliding along the bearing rail 21690, 21690'. In one aspect, the rolling load bearing elements 21611 and the rolling, substantially non-load bearing, spacer elements 21620 are each a ball (as shown in FIGS. 11 and 13A). In other aspects, the rolling load bearing elements 21611' and the rolling, substantially non-load bearing, spacer elements 21620' are each a roller (as shown in FIG. 13C).

The at least one rolling, substantially non-load bearing, spacer element 21620, 21620' is configured so that, interfacing between the bearing raceway 21820A, 21820A' and the raceway 21820B, 21820B' of the bearing rail 21690, 21690', the at least one rolling, substantially non-load bearing, spacer element 21620, 21620' is unloaded by the transport arm loads. For example, the at least one rolling, substantially non-load bearing, spacer element 21620, 21620' are configured (as will be described below) so as to provide superficial contact or minimize running wear (e.g., such as by being sized smaller in diameter where ball elements are employed—see FIG. 13A; or in diameter and/or length where roller elements are employed—see FIG. 13C; to provide spaces or gaps 21800, 21801) in the bearing raceway 21820A, 21820A' and/or the rail raceway 21820B, 21820B'; and so that the at least one rolling, substantially non-load bearing, spacer element 21620, 21620' remains unloaded (with the arm loaded to rated capacity and operating in the steady state environment of the tool as described), with the at least one rolling load bearing element 21611, 21611' under load, and freely movable (e.g., to move smoothly/roll within the raceway 21820A, 21820A', 21820B, 21820B') substantially without juddering or bouncing between the bearing raceway 21820A, 21820A' and the rail raceway 21820B, 21820B'. For example, as described above, the rolling, substantially non-load bearing, spacer element 21620 may be undersized, compared to the rolling load bearing elements 21611 so as to form a free running clearance 21801 between the rolling, substantially non-load bearing, spacer element 21620 and a bearing raceway 21820A, 21820B (see FIGS. 11 and 13A) of the bearing 21600, and another free running clearance 21800 between the rolling, substantially non-load bearing, spacer element 21620 and adjacent rolling load bearing elements 21611 as described herein. At temperatures substantially at and above about 260° C. the clearance between the at least one rolling, substantially non-load bearing, spacer element 21620, 21620' is configured to provide a clearance (e.g., the free running clearances 21800, 21801 illustrated in FIGS. 13A and 13C) that correspond to and are matched for the dimensional stability properties of the sacrificial buffer material and resultant tolerances producible by the fabrication of the at least one rolling, substantially non-load bearing, spacer element 21620, 21620'. In alternate aspects the free running clearances 21800, 21801 may be at least about one micron for sacrificial buffer materials with suitable properties to provide tolerances in the micron range and otherwise commensurate with the material properties described herein. In other aspects, the free running clearances 21800, 21801 may be at least about 2 mils (about 0.05 mm) to about 5 mils (about 0.13 mm) (e.g., within the scale of the dimensional tolerance range of the rolling elements of about ±1 mills (less than hundredths) of an inch) between the at least one rolling, substantially non-load bearing, spacer element 21620, 21620' and an adjacent rolling load bearing element(s) 21611, 21611', and/or between at least one rolling, substantially non-load bearing, spacer element 21620, 21620' and the raceways 21820A, 21820A', 21820B, 21820B'.

As can be seen in, e.g., FIGS. 11, 13A, 13C, the at least one rolling, substantially non-load bearing, spacer element 21620, 21620' is disposed in the bearing case 21610, 21610' so as to occupy a rolling load bearing element 21611, 21611' position in the bearing case 21610, 21610' so that the bearing 21600 has a reduced number of the at least one rolling load bearing element 21611, 21611' (e.g., for a predetermined bearing size and bearing capacity) compared to an all rolling load bearing element bearing 21700. As such, the bearing 21600 is a reduced load bearing element bearing (i.e., bearing 21600 with a mix of load bearing rolling elements and non-load bearing rolling elements in place of load bearing rolling elements) for a predetermined load capacity, commensurate with the all load bearing element bearing (i.e., bearing 21700 and its rated load capacity), that provides reduced sliding resistance force commensurate with the reduced load bearing element bearing with reduced vibration response commensurate to the all rolling load bearing element bearing.

The bearing case 21610, 21610' is configured to recycle/recirculate the rolling load bearing elements 21611, 21611' and the rolling, substantially non-load bearing, spacer elements 21620, 21620' (collectively referred to herein as rolling elements 21611, 21611', 21620, 21620'). For example, referring to FIG. 11, as bearing case 21610, 21610' travels along the bearing rail 21690, 21690' in travel direction 21699, the rolling elements 21611, 21611', 21620, 21620' move along the bearing raceway 21820A if spherical/ball rolling elements are employed or raceway 21820A' if cylindrical/roller elements are employed) towards a trailing end of the bearing case 21610, 21610'. When the rolling elements 21611, 21611', 21620, 21620' reach (are disposed adjacent) the trailing end of the bearing case 21610, 21610', the rolling elements 21611, 21611', 21620, 21620' enter a recirculation raceway 21698 formed in the bearing case 21610, 21610'. The recirculation raceway 21698 (as best seen in FIG. 12 where an end cap 21610C of the bearing case 21610 is removed) redirects or recycles the rolling elements 21611, 21611', 21620, 21620' to (or adjacent) the leading edge of the bearing case 21610, 21610' so that the rolling elements 21611, 21611', 21620, 21620' re-enter the bearing raceway 21820A, 21820A'.

In accordance with the aspects of the present disclosure, the at least one rolling, substantially non-load bearing, spacer element 21620, 21620' is of a sacrificial buffer material (as described below) compatible with sustained substantially unrestricted service commensurate with a predetermined service duty of the vacuum substrate transport apparatus in a vacuum environment at temperatures substantially at and above about 260° C. for a specified predetermined service period. As an example, the specified predetermined service period is in excess of years at the predetermined service duty of the vacuum substrate transport apparatus in the vacuum environment at the temperature substantially at and above 260° C. (e.g., the minimum five year service period/life). The predetermined service duty of the vacuum substrate transport apparatus corresponds to a specified predetermined service period life of the of the vacuum substrate transport apparatus.

In accordance with the aspects of the present disclosure, the sacrificial buffer material (also referred to herein as the spacer material) of the at least one rolling, substantially non-load bearing, spacer element 21620, 21620' forms a sacrificial wear surface 21620S, 21620S' of the at least one rolling, substantially non-load bearing, spacer element 21620, 21620' that wears sacrificially relative to the at least one rolling load bearing element 21611, 21611'. In one aspect, the at least one rolling, substantially non-load bearing, spacer element 21620, 21620' is of a common material (e.g., the sacrificial buffer material) throughout the at least one rolling, substantially non-load bearing, spacer element 21620, 21620'; while in other aspects, the at least one rolling, substantially non-load bearing, spacer element 21620, 21620' may comprise any suitable base material that is over-molded with the sacrificial buffer material (i.e., the sacrificial buffer material surrounds and encases the base material).

Figure 15:
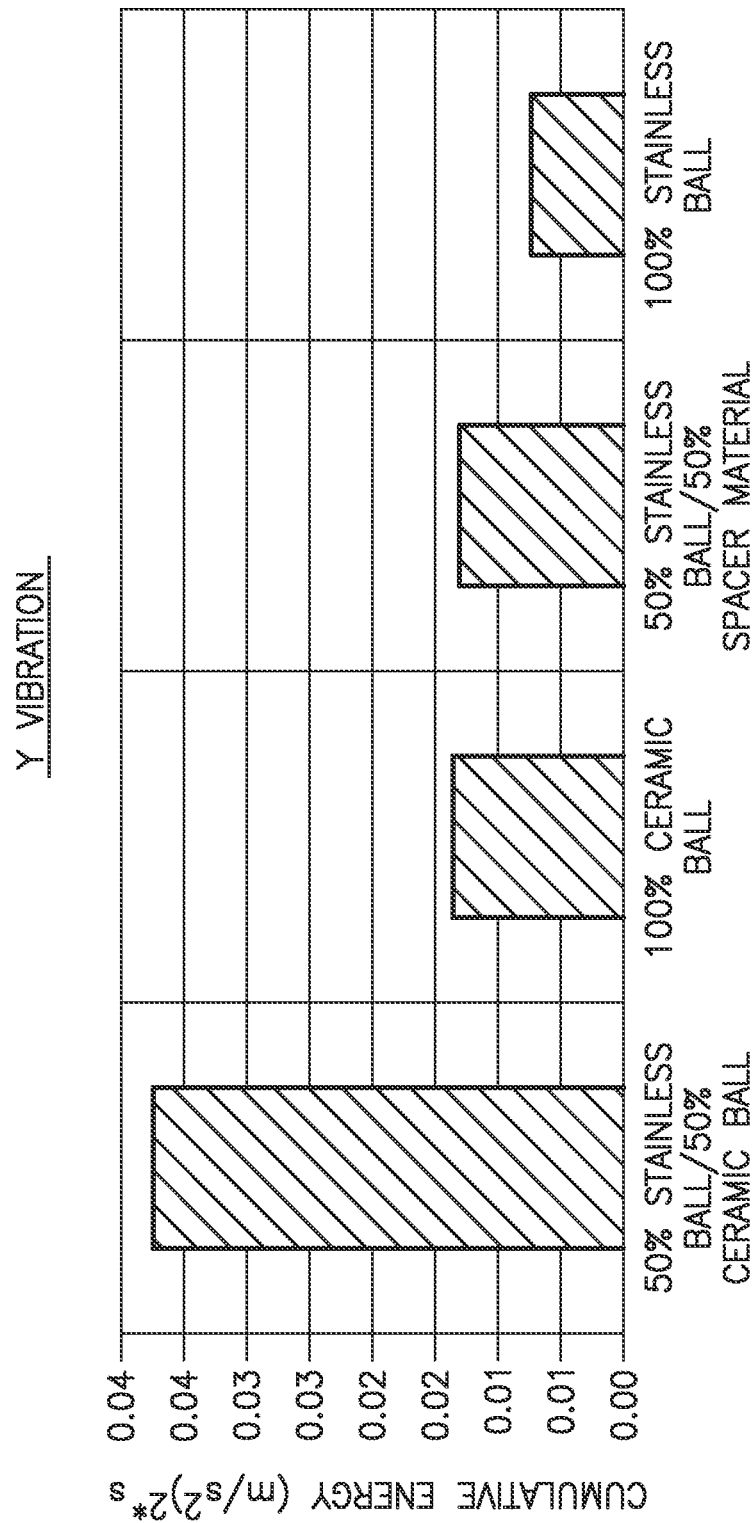
FIG. 15 is an exemplary graph illustrating a vibration response as a representative result of empirically derived cumulative energy for various bearing configurations including the bearing of FIG. 11 in accordance with aspects of the present disclosure.

The sacrificial buffer material is a material that is dimensionally stable at temperatures substantially at and above 260° C. In one aspect, the sacrificial buffer material provides the rolling, substantially non-load bearing, spacer elements 21620, 21620' with a lower mass than the rolling load bearing elements 21611, 21611' so as to induce lower impact pulses as the rolling elements 21611, 21611', 21620, 21620' circulate in the raceways 21820A, 21820A, 21820B, 21820B', 21698, e.g., resulting in vibration less than or commensurate with having all rolling load bearing elements 21611, 21611' (see, e.g., FIG. 15 described further below). The sacrificial buffer material is configured to operate in a vacuum, at a temperature of about 260° C. and above, and is compatible with common lubricants, such as vacuum lubricants, so that in the event of lubrication breakdown, wear properties of the sacrificial buffer material provide for continued operation of the transport apparatus. The sacrificial buffer material of the at least one rolling, substantially non-load bearing, spacer element 21620, 21620' has a lubricious material surface relative to the at least one rolling load bearing element 21611, 21611'. As an example, the sacrificial buffer material may have the following material properties:

| | |
|---|---|
| Specific gravity ($\rho$) (lb/in$^3$) | about 0.045-about 0.08 |
| Water absorption (over 24 hours, %) | about 0.1-about 0.3 |
| Coefficient of linear thermal expansion (in/in-° F.) | about $2 \times 10^{-5}$-about $3 \times 10^{-5}$ |
| Compressive strength (KSI) | about 30-about 35 |
| Hardness | about ≥80 (Shore D) or about ≥85 (Rockwell E) |
| K (wear) factor (in$^3$-min/ft-lb-hr) | about $1 \times 10^{-10}$-about $40 \times 10^{-10}$ |
| Coefficient of friction (in/in/° F.) | about $0.04 \times 10^{-5}$-about $0.4 \times 10^{-5}$ |

Figure 16:
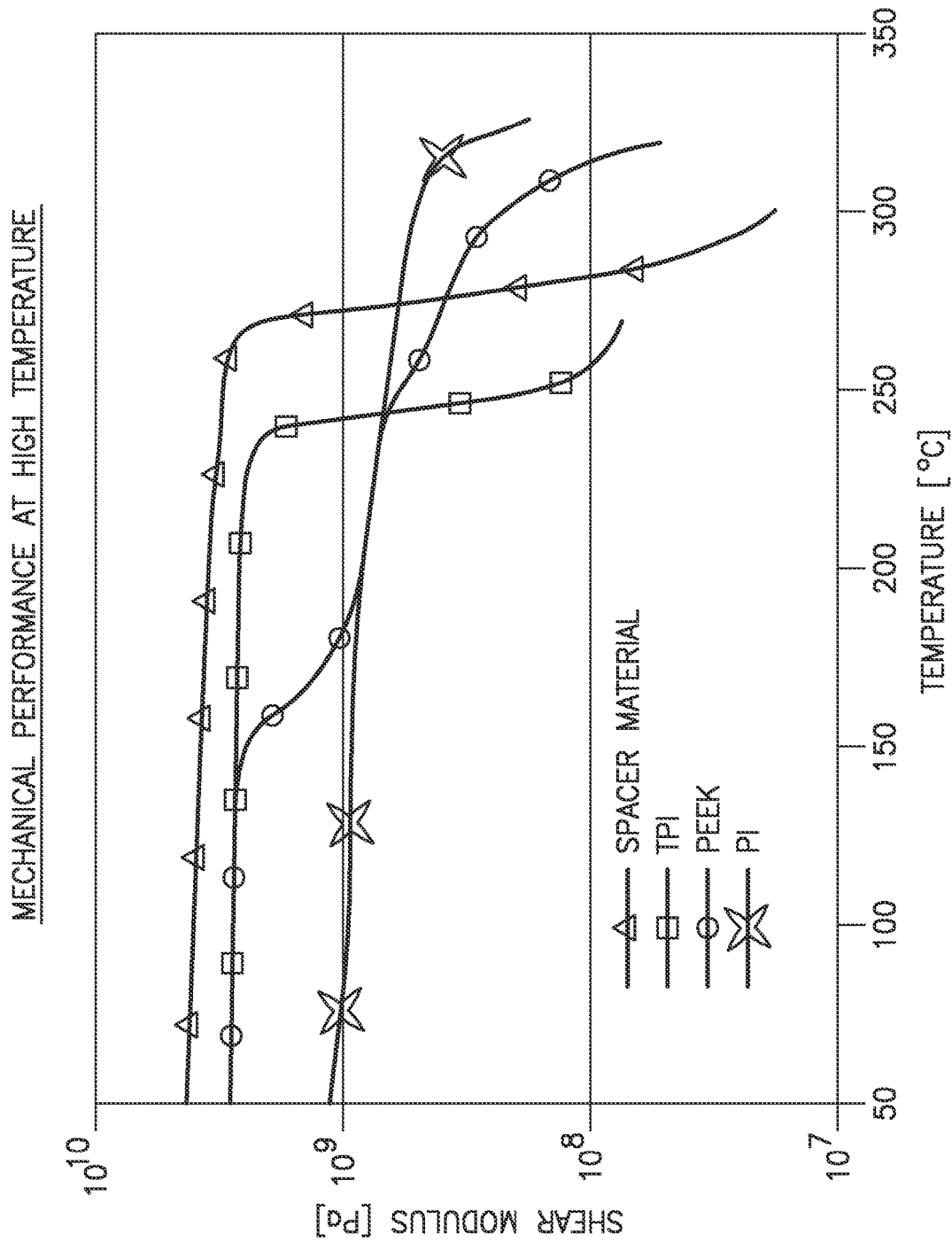
FIG. 16 is an exemplary graph illustrating sustained material property performance at high temperatures including a material of the bearing of FIG. 11 in accordance with aspects of the present disclosure.

It is noted that the material property values provided in the table are representative examples of the material properties values for the sacrificial buffer material at room temperature (e.g., about 21° C. or 70° F.). The above material properties are provided at room temperature as a baseline for representative purposes where the sacrificial buffer material is such as to sustain the material properties substantially constant to temperatures substantially at or above 260° C. The sustained material property performance at high temperatures of the sacrificial buffer material is shown in FIG. 16 (though the specific property plotted in FIG. 16 is the shear modulus, the plot is representative for the material properties listed in the table above at the high temperatures). It is further noted that the material property values provided in the table above are generalized and may be somewhat higher or lower without violating the aspects of the present disclosure, and are meant to illustrate suitable materials having dimensional stability at temperatures substantially at or above 260° C. to about 500° C. and more particularly between about 260° C. and about 700° C. A suitable example of the sacrificial buffer/wear surface material is a plastic material such as a polyimide (PI) or a polyamide-imide (PAI), for example, a PAI available from Solvay S.A. under the name Torlon®; however in other aspects the sacrificial buffer material may be any suitable plastic.

In one aspect, the sacrificial buffer material may possess material properties and/or structure that provide for absorption or adsorption of lubricating oils. Absorption or adsorption of lubricating oils by the sacrificial buffer material of the rolling, substantially non-load bearing, spacer elements 21620, 21620' in a vacuum environment may be beneficial as lubricating oils may evaporate in the vacuum environment. Lubricating oils absorbed into the sacrificial buffer material or adsorbed onto the surface of the sacrificial buffer material may take longer to evaporate and storage of the lubricating oils within or on the sacrificial buffer material itself may provide for substantially in-situ (e.g., without external assistance and without stopping semiconductor processing) re-lubrication of the transport apparatus during transport apparatus operation (e.g., the lubricating oil is transferred from the sacrificial buffer material to the raceways and adjacent rolling load bearing elements as the bearing operates).

Referring again to FIGS. 11A-13A and 13C, as described above the at least one rolling, substantially non-load bearing, spacer element 21620, 21620' is interfaced between adjacent rolling load bearing elements 21611, 21611' and forms a buffer absorbing relative motion between the adjacent rolling load bearing elements 21611, 21611' (e.g., the plasticity of the at least one rolling, substantially non-load bearing, spacer element 21620, 21620' provides the absorbing buffer). For example, the at least one rolling, substantially non-load bearing, spacer element 21620, 21620' buffers the relative motion between adjacent rolling load bearing elements 21611, 21611' passing through the recirculation raceway 21698 and along the raceways 21820A, 21820A', 21820B, 21820B'.

As described herein, the bearing 21600 is a mixed rolling element bearing that includes a mixture of both rolling load bearing elements 21611, 21611' and rolling, substantially non-load bearing, spacer elements 21620, 21620', and as such is a reduced load bearing element (e.g., ball or roller) bearing (compared to a conventional or bearing with all load bearing elements) with a commensurate bearing load capacity, but with a sliding resistive force (static and dynamic) that is less than or commensurate with the reduced load bearing element bearing. As also described herein, the bearing 21600 provides a vibration response less than or commensurate with the vibration response of an all load bearing element bearing (such as illustrated in FIGS. 13B and 13C). An exemplary graph is provided in FIG. 15 of a vibration response as a representative result of empirically derived cumulative energy of the bearing 21600 (see the "50% stainless ball/50% spacer material) compared to a conventional bearing with all load bearing elements (see the "100% stainless ball" and "100% ceramic ball") as well as a bearing having mixed steel and ceramic bearings.

Figure 8A:
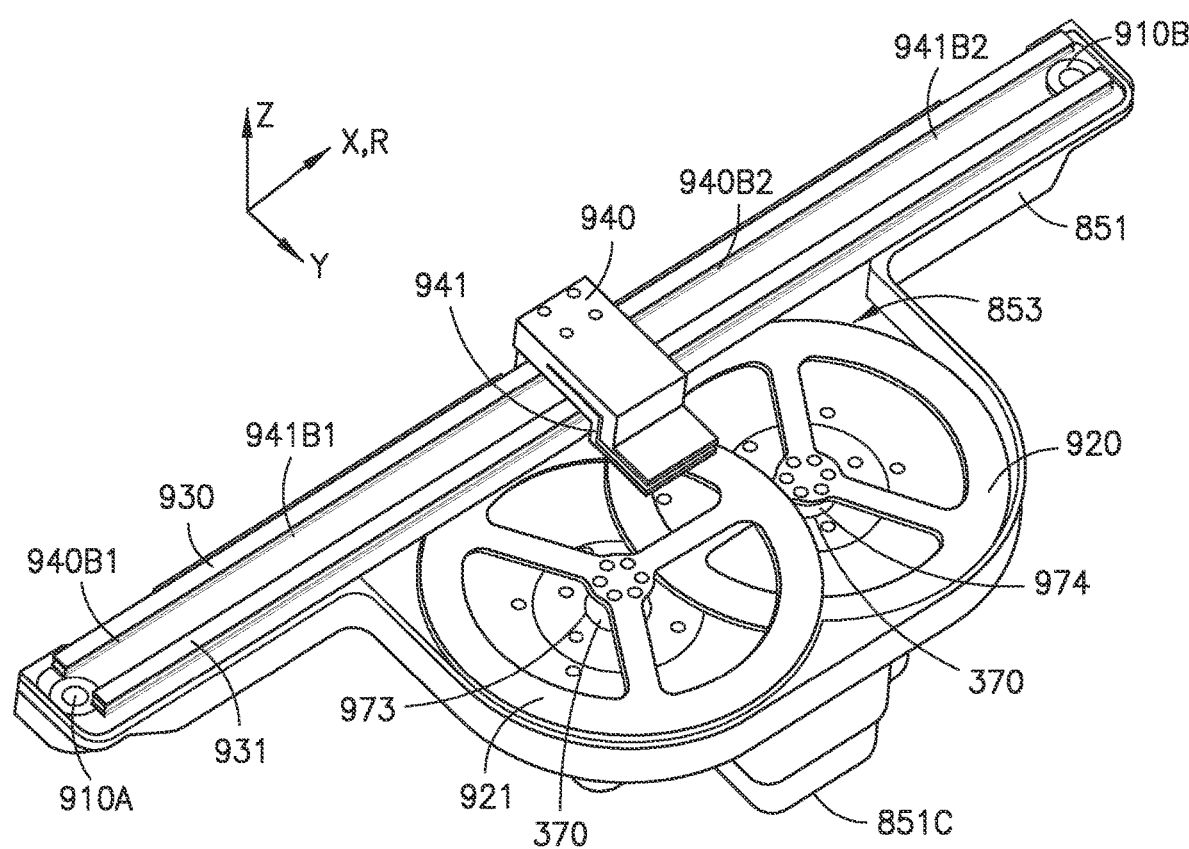
FIGS. 8A-8F are schematic illustrations of a portion of the substrate transport apparatus illustrated in FIGS. 8A-8B in accordance with aspects of the disclosed embodiment.
Figure 8B:
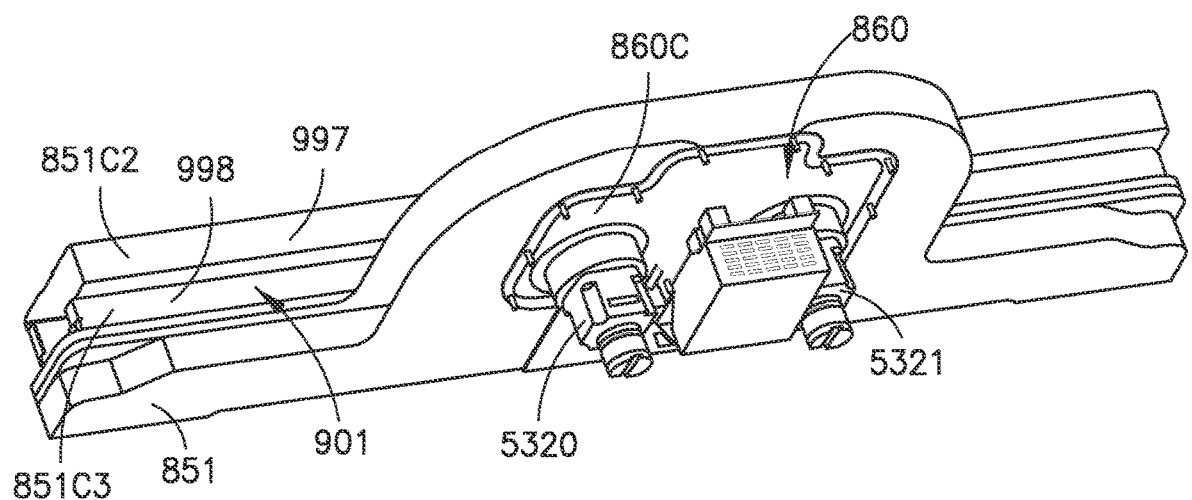
Figure 8C:
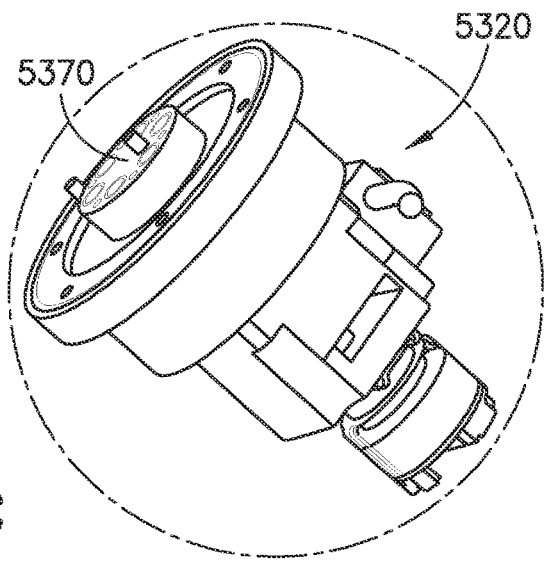
Figure 8D:
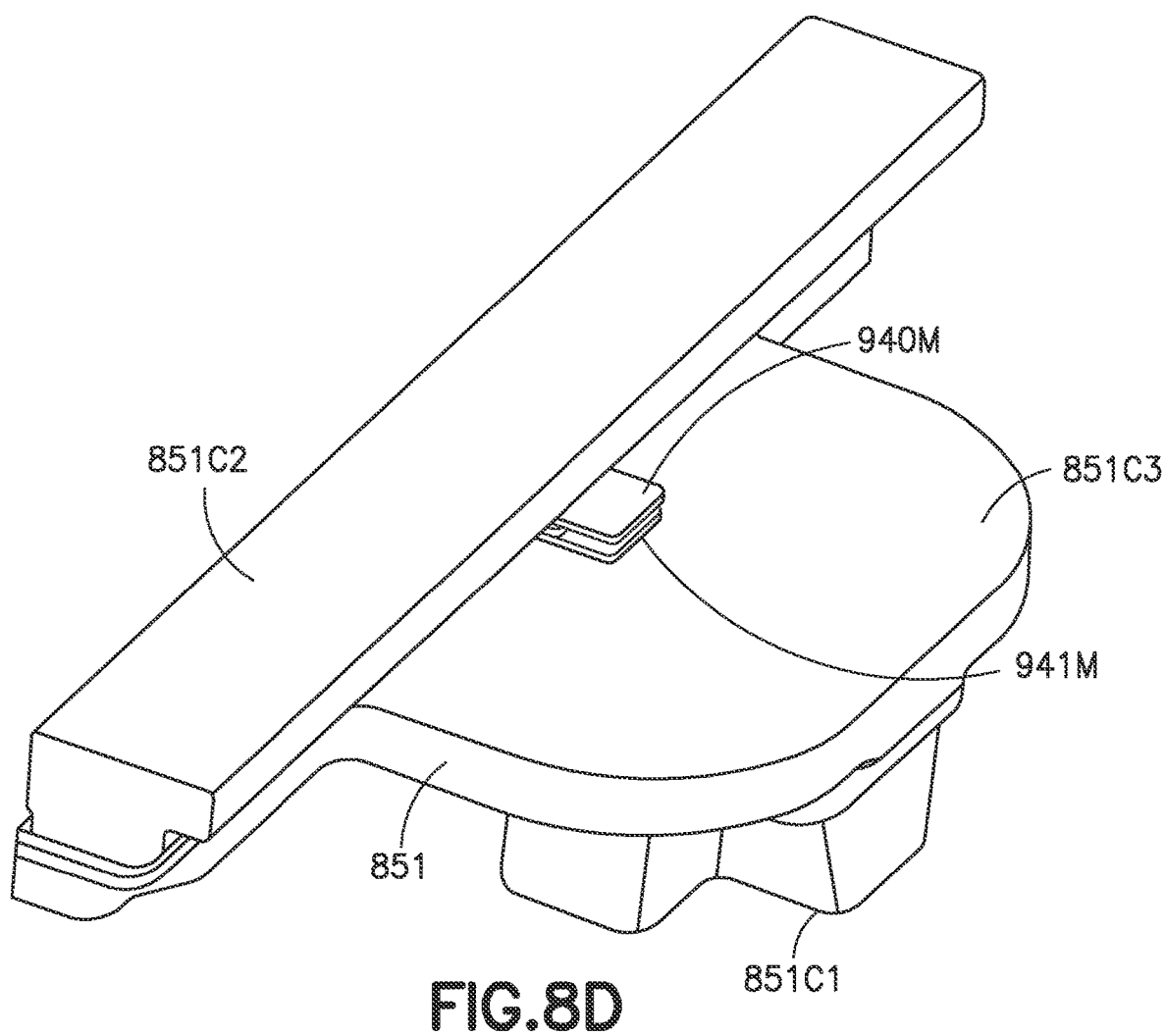
Figure 8E:
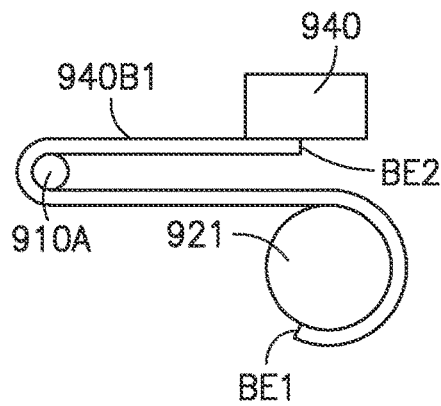
Figure 8F:
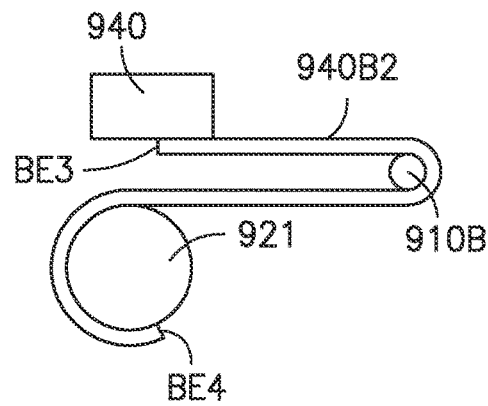

The bearing 21600 is sized (commensurate with conventional, all load bearing element bearing 21700) so that the bearing load capacity (i.e., the rated capacity) is optimized (as such would be for a conventional bearing) for the bearing static and dynamic loads (e.g., from the predetermined service duty cycle of the transport apparatus which is predetermined in accordance with a process tool/arm configuration) imparted onto the bearing 21600 by the respective transport arm(s) (e.g., see arms 300, 301 in FIG. 3A; arms 5210-5213 in FIG. 6A; arms 810-813 in FIG. 7A; arms 13310, 13311 in FIG. 9A; and arm 13310 in FIG. 10) loads and drive loads (e.g., such as loads imparted by the respective motors, such as motors 5320, 5321 in FIG. 8B). As such, the bearing 21600 is sized for given transport arm loads and the predetermined service duty cycle (in other words the rated capacity of the inventive bearing 21600 is similar or commensurate of the rated capacity of the conventional bearing 21700).

Figure 14:
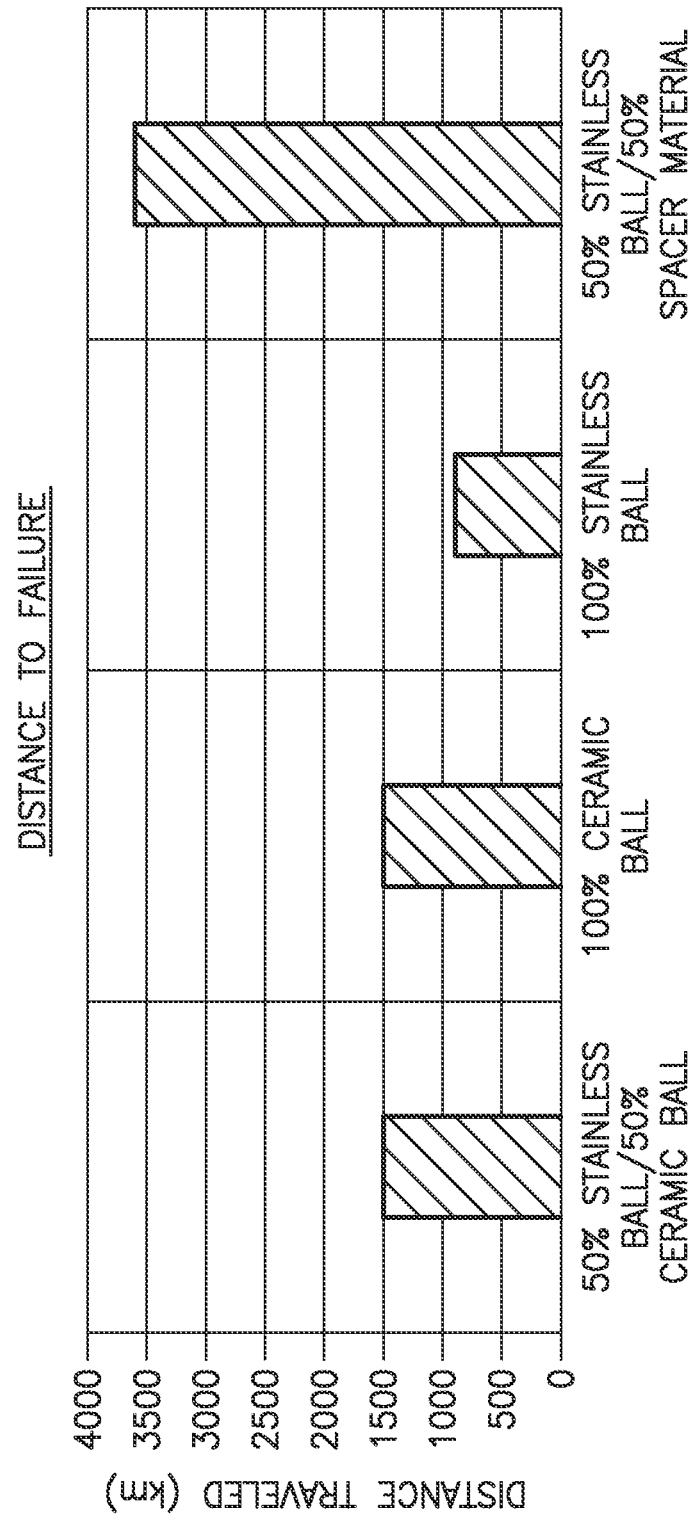
FIG. 14 is an exemplary graph illustrating a distance travelled for various bearing configurations including the bearing of FIG. 11 in accordance with aspects of the present disclosure.

The transport apparatus/transport arm service duty cycle corresponds to and is substantially predetermined for optimal processing in the semiconductor processing tool (e.g., but may vary depending on the number of independently movable transport arms and/or end effectors, a size and shape of the transport chamber, a load lock to process module transport pick and place cycle according to a predetermined process recipe for different vacuum process modules of the semiconductor processing tool). The service duty cycle for the bearing 21600 (e.g., the substantially unrestricted service) may be represented by a cumulative distance the bearing 21600 travels during the predetermined transport apparatus/transport arm service duty cycle. FIG. 14 illustrates an exemplary graph having a scale that shows the cumulative travel distance/service duty cycle for different bearing configurations such as, e.g., the inventive bearing 21600 (see the "50% stainless ball/50% spacer material), an all load bearing element (conventional) bearing (see the "100% stainless ball" and "100% ceramic ball"), and a mixed rolling element bearing (see the "%50 stainless ball/50% ceramic ball"—e.g., having different spacer element materials than those described in the aspects of the present disclosure). As can be seen in FIG. 14, the bearing 21600 in accordance with the aspects of the present disclosure results in a cumulative distance traveled or service duty cycle of the bearing 21600 with a scale factor that is about two times greater than the service duty cycle of the all load bearing element bearing (see the "100% stainless ball" and "100% ceramic ball"), and the mixed rolling element bearing (see the "%50 stainless ball/50% ceramic ball"). For example purposes the reduced load bearing element bearing (e.g., bearing 21600) in accordance with the aspects of the present disclosure provides for a service duty cycle of the bearing 21600 that is greater than four years (and may be greater than five years in accordance with some aspects of the present disclosure), which may be commensurate with the predetermined service duty life of the transport apparatus (e.g., transport apparatus 104, 104D, 104F, 104F').

Figure 17:
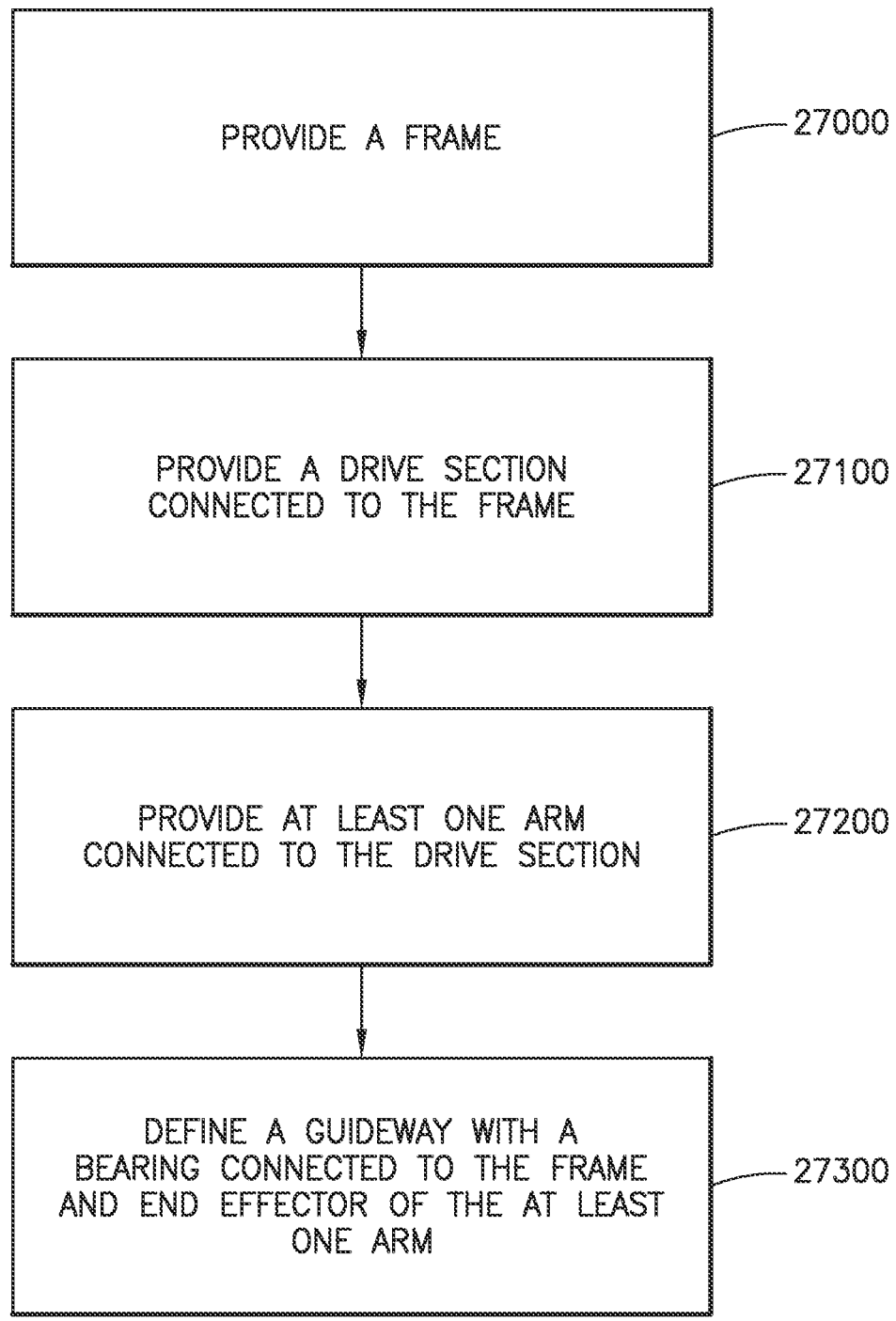
FIG. 17 is a flow diagram of an exemplary method in accordance with aspects of the present disclosure.

Referring to FIGS. 6A and 17, and exemplary method will be described in accordance with aspects of the present disclosure. While the exemplary method is described with respect to transport apparatus 104, the exemplary method is equally applied to the other transport apparatus described herein. The method includes providing a frame 200F (FIG. 17, Block 27000). A drive section (such as one or more of drive portions 5251, 5252) is provided and connected to the frame 200F (FIG. 17, Block 27100), the drive section having at least one drive axis (e.g., such as a respective drive motor 5320, 5321). At least one arm 5210-5213 is provided and connected to the drive section (FIG. 17, Block 27200). The at least one arm 5210-5213 having an end effector 5210E-5213E configured for holding a substrate S, the at least one arm 5210-5213 being connected to the drive section by a transmission link and having at least one degree of freedom axis effecting extension and retraction of the end effector with respect to the at least one arm. A guideway (see for example, respective guideways 499 formed by bearings 400, 401 in FIG. 4B—noting that the other bearings described herein for substantially similar guideways) is defined with a bearing (e.g., the respective bearing 5310, 5311) connected to the frame 200F and the end effector (e.g., the respective end effector 5210E-5213E) (FIG. 17, Block 27300), the guideway defining the at least one degree of freedom axis. The bearing in accordance with the exemplary method is as described above with respect to, e.g., bearing 21600.

In accordance with one or more aspects of the present disclosure a vacuum substrate transport apparatus comprises:
   a frame;
   a drive section connected to the frame, the drive section having at least one drive axis;
   at least one arm having an end effector configured for holding a substrate, the at least one arm being connected to the drive section by a transmission link and having at least one degree of freedom axis effecting extension and retraction of the end effector with respect to the at least one arm; and a bearing connected to the frame and the end effector, the bearing defining a guideway that defines the at least one degree of freedom axis, wherein the bearing comprises at least one rolling load bearing element disposed in a bearing case of the bearing so as to circulate through the bearing case along a bearing rail, interfacing between a bearing raceway of the bearing case and the bearing rail so as to support arm loads, imparted by the at least one arm onto the bearing, and effecting sliding of the bearing case with the at least one arm along the bearing rail; and at least one rolling, substantially non-load bearing, spacer element disposed in the bearing case alongside, intervening between and spacing each of the at least one rolling load bearing element from another of the at least one rolling load bearing element, the at least one rolling, substantially non-load bearing, spacer element is configured so that, interfacing between the bearing raceway and the bearing rail, the at least one rolling, substantially non-load bearing, spacer element is unloaded by the arm loads, wherein the at least one rolling, substantially non-load bearing, spacer element is of a sacrificial buffer material compatible with sustained substantially unrestricted service commensurate with a predetermined service duty of the vacuum substrate transport apparatus in a vacuum environment at temperatures over 260° C. for a specified predetermined service period.

In accordance with one or more aspects of the present disclosure the at least one rolling load bearing element and the at least one rolling, substantially non-load bearing, spacer element are each a ball.

In accordance with one or more aspects of the present disclosure the at least one rolling load bearing element and the at least one rolling, substantially non-load bearing, spacer element are each a roller.

In accordance with one or more aspects of the present disclosure the sacrificial buffer material of the at least one rolling, substantially non-load bearing, spacer element forms a sacrificial wear surface of the at least one rolling, substantially non-load bearing, spacer element that wears sacrificially relative to the at least one rolling load bearing element.

In accordance with one or more aspects of the present disclosure the at least one rolling, substantially non-load bearing, spacer element has a lubricious material surface relative to the at least one rolling load bearing element, where the lubricious material surface comprises a lubricant.

In accordance with one or more aspects of the present disclosure the sacrificial buffer material of the at least one rolling, substantially non-load bearing, spacer element is a polyimide (PI).

In accordance with one or more aspects of the present disclosure the sacrificial buffer material of the at least one rolling, substantially non-load bearing, spacer element is a polyamide-imide (PAI).

In accordance with one or more aspects of the present disclosure the specified predetermined service period is in excess of years at the predetermined service duty of the vacuum substrate transport apparatus in the vacuum environment at the temperatures over 260° C.

In accordance with one or more aspects of the present disclosure the vacuum environment is a high vacuum compatible with high vacuum substrate fabrication operations.

In accordance with one or more aspects of the present disclosure the at least one rolling, substantially non-load bearing, spacer element is of a common material throughout the at least one rolling, substantially non-load bearing, spacer element.

In accordance with one or more aspects of the present disclosure the predetermined service duty of the vacuum substrate transport apparatus corresponds to a specified predetermined service period life of the of the vacuum substrate transport apparatus.

In accordance with one or more aspects of the present disclosure the at least one rolling, substantially non-load bearing, spacer element interfaces between each rolling load bearing element and the other load bearing element so as to buffer relative motion between each rolling load bearing element and the other load bearing element with the bearing case sliding along the bearing rail.

In accordance with one or more aspects of the present disclosure the at least one rolling, substantially non-load bearing, spacer element is disposed in the bearing case so as to occupy a rolling load bearing element position in the bearing case so that the bearing has a reduced number of the at least one rolling load bearing element compared to an all rolling load bearing element bearing.

In accordance with one or more aspects of the present disclosure the bearing is a reduced load bearing element bearing for a predetermined load capacity, commensurate with the all load bearing element bearing, that provides reduced sliding resistance force commensurate with the reduced load bearing element bearing with reduced vibration response commensurate to the all rolling load bearing element bearing.

In accordance with one or more aspects of the present disclosure a vacuum substrate transport apparatus comprises:

a frame;

a drive section connected to the frame, the drive section having at least one drive axis;

at least one arm having an end effector configured for holding a substrate, the at least one arm being connected to the drive section by a transmission link and having at least one degree of freedom axis effecting extension and retraction of the end effector with respect to the at least one arm; and a bearing connected to the frame and the end effector, the bearing defining a guideway that defines the at least one degree of freedom axis, wherein the bearing comprises at least one rolling load bearing element disposed in a bearing case of the bearing so as to circulate through the case along a bearing rail, interfacing between a bearing raceway of the bearing case and bearing rail so as to support arm loads, imparted by the at least one arm onto the bearing, and effecting sliding of the bearing case with the at least one arm along the bearing rail; and at least one rolling plastic spacer element disposed in the bearing raceway rolling alongside with and spacing each of the at least one rolling load bearing element from another of the at least one rolling load bearing element in the raceway, wherein the at least one rolling plastic spacer element is compatible with sustained substantially unrestricted service commensurate with a predetermined service duty of the vacuum substrate transport apparatus in a vacuum environment at temperatures over 260° C. for a specified predetermined service period.

In accordance with one or more aspects of the present disclosure the at least one rolling plastic spacer element is a substantially non-load bearing element configured so that interfacing between the bearing raceway and the bearing rail the at least one rolling plastic spacer element is unloaded by the arm loads imparted to the bearing case so that the at least one plastic spacer element is substantially non-load bearing.

In accordance with one or more aspects of the present disclosure the at least one rolling plastic spacer element forms a sacrificial wear surface relative to the at least one rolling load bearing element.

In accordance with one or more aspects of the present disclosure the sacrificial wear surface of the at least one rolling plastic spacer element wears sacrificially relative to the at least one rolling load bearing element.

In accordance with one or more aspects of the present disclosure the sacrificial wear surface of the at least one rolling plastic spacer element is a polyimide (PI).

In accordance with one or more aspects of the present disclosure the sacrificial wear surface of the at least one rolling plastic spacer element is a polyamide-imide (PAI).

In accordance with one or more aspects of the present disclosure the at least one rolling plastic spacer element has a lubricious material surface relative to the at least one rolling load bearing element.

In accordance with one or more aspects of the present disclosure the at least one rolling load bearing element and the at least one rolling plastic spacer element are each a ball.

In accordance with one or more aspects of the present disclosure the at least one rolling load bearing element and the at least one rolling plastic spacer element are each a roller.

In accordance with one or more aspects of the present disclosure the specified predetermined service period is in excess of years at the predetermined service duty of the vacuum substrate transport apparatus in the vacuum environment at the temperatures over 260° C.

In accordance with one or more aspects of the present disclosure the vacuum environment is a high vacuum compatible with high vacuum substrate fabrication operations.

In accordance with one or more aspects of the present disclosure the at least one rolling plastic spacer element is of a common material throughout the at least one rolling plastic spacer element.

In accordance with one or more aspects of the present disclosure the predetermined service duty of the vacuum substrate transport apparatus corresponds to a specified predetermined service period life of the of the vacuum substrate transport apparatus.

In accordance with one or more aspects of the present disclosure the at least one rolling plastic spacer element interfaces between each rolling load bearing element and the other load bearing element so as to buffer relative motion between each rolling load bearing element and the other load bearing element with the bearing case sliding along the bearing rail.

In accordance with one or more aspects of the present disclosure the at least one rolling plastic spacer element is disposed in the bearing case so as to occupy a rolling load bearing element position in the bearing case so that the bearing has a reduced number of the at least one rolling load bearing element compared to an all rolling load bearing element bearing.

In accordance with one or more aspects of the present disclosure the bearing is a reduced load bearing element bearing for a predetermined load capacity, commensurate with the all load bearing element bearing, that provides reduced sliding resistance force commensurate with the reduced load bearing element bearing with reduced vibration response commensurate to the all rolling load bearing element bearing.

In accordance with one or more aspects of the present disclosure a vacuum substrate transport apparatus comprises:
  a frame;
  a drive section connected to the frame, the drive section having at least one drive axis;
  at least one arm having an end effector configured for holding a substrate, the at least one arm being connected to the drive section by a transmission link and having at least one degree of freedom axis effecting extension and retraction of the end effector with respect to the at least one arm; and
  a bearing connected to the frame and the end effector, the bearing defining a guideway that defines the at least one degree of freedom axis, wherein the bearing comprises
  at least one rolling load bearing element disposed in a bearing case of the bearing so as to circulate through the case along a bearing rail, interfacing between a bearing raceway of the bearing case and the bearing rail so as to support arm loads, imparted by the at least one arm onto the bearing, and effecting sliding of the bearing case with the at least one arm along the bearing rail; and
  at least one rolling buffer element disposed in the bearing raceway rolling alongside with and interfacing between each of the at least rolling load bearing element and another of the at least one rolling load bearing element in the bearing case so as to buffer relative motion between each rolling load bearing element and the other rolling load bearing element with the bearing case sliding along the bearing rail;
  wherein the at least one rolling buffering element is compatible with sustained substantially unrestricted service commensurate with a predetermined service duty of the vacuum substrate transport apparatus in a vacuum environment at temperatures over 260° C. for a specified predetermined service period.

In accordance with one or more aspects of the present disclosure the at least one rolling buffer element is a substantially non-load bearing element configured so that interfacing between the bearing raceway and the bearing rail the at least one rolling buffer element is unloaded by the arm loads imparted to the bearing case so that the at least one buffer element is substantially non-load bearing.

In accordance with one or more aspects of the present disclosure the at least one rolling buffer element forms a sacrificial wear surface relative to the at least one rolling load bearing element.

In accordance with one or more aspects of the present disclosure the sacrificial wear surface of the at least one rolling buffer element wears sacrificially relative to the at least one rolling load bearing element.

In accordance with one or more aspects of the present disclosure the sacrificial wear surface of the at least one rolling buffer element is a polyimide (PI).

In accordance with one or more aspects of the present disclosure the sacrificial wear surface of the at least one rolling buffer element is a polyamide-imide (PAI).

In accordance with one or more aspects of the present disclosure the at least one rolling buffer element has a lubricious material surface relative to the at least one rolling load bearing element.

In accordance with one or more aspects of the present disclosure the at least one rolling load bearing element and the at least one rolling buffer element are each a ball.

In accordance with one or more aspects of the present disclosure the at least one rolling load bearing element and the at least one rolling buffer element are each a roller.

In accordance with one or more aspects of the present disclosure the specified predetermined service period is in excess of years at the predetermined service duty of the vacuum substrate transport apparatus in the vacuum environment at the temperatures over 260° C.

In accordance with one or more aspects of the present disclosure the vacuum environment is a high vacuum compatible with high vacuum substrate fabrication operations.

In accordance with one or more aspects of the present disclosure the at least one rolling buffer element is of a common material throughout the at least one rolling buffer element.

In accordance with one or more aspects of the present disclosure the predetermined service duty of the vacuum substrate transport apparatus corresponds to a specified predetermined service period life of the of the vacuum substrate transport apparatus.

In accordance with one or more aspects of the present disclosure the at least one rolling buffer element interfaces between each rolling load bearing element and the other load bearing element so as to buffer relative motion between each rolling load bearing element and the other load bearing element with the bearing case sliding along the bearing rail.

In accordance with one or more aspects of the present disclosure the at least one rolling buffer element is disposed in the bearing case so as to occupy a rolling load bearing element position in the bearing case so that the bearing has a reduced number of the at least one rolling load bearing element compared to an all rolling load bearing element bearing.

In accordance with one or more aspects of the present disclosure the bearing is a reduced load bearing element bearing for a predetermined load capacity, commensurate with the all load bearing element bearing, that provides reduced sliding resistance force commensurate with the reduced load bearing element bearing with reduced vibration response commensurate to the all rolling load bearing element bearing.

In accordance with one or more aspects of the present disclosure a method comprises:

providing a frame;

providing a drive section connected to the frame, the drive section having at least one drive axis;

providing at least one arm having an end effector configured for holding a substrate, the at least one arm being connected to the drive section by a transmission link and having at least one degree of freedom axis effecting extension and retraction of the end effector with respect to the at least one arm; and defining a guideway with a bearing connected to the frame and the end effector, the guideway defining the at least one degree of freedom axis, wherein the bearing comprises at least one rolling load bearing element disposed in a bearing case of the bearing so as to circulate through the case along a bearing rail, interfacing between a bearing raceway of the bearing case and the bearing rail so as to support arm loads, imparted by the at least one arm onto the bearing, and effecting sliding of the bearing case with the at least one arm along the bearing rail; and at least one rolling buffer element disposed in the bearing raceway rolling alongside with and interfacing between each of the at least rolling load bearing element and another of the at least one rolling load bearing element in the bearing case so as to buffer relative motion between each rolling load bearing element and the other rolling load bearing element with the bearing case sliding along the bearing rail;

wherein the at least one rolling buffering element is compatible with sustained substantially unrestricted service commensurate with a predetermined service duty of the vacuum substrate transport apparatus in a vacuum environment at temperature over 260° C. for a specified predetermined service period.

In accordance with one or more aspects of the present disclosure the at least one rolling buffer element is a substantially non-load bearing element configured so that interfacing between the bearing raceway and the bearing rail the at least one rolling buffer element is unloaded by the arm loads imparted to the bearing case so that the at least one buffer element is substantially non-load bearing.

In accordance with one or more aspects of the present disclosure, the method further comprises forming a sacrificial wear surface, with the at least one rolling buffer element, relative to the at least one rolling load bearing element.

In accordance with one or more aspects of the present disclosure the sacrificial wear surface of the at least one rolling buffer element wears sacrificially relative to the at least one rolling load bearing element.

In accordance with one or more aspects of the present disclosure the sacrificial wear surface of the at least one rolling buffer element is a polyimide (PI).

In accordance with one or more aspects of the present disclosure the sacrificial wear surface of the at least one rolling buffer element is a polyamide-imide (PAI).

In accordance with one or more aspects of the present disclosure the at least one rolling buffer element has a lubricious material surface relative to the at least one rolling load bearing element.

In accordance with one or more aspects of the present disclosure the at least one rolling load bearing element and the at least one rolling buffer element are each a ball.

In accordance with one or more aspects of the present disclosure the at least one rolling load bearing element and the at least one rolling buffer element are each a roller.

In accordance with one or more aspects of the present disclosure the specified predetermined service period is in excess of years at the predetermined service duty of the vacuum substrate transport apparatus in the vacuum environment at the temperature over 260° C.

In accordance with one or more aspects of the present disclosure the vacuum environment is a high vacuum compatible with high vacuum substrate fabrication operations.

In accordance with one or more aspects of the present disclosure the at least one rolling buffer element is of a common material throughout the at least one rolling buffer element.

In accordance with one or more aspects of the present disclosure the predetermined service duty of the vacuum substrate transport apparatus corresponds to a specified predetermined service period life of the of the vacuum substrate transport apparatus.

In accordance with one or more aspects of the present disclosure, the method further comprises buffering relative motion between each rolling load bearing element and the other load bearing element with the bearing case sliding along the bearing rail with the at least one rolling buffer element interfacing between each rolling load bearing element and the other load bearing element.

In accordance with one or more aspects of the present disclosure the at least one rolling buffer element is disposed in the bearing case so as to occupy a rolling load bearing element position in the bearing case so that the bearing has a reduced number of the at least one rolling load bearing element compared to an all rolling load bearing element bearing.

In accordance with one or more aspects of the present disclosure the bearing is a reduced load bearing element bearing for a predetermined load capacity, commensurate with the all load bearing element bearing, that provides reduced sliding resistance force commensurate with the reduced load bearing element bearing with reduced vibration response commensurate to the all rolling load bearing element bearing.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. A vacuum substrate transport apparatus comprising:
   a frame;
   a drive section connected to the frame, the drive section having at least one drive axis;
   at least one arm having an end effector configured for holding a substrate, the at least one arm being connected to the drive section by a transmission link and having at least one degree of freedom axis effecting extension and retraction of the end effector with respect to the at least one arm; and
   a bearing connected to the frame and the end effector, the bearing defining a guideway that defines the at least one degree of freedom axis, wherein the bearing comprises
      at least one rolling load bearing element disposed in a bearing case of the bearing so as to circulate through the bearing case along a bearing rail, interfacing between a bearing raceway of the bearing case and the bearing rail so as to support arm loads, imparted by the at least one arm onto the bearing, and effecting sliding of the bearing case with the at least one arm along the bearing rail; and
      at least one rolling, substantially non-load bearing, spacer element disposed in the bearing case alongside, intervening between and spacing each of the at least one rolling load bearing element from another of the at least one rolling load bearing element, the at least one rolling, substantially non-load bearing, spacer element is configured so that, interfacing between the bearing raceway and the bearing rail, the at least one rolling, substantially non-load bearing, spacer element is unloaded substantially continuously throughout the bearing by the arm loads generated for each motion of the at least one arm,
   wherein the at least one rolling, substantially non-load bearing, spacer element is of a vacuum compatible sacrificial non-steel or non-ceramic buffer material compatible with sustained substantially unrestricted service commensurate with a predetermined semiconductor processing service duty of the vacuum substrate transport apparatus in a vacuum environment at temperatures over 260° C. for a specified predetermined service period of at least five years.

2. The vacuum substrate transport apparatus of claim 1, wherein the at least one rolling load bearing element and the at least one rolling, substantially non-load bearing, spacer element are each a ball.

3. The vacuum substrate transport apparatus of claim 1, wherein the at least one rolling load bearing element and the at least one rolling, substantially non-load bearing, spacer element are each a roller.

4. The vacuum substrate transport apparatus of claim 1, wherein the vacuum compatible sacrificial non-steel or non-ceramic buffer material of the at least one rolling, substantially non-load bearing, spacer element forms a sacrificial wear surface of the at least one rolling, substantially non-load bearing, spacer element that wears sacrificially relative to the at least one rolling load bearing element.

5. The vacuum substrate transport apparatus of claim 1, wherein the at least one rolling, substantially non-load bearing, spacer element has a lubricious material surface relative to the at least one rolling load bearing element, where the lubricious material surface comprises a lubricant.

6. The vacuum substrate transport apparatus of claim 1, wherein the vacuum compatible sacrificial non-steel or non-ceramic buffer material of the at least one rolling, substantially non-load bearing, spacer element is a polyimide (PI).

7. The vacuum substrate transport apparatus of claim 1, wherein the vacuum compatible sacrificial non-steel or non-ceramic buffer material of the at least one rolling, substantially non-load bearing, spacer element is polyamide-imide (PAI).

8. The vacuum substrate transport apparatus of claim 1, wherein the vacuum environment temperatures are between about 260° C. to about 500° C. or between about 260° C. and about 700° C.

9. The vacuum substrate transport apparatus of claim 1, wherein the vacuum environment is a high vacuum compatible with high vacuum substrate fabrication operations.

10. The vacuum substrate transport apparatus of claim 1, wherein the at least one rolling, substantially non-load bearing, spacer element is of a common material throughout the at least one rolling, substantially non-load bearing, spacer element.

11. The vacuum substrate transport apparatus of claim 1, wherein the predetermined service duty of the vacuum substrate transport apparatus corresponds to a specified predetermined service period life of the of the vacuum substrate transport apparatus.

12. The vacuum substrate transport apparatus of claim 1, wherein the at least one rolling, substantially non-load bearing, spacer element interfaces between each rolling load bearing element and the other load bearing element so as to buffer relative motion between each rolling load bearing element and the other load bearing element with the bearing case sliding along the bearing rail.

13. The vacuum substrate transport apparatus of claim 1, wherein the at least one rolling, substantially non-load bearing, spacer element is disposed in the bearing case so as to occupy a rolling load bearing element position in the bearing case so that the bearing has a reduced number of the at least one rolling load bearing element compared to an all rolling load bearing element bearing.

14. The vacuum substrate transport apparatus of claim 13, wherein the bearing is a reduced load bearing element bearing for a predetermined load capacity, commensurate with the all load bearing element bearing, that provides reduced sliding resistance force commensurate with the reduced load bearing element bearing with reduced vibration response commensurate to the all rolling load bearing element bearing.

15. The vacuum substrate transport apparatus of claim 1, wherein the vacuum environment is that of an etching process, chemical vapor deposition process, plasma vapor deposition process, implantation process, metrology process, rapid thermal process, dry strip atomic layer deposition process, oxidation process, diffusion process, nitride forming process, vacuum lithography process, epitaxy process, or a thin film process.

16. The vacuum substrate transport apparatus of claim 1, wherein the vacuum compatible sacrificial non-steel or non-ceramic buffer material is a plastic material.

17. The vacuum substrate transport apparatus of claim 1, wherein the bearing is a linear bearing or a rotary bearing.

18. A vacuum substrate transport apparatus comprising:
a frame;
a drive section connected to the frame, the drive section having at least one drive axis;
at least one arm having an end effector configured for holding a substrate, the at least one arm being connected to the drive section by a transmission link and having at least one degree of freedom axis effecting extension and retraction of the end effector with respect to the at least one arm; and
a bearing connected to the frame and the end effector, the bearing defining a guideway that defines the at least one degree of freedom axis, wherein the bearing comprises
at least one rolling load bearing element disposed in a bearing case of the bearing so as to circulate through the case along a bearing rail, interfacing between a bearing raceway of the bearing case and the bearing rail so as to support arm loads, imparted by the at least one arm onto the bearing, and effecting sliding of the bearing case with the at least one arm along the bearing rail; and
at least one vacuum substrate transport non-steel or non-ceramic rolling buffer element disposed in the bearing raceway rolling alongside with and interfacing between each of the at least rolling load bearing element and another of the at least one rolling load bearing element in the bearing case so as to buffer relative motion between each rolling load bearing element and the other rolling load bearing element with the bearing case sliding along the bearing rail;
wherein the at least one vacuum substrate transport non-steel or non-ceramic rolling buffering element is compatible with sustained substantially unrestricted service commensurate with a predetermined semiconductor processing service duty of the vacuum substrate transport apparatus in a vacuum environment at temperatures over 260° C. for a specified predetermined service period of at least five years.

19. The vacuum substrate transport apparatus of claim 18, wherein the at least one vacuum substrate transport non-steel or non-ceramic rolling buffer element is disposed in the bearing case so as to occupy a rolling load bearing element position in the bearing case so that the bearing has a reduced number of the at least one rolling load bearing element compared to an all rolling load bearing element bearing.

20. The vacuum substrate transport apparatus of claim 19, wherein the bearing is a reduced load bearing element bearing for a predetermined load capacity, commensurate with the all load bearing element bearing, that provides reduced sliding resistance force commensurate with the reduced load bearing element bearing with reduced vibration response commensurate to the all rolling load bearing element bearing.

21. The vacuum substrate transport apparatus of claim 18, wherein the at least one vacuum substrate transport non-steel or non-ceramic rolling buffer element has a lubricious material surface relative to the at least one rolling load bearing element.

22. The vacuum substrate transport apparatus of claim 18, wherein the at least one rolling load bearing element and the at least one vacuum substrate transport non-steel or non-ceramic rolling buffer element are each a ball.

23. The vacuum substrate transport apparatus of claim 18, wherein the at least one rolling load bearing element and the at least one vacuum substrate transport non-steel or non-ceramic rolling buffer element are each a roller.

24. The vacuum substrate transport apparatus of claim 18, wherein the at least one vacuum substrate transport non-steel or non-ceramic rolling buffer element interfaces between each rolling load bearing element and the other load bearing element so as to buffer relative motion between each rolling load bearing element and the other load bearing element with the bearing case sliding along the bearing rail.

25. The vacuum substrate transport apparatus of claim 18, wherein the vacuum environment is a high vacuum compatible with high vacuum substrate fabrication operations.

26. The vacuum substrate transport apparatus of claim 18, wherein the at least one vacuum substrate transport non-steel or non-ceramic rolling buffer element is of a common material throughout the at least one vacuum substrate transport non-steel or non-ceramic rolling buffer element.

27. The vacuum substrate transport apparatus of claim 18, wherein the predetermined service duty of the vacuum substrate transport apparatus corresponds to a specified predetermined service period life of the of the vacuum substrate transport apparatus.

28. The vacuum substrate transport apparatus of claim 18, wherein the at least one vacuum substrate transport non-steel or non-ceramic rolling buffer element is a substantially non-load bearing element configured so that interfacing between the bearing raceway and the bearing rail the at least one vacuum substrate transport non-steel or non-ceramic rolling buffer element is unloaded substantially continuously throughout the bearing by the arm loads generated for each motion of the at least one arm and imparted to the bearing case so that the at least one buffer element is substantially non-load bearing.

29. The vacuum substrate transport apparatus of claim 18, wherein the at least one vacuum substrate transport non-steel or non-ceramic rolling buffer element forms a sacrificial wear surface relative to the at least one rolling load bearing element.

30. The vacuum substrate transport apparatus of claim 29, wherein the sacrificial wear surface of the at least one vacuum substrate transport non-steel or non-ceramic rolling buffer element wears sacrificially relative to the at least one rolling load bearing element.

31. The vacuum substrate transport apparatus of claim 29, wherein the sacrificial wear surface of the at least one vacuum substrate transport non-steel or non-ceramic rolling buffer element is a polyimide (PI).

32. The vacuum substrate transport apparatus of claim 29, wherein the sacrificial wear surface of the at least one vacuum substrate transport non-steel or non-ceramic rolling buffer element is polyamide-imide (PAI).

* * * * *